(12) United States Patent
Kumagai et al.

(10) Patent No.: US 8,310,478 B2
(45) Date of Patent: Nov. 13, 2012

(54) INTEGRATED CIRCUIT DEVICE AND ELECTRONIC INSTRUMENT

(75) Inventors: Takashi Kumagai, Chino (JP); Hisanobu Ishiyama, Chino (JP); Kazuhiro Maekawa, Chino (JP); Satoru Ito, Suwa (JP); Takashi Fujise, Shiojiri (JP); Junichi Karasawa, Tatsuno-machi (JP); Satoru Kodaira, Chino (JP); Takayuki Saiki, Suwa (JP); Hiroyuki Takamiya, Chino (JP)

(73) Assignee: Seiko Epson Corporation, Tokyo (JP)

( * ) Notice: Subject to any disclaimer, the term of this patent is extended or adjusted under 35 U.S.C. 154(b) by 606 days.

(21) Appl. No.: 11/477,741

(22) Filed: Jun. 30, 2006

(65) Prior Publication Data

US 2007/0000971 A1 Jan. 4, 2007

(30) Foreign Application Priority Data

Jun. 30, 2005 (JP) ................................. 2005-192479
Sep. 1, 2005 (JP) ................................. 2005-253387

(51) Int. Cl.
*G06F 3/038* (2006.01)
(52) U.S. Cl. ....................................... 345/212; 257/355
(58) Field of Classification Search .......... 345/211–213; 257/786, 355
See application file for complete search history.

(56) References Cited

U.S. PATENT DOCUMENTS

| | | | |
|---|---|---|---|
| 4,456,977 A | 6/1984 | Hayashi | |
| 4,472,638 A | 9/1984 | Nishizawa et al. | |
| 4,549,174 A | 10/1985 | Funada et al. | |
| 4,566,038 A | 1/1986 | Dimick | |
| 4,587,629 A | 5/1986 | Dill et al. | |
| 4,648,077 A | 3/1987 | Pinkham et al. | |
| 4,975,753 A | 12/1990 | Ema | |
| 4,990,996 A | 2/1991 | Kumar et al. | |
| 5,001,108 A | 3/1991 | Taguchi | |
| 5,040,152 A | 8/1991 | Voss et al. | |
| 5,058,058 A | 10/1991 | Yasuda et al. | |
| 5,233,420 A | 8/1993 | Piri et al. | |

(Continued)

FOREIGN PATENT DOCUMENTS

CN 1534560 10/2004

(Continued)

OTHER PUBLICATIONS

U.S. Appl. No. 11/270,569, filed Nov. 10, 2005 in the name of Satoru Kodaira et al.

(Continued)

*Primary Examiner* — Amr Awad
*Assistant Examiner* — Aaron Midkiff
(74) *Attorney, Agent, or Firm* — Oliff & Berridge, PLC

(57) ABSTRACT

An integrated circuit device includes first and second transistors NTr1 and PTr1 push-pull connected between first and second power supply lines and outputting a voltage of one of the first and second power supply lines to a connection node ND by a charge-pump operation, and a pad PD electrically connected with the connection node ND and electrically connected with a flying capacitor, to which a given voltage is applied at one end, at the other end of the flying capacitor. The pad PD is disposed in an upper layer of at least one of the first and second transistors NTr1 and PTr1 so that the pad PD overlaps part or the entirety of at least one of the first and second transistors NTr1 and PTr1.

15 Claims, 33 Drawing Sheets

U.S. PATENT DOCUMENTS

| | | | |
|---|---|---|---|
| 5,267,211 A * | 11/1993 | Kobayashi et al. | 365/228 |
| 5,272,665 A | 12/1993 | Uesugi | |
| 5,325,338 A | 6/1994 | Runaldue et al. | |
| 5,414,443 A | 5/1995 | Kanatani et al. | |
| 5,426,603 A | 6/1995 | Nakamura et al. | |
| 5,490,114 A | 2/1996 | Butler et al. | |
| 5,517,051 A * | 5/1996 | Chatterjee | 257/360 |
| 5,544,306 A | 8/1996 | Deering et al. | |
| 5,555,209 A | 9/1996 | Smith et al. | |
| 5,598,346 A | 1/1997 | Agrawal et al. | |
| 5,652,689 A | 7/1997 | Yuan | |
| 5,659,514 A | 8/1997 | Hazani | |
| 5,701,269 A | 12/1997 | Fujii | |
| 5,739,803 A | 4/1998 | Neugebauer | |
| 5,744,837 A | 4/1998 | Kamiura et al. | |
| 5,751,065 A | 5/1998 | Chittipeddi et al. | |
| 5,767,865 A | 6/1998 | Inoue et al. | |
| 5,815,136 A | 9/1998 | Ikeda et al. | |
| 5,850,195 A | 12/1998 | Berlien, Jr. et al. | |
| 5,860,084 A | 1/1999 | Yaguchi | |
| RE36,089 E | 2/1999 | Ooishi et al. | |
| 5,903,420 A | 5/1999 | Ham | |
| 5,909,125 A | 6/1999 | Kean | |
| 5,917,770 A | 6/1999 | Tanaka | |
| 5,920,885 A | 7/1999 | Rao | |
| 5,933,364 A | 8/1999 | Aoyama et al. | |
| 5,962,899 A | 10/1999 | Yang et al. | |
| 6,005,296 A | 12/1999 | Chan | |
| 6,025,822 A | 2/2000 | Motegi et al. | |
| 6,034,541 A | 3/2000 | Kopec, Jr. et al. | |
| 6,111,786 A | 8/2000 | Nakamura | |
| 6,118,425 A | 9/2000 | Kudo et al. | |
| 6,125,021 A * | 9/2000 | Duvvury et al. | 361/56 |
| 6,140,983 A | 10/2000 | Quanrud | |
| 6,225,990 B1 | 5/2001 | Aoki et al. | |
| 6,229,336 B1 | 5/2001 | Felton et al. | |
| 6,229,753 B1 | 5/2001 | Kono et al. | |
| 6,246,386 B1 | 6/2001 | Perner | |
| 6,259,459 B1 | 7/2001 | Middleton | |
| 6,262,541 B1 | 7/2001 | Asai | |
| 6,278,148 B1 | 8/2001 | Watanabe et al. | |
| 6,324,088 B1 | 11/2001 | Keeth et al. | |
| 6,339,417 B1 | 1/2002 | Quanrud | |
| 6,340,963 B1 | 1/2002 | Anno et al. | |
| 6,421,286 B1 | 7/2002 | Ohtani et al. | |
| 6,489,689 B2 * | 12/2002 | Nojiri | 257/786 |
| 6,552,705 B1 | 4/2003 | Hirota | |
| 6,559,508 B1 | 5/2003 | Lin et al. | |
| 6,580,631 B1 | 6/2003 | Keeth et al. | |
| 6,611,407 B1 | 8/2003 | Chang | |
| 6,646,283 B1 | 11/2003 | Akimoto et al. | |
| 6,697,037 B1 | 2/2004 | Alt et al. | |
| 6,724,378 B2 | 4/2004 | Tamura et al. | |
| 6,731,538 B2 | 5/2004 | Noda et al. | |
| 6,791,632 B2 | 9/2004 | Lee et al. | |
| 6,822,631 B1 | 11/2004 | Yatabe | |
| 6,826,116 B2 | 11/2004 | Noda et al. | |
| 6,839,097 B2 | 1/2005 | Park et al. | |
| 6,858,901 B2 | 2/2005 | Ker et al. | |
| 6,862,247 B2 | 3/2005 | Yamazaki | |
| 6,873,310 B2 | 3/2005 | Matsueda | |
| 6,873,566 B2 | 3/2005 | Choi | |
| 6,898,096 B2 | 5/2005 | Endo et al. | |
| 6,999,353 B2 | 2/2006 | Noda et al. | |
| 7,034,792 B2 | 4/2006 | Tamura | |
| 7,078,948 B2 | 7/2006 | Dosho | |
| 7,081,879 B2 | 7/2006 | Sun et al. | |
| 7,102,223 B1 | 9/2006 | Kanaoka et al. | |
| 7,110,274 B1 | 9/2006 | Endo et al. | |
| 7,142,221 B2 | 11/2006 | Sakamaki et al. | |
| 7,158,439 B2 | 1/2007 | Shionori et al. | |
| 7,164,415 B2 | 1/2007 | Ooishi et al. | |
| 7,176,864 B2 | 2/2007 | Moriyama et al. | |
| 7,180,495 B1 | 2/2007 | Matsueda | |
| 7,193,623 B2 | 3/2007 | Moon | |
| 7,233,511 B2 | 6/2007 | Endo et al. | |
| 7,256,976 B2 * | 8/2007 | Sato | 361/56 |
| 7,280,329 B2 | 10/2007 | Kim et al. | |
| 7,317,627 B2 | 1/2008 | Endo et al. | |
| 7,330,163 B2 | 2/2008 | Nakai et al. | |
| 7,342,302 B2 | 3/2008 | Kanaoka et al. | |
| 7,369,195 B2 | 5/2008 | Wu et al. | |
| 7,391,668 B2 | 6/2008 | Natori et al. | |
| 7,411,804 B2 | 8/2008 | Kumagai et al. | |
| 7,411,861 B2 | 8/2008 | Kodaira et al. | |
| 7,466,603 B2 | 12/2008 | Ong | |
| 7,471,573 B2 | 12/2008 | Kodaira et al. | |
| 7,480,164 B2 | 1/2009 | Endo et al. | |
| 7,508,370 B2 | 3/2009 | Sekiguchi et al. | |
| 7,522,441 B2 | 4/2009 | Kumagai et al. | |
| 7,629,652 B2 | 12/2009 | Suzuki et al. | |
| 7,759,804 B2 | 7/2010 | Kanaoka et al. | |
| 7,940,500 B2 | 5/2011 | Yang et al. | |
| 8,054,710 B2 | 11/2011 | Ito et al. | |
| 2001/0008498 A1 | 7/2001 | Ooishi | |
| 2001/0014051 A1 | 8/2001 | Watanabe et al. | |
| 2001/0022744 A1 | 9/2001 | Noda et al. | |
| 2002/0011998 A1 | 1/2002 | Tamura | |
| 2002/0015128 A1 | 2/2002 | Sakaguchi | |
| 2002/0036625 A1 | 3/2002 | Nakamura | |
| 2002/0067328 A1 * | 6/2002 | Yumoto et al. | 345/92 |
| 2002/0080104 A1 * | 6/2002 | Aoki | 345/87 |
| 2002/0105510 A1 * | 8/2002 | Tsuchiya | 345/211 |
| 2002/0113783 A1 | 8/2002 | Tamura et al. | |
| 2002/0126108 A1 | 9/2002 | Koyama et al. | |
| 2002/0154557 A1 | 10/2002 | Mizugaki et al. | |
| 2003/0020845 A1 | 1/2003 | Lee et al. | |
| 2003/0034948 A1 | 2/2003 | Imamura | |
| 2003/0053022 A1 | 3/2003 | Kaneko et al. | |
| 2003/0053321 A1 | 3/2003 | Ishiyama | |
| 2003/0156103 A1 | 8/2003 | Ota | |
| 2003/0169244 A1 | 9/2003 | Kurokawa et al. | |
| 2003/0189541 A1 | 10/2003 | Hashimoto | |
| 2003/0223164 A1 | 12/2003 | Ebara | |
| 2004/0004877 A1 | 1/2004 | Uetake | |
| 2004/0017341 A1 | 1/2004 | Maki | |
| 2004/0021652 A1 | 2/2004 | Abe et al. | |
| 2004/0021947 A1 | 2/2004 | Schofield et al. | |
| 2004/0056252 A1 | 3/2004 | Kasai | |
| 2004/0070900 A1 | 4/2004 | Ker et al. | |
| 2004/0095307 A1 | 5/2004 | Kim | |
| 2004/0124472 A1 | 7/2004 | Lin et al. | |
| 2004/0140970 A1 | 7/2004 | Morita | |
| 2004/0164943 A1 * | 8/2004 | Ogawa et al. | 345/92 |
| 2004/0174646 A1 | 9/2004 | Ko | |
| 2004/0239606 A1 | 12/2004 | Ota | |
| 2004/0246215 A1 | 12/2004 | Yoo | |
| 2005/0001797 A1 | 1/2005 | Miller et al. | |
| 2005/0001846 A1 | 1/2005 | Shiono | |
| 2005/0045955 A1 | 3/2005 | Kim et al. | |
| 2005/0047266 A1 | 3/2005 | Shionori et al. | |
| 2005/0052340 A1 | 3/2005 | Goto et al. | |
| 2005/0057580 A1 | 3/2005 | Yamano et al. | |
| 2005/0057581 A1 | 3/2005 | Horiuchi et al. | |
| 2005/0073470 A1 | 4/2005 | Nose et al. | |
| 2005/0087807 A1 | 4/2005 | Righter | |
| 2005/0093777 A1 | 5/2005 | Kim et al. | |
| 2005/0116960 A1 | 6/2005 | Shioda et al. | |
| 2005/0122303 A1 | 6/2005 | Hashimoto | |
| 2005/0184979 A1 | 8/2005 | Sakaguchi | |
| 2005/0195149 A1 | 9/2005 | Ito | |
| 2005/0212788 A1 | 9/2005 | Fukuda et al. | |
| 2005/0212826 A1 | 9/2005 | Fukuda et al. | |
| 2005/0219189 A1 | 10/2005 | Fukuo | |
| 2005/0243043 A1 | 11/2005 | Jeoung et al. | |
| 2005/0253976 A1 | 11/2005 | Sekiguchi et al. | |
| 2005/0262293 A1 | 11/2005 | Yoon | |
| 2005/0270262 A1 | 12/2005 | Oh | |
| 2005/0280613 A1 | 12/2005 | Takei et al. | |
| 2005/0285862 A1 | 12/2005 | Noda et al. | |
| 2006/0017681 A1 | 1/2006 | Jang et al. | |
| 2006/0028417 A1 | 2/2006 | Harada et al. | |
| 2006/0050042 A1 | 3/2006 | Yi | |
| 2006/0062483 A1 | 3/2006 | Kondo et al. | |
| 2006/0145972 A1 | 7/2006 | Zhang et al. | |
| 2006/0244710 A1 | 11/2006 | Iriguchi et al. | |
| 2007/0001886 A1 | 1/2007 | Ito et al. | |

| | | | |
|---|---|---|---|
| 2007/0001973 A1 | 1/2007 | Kumagai et al. | |
| 2007/0001982 A1 | 1/2007 | Ito et al. | |
| 2007/0001983 A1 | 1/2007 | Ito et al. | |
| 2007/0001984 A1 | 1/2007 | Kumagai et al. | |
| 2007/0002061 A1 | 1/2007 | Kumagai et al. | |
| 2007/0002188 A1 | 1/2007 | Kumagai et al. | |
| 2007/0002509 A1 | 1/2007 | Kumagai et al. | |
| 2007/0013634 A1 | 1/2007 | Saiki et al. | |
| 2007/0013635 A1 | 1/2007 | Ito et al. | |
| 2007/0013687 A1 | 1/2007 | Kodaira et al. | |
| 2007/0013706 A1 | 1/2007 | Kodaira et al. | |
| 2007/0013707 A1 | 1/2007 | Kodaira et al. | |
| 2007/0016700 A1 | 1/2007 | Kodaira et al. | |
| 2007/0035503 A1 | 2/2007 | Kurokawa et al. | |
| 2007/0187762 A1 | 8/2007 | Saiki et al. | |
| 2010/0059882 A1 | 3/2010 | Suzuki et al. | |
| 2010/0252924 A1 | 10/2010 | Kanaoka et al. | |

FOREIGN PATENT DOCUMENTS

| | | |
|---|---|---|
| CN | 1542964 | 11/2004 |
| EP | 0 499 478 A2 | 8/1992 |
| JP | A-56-130888 | 10/1981 |
| JP | A 63-225993 | 9/1988 |
| JP | A 1-171190 | 7/1989 |
| JP | A-2-79294 | 3/1990 |
| JP | A 4-370595 | 12/1992 |
| JP | A 5-181154 | 7/1993 |
| JP | A-05-189957 | 7/1993 |
| JP | A-8-181219 | 7/1995 |
| JP | A 7-281634 | 10/1995 |
| JP | A 8-69696 | 3/1996 |
| JP | A-8-236706 | 9/1996 |
| JP | A-9-265274 | 10/1997 |
| JP | A 11-261011 | 9/1999 |
| JP | A 11-274424 | 10/1999 |
| JP | A 11-330393 | 11/1999 |
| JP | A-2000-020032 | 1/2000 |
| JP | A-2000-252435 | 9/2000 |
| JP | A-2001-067868 | 3/2001 |
| JP | A-2001-222249 | 8/2001 |
| JP | A 2001-222276 | 8/2001 |
| JP | A-2002-6334 | 1/2002 |
| JP | A-2002-83933 | 3/2002 |
| JP | A-2002-182232 | 6/2002 |
| JP | A 2002-244624 | 8/2002 |
| JP | A-2002-313925 | 10/2002 |
| JP | A-2002-358777 | 12/2002 |
| JP | A 2003-022063 | 1/2003 |
| JP | A-2003-23092 | 1/2003 |
| JP | A-2003-107528 | 4/2003 |
| JP | A-2003-203984 | 7/2003 |
| JP | A-2003-289104 | 10/2003 |
| JP | A 2003-330433 | 11/2003 |
| JP | A 2004-040042 | 2/2004 |
| JP | A-2004-95577 | 3/2004 |
| JP | A 2004-146806 | 5/2004 |
| JP | A 2004-159314 | 6/2004 |
| JP | A 2004-328456 | 11/2004 |
| JP | A 2005-17725 | 1/2005 |
| JP | A 2005-72607 | 3/2005 |
| JP | A-2005-085820 | 3/2005 |
| JP | A-2005-150559 | 6/2005 |
| JP | A-2005-167212 | 6/2005 |
| JP | A-2006-228770 | 8/2006 |
| KR | A 1992-17106 | 9/1992 |
| KR | 1999-88197 | 12/1999 |
| KR | A 2001-100814 | 11/2001 |
| KR | 10-2005-0011743 | 1/2005 |
| TW | 501080 | 9/2002 |
| TW | 522366 | 3/2003 |
| TW | 525134 | 3/2003 |
| TW | 1224300 | 3/2003 |
| TW | 563081 | 11/2003 |
| WO | WO 2004-025849 A1 | 3/2004 |

OTHER PUBLICATIONS

U.S. Appl. No. 11/270,546, filed Nov. 10, 2005 in the name of Satoru Kodaira et al.
U.S. Appl. No. 11/270,552, filed Nov. 10, 2005 in the name of Satoru Kodaira et al.
U.S. Appl. No. 11/270,694, filed Nov. 10, 2005 in the name of Satoru Kodaira et al.
U.S. Appl. No. 11/270,749, filed Nov. 10, 2005 in the name of Satoru Kodaira et al.
U.S. Appl. No. 11/270,551, filed Nov. 10, 2005 in the name of Takashi Kumagai et al.
U.S. Appl. No. 11/270,779, filed Nov. 10, 2005 in the name of Takashi Kumagai et al.
U.S. Appl. No. 11/270,585, filed Nov. 10, 2005 in the name of Takashi Kumagai et al.
U.S. Appl. No. 11/270,747, filed Nov. 10, 2005 in the name of Takashi Kumagai et al.
U.S. Appl. No. 11/270,632, filed Nov. 10, 2005 in the name of Takashi Kumagai et al.
U.S. Appl. No. 11/270,553, filed Nov. 10, 2005 in the name of Takashi Kumagai et al.
U.S. Appl. No. 11/270,631, filed Nov. 10, 2005 in the name of Takashi Kumagai et al.
U.S. Appl. No. 11/270,665, filed Nov. 10, 2005 in the name of Takashi Kumagai et al.
U.S. Appl. No. 11/270,549, filed Nov. 10, 2005 in the name of Satoru Kodaira et al.
U.S. Appl. No. 11/270,666, filed Nov. 10, 2005 in the name of Satoru Kodaira et al.
U.S. Appl. No. 11/270,630, filed Nov. 10, 2005 in the name of Satoru Kodaira et al.
U.S. Appl. No. 11/270,586, filed Nov. 10, 2005 in the name of Satoru Kodaira et al.
U.S. Appl. No. 11/270,547, filed Nov. 10, 2005 in the name of Satoru Kodaira et al.
U.S. Appl. No. 11/477,646, filed Jun. 30, 2006 in the name of Satoru Ito et al.
U.S. Appl. No. 11/477,742, filed Jun. 30, 2006 in the name of Satoru Ito et al.
U.S, Appl. No. 11/477,718, filed Jun. 30, 2006 in the name of Satoru Ito et al.
U.S. Appl. No. 11/477,714, filed Jun. 30, 2006 in the name of Takayuki Saiki et al.
U.S. Appl. No. 11/477,670, filed Jun. 30, 2006 in the name of Satoru Ito et al.
U.S. Appl. No. 11/477,715, filed Jun. 30, 2006 in the name of Takashi Kumagai et al.
U.S. Appl. No. 11/477,669, filed Jun. 30, 2006 in the name of Satoru Kodaira et al.
U.S. Appl. No. 11/477,720, filed Jun. 30, 2006 in the name of Takashi Kumagai et al.
U.S. Appl. No. 11/477,716, filed Jun. 30, 2006 in the name of Satoru Kodaira et al.
U.S. Appl. No. 11/477,719, filed Jun. 30, 2006 in the name of Satoru Kodaira et al.
U.S. Appl. No. 11/477,782, filed Jun. 30, 2006 in the name of Takashi Kumagai et al.
U.S. Appl. No. 11/477,647, filed Jun. 30, 2006 in the name of Satoru Kodaira et al.
U.S. Appl. No. 12/000,882, filed Dec. 18, 2007 in the name of Kodaira et al.
Sedra & Smith, Microelectronic Circuit (Jun. 1990), Saunder College Publishing, $3^{rd}$ Edition, Chapter 5, p. 300.
Aug. 5, 2011 Notice of Allowance issued in U.S. Appl. No. 11/477,720.
Aug. 10, 2011 Notice of Allowance issued in U.S. Appl. No. 11/477,670.
Nov. 3, 2011 Office Action issued in U.S. Appl. No. 11/477,714.
Nov. 22, 2011 Office Action issued in Japanese Application No. 2008-035576 (with translation).
Nov. 22, 2011 Office Action issued in Japanese Application No. 2008-124746 (with translation).
Jan. 18, 2012 Notice of Allowance issued in U.S. Appl. No. 11/477,720.
Feb. 9, 2012 Notice of Allowance issued in U.S. Appl. No. 11/703,686.

Mar. 16, 2012 Office Action issued in U.S. Appl. No. 11/477,714.
Office Action issued in Japanese Patent Application No. 2006-154200 on Jun. 19, 2007 (w/English-language Translation).
Jul. 20, 2012 Office Action issued in U.S. Appl. No. 13/022,995.
Aug. 30, 2012 Office Action issued in U.S. Appl. No. 13/137,995.
Sep. 7, 2012 Office Action issued in U.S. Appl. No. 11/477,714.

* cited by examiner

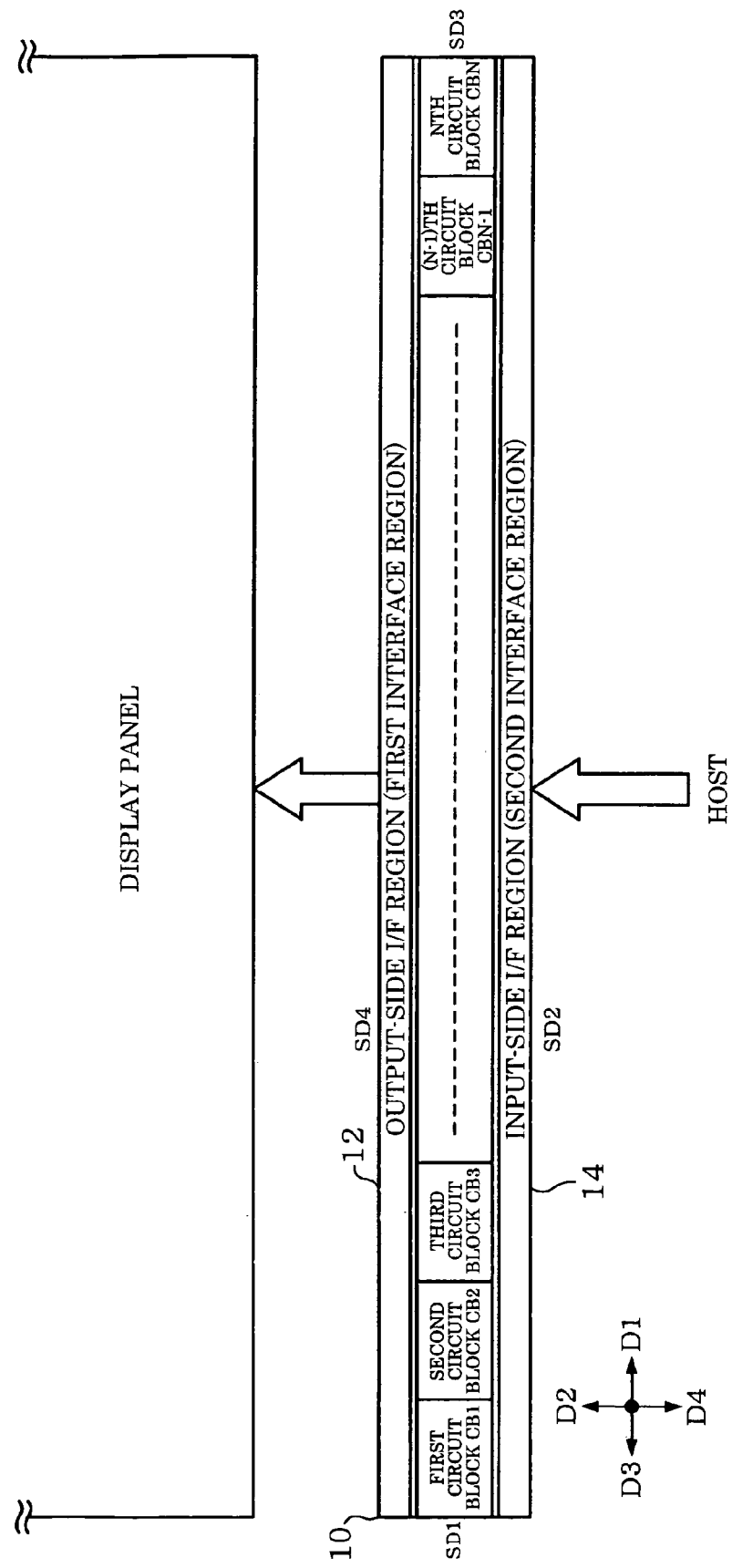

FIG. 4

| | WITH MEMORY (RAM) | | WITHOUT MEMORY | | CSTN | TFD |
|---|---|---|---|---|---|---|
| | AMORPHOUS TFT | LOW-TEMPERATURE POLYSILICON TFT | AMORPHOUS TFT | LOW-TEMPERATURE POLYSILICON TFT | | |
| MEMORY (RAM) | INCLUDE | INCLUDE | NOT INCLUDE | NOT INCLUDE | INCLUDE | INCLUDE |
| DATA DRIVER | INCLUDE | INCLUDE | INCLUDE | INCLUDE | INCLUDE | INCLUDE |
| SCAN DRIVER | INCLUDE | NOT INCLUDE | INCLUDE | NOT INCLUDE | INCLUDE | INCLUDE |
| LOGIC CIRCUIT (G/A) | INCLUDE | INCLUDE | INCLUDE | INCLUDE | INCLUDE | INCLUDE |
| GRAYSCALE VOLTAGE GENERATION CIRCUIT (γ) | INCLUDE | INCLUDE | INCLUDE | INCLUDE | NOT INCLUDE | NOT INCLUDE |
| POWER SUPPLY CIRCUIT | INCLUDE | INCLUDE | INCLUDE | INCLUDE | INCLUDE | INCLUDE |

$W1+WB+W2 \leq W < W1+2 \times WB+W2$ $Q=HPN/(DBN \times IN)$  $Q \times WD \leqq WB < (Q+1) \times WD$ FIG. 27A HORIZONTAL TYPE CELL
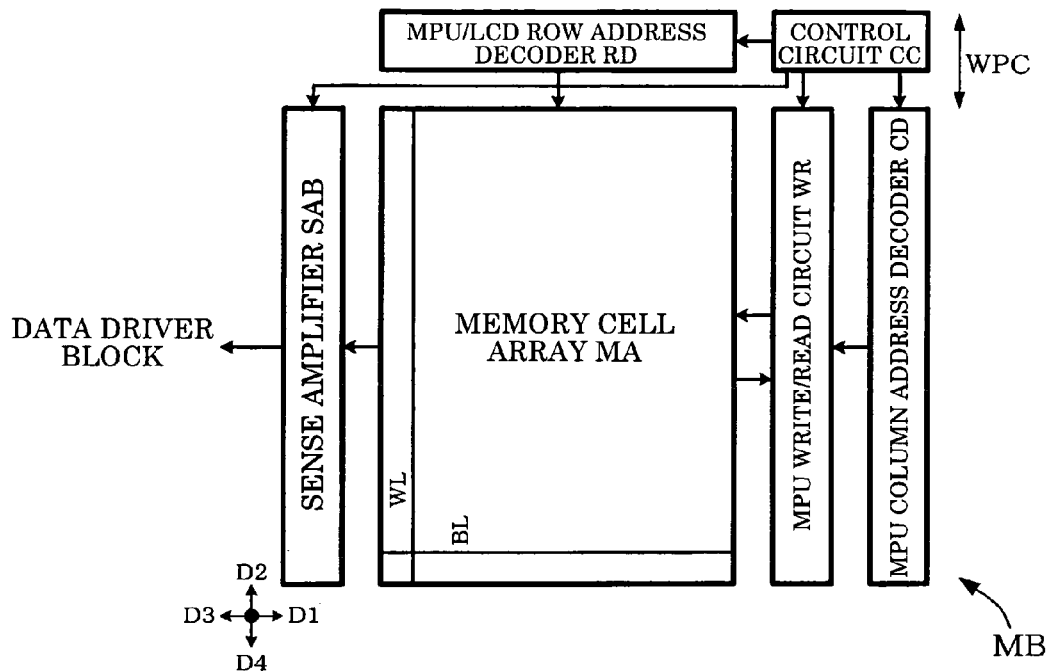
FIG. 27B VERTICAL TYPE CELL
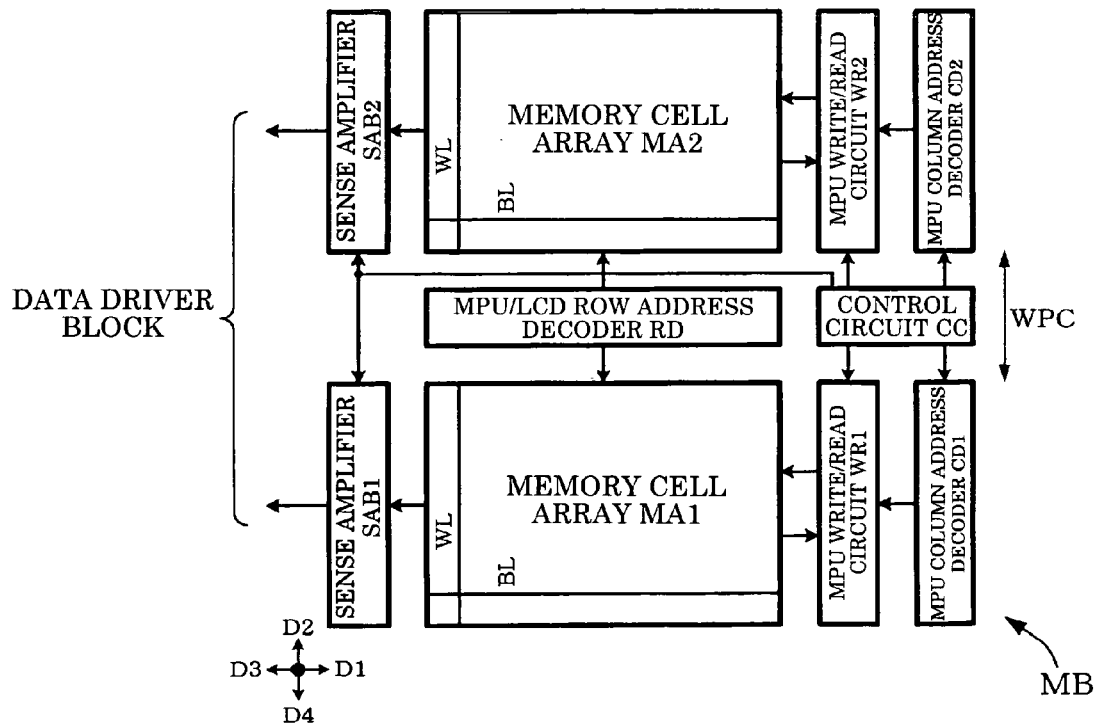

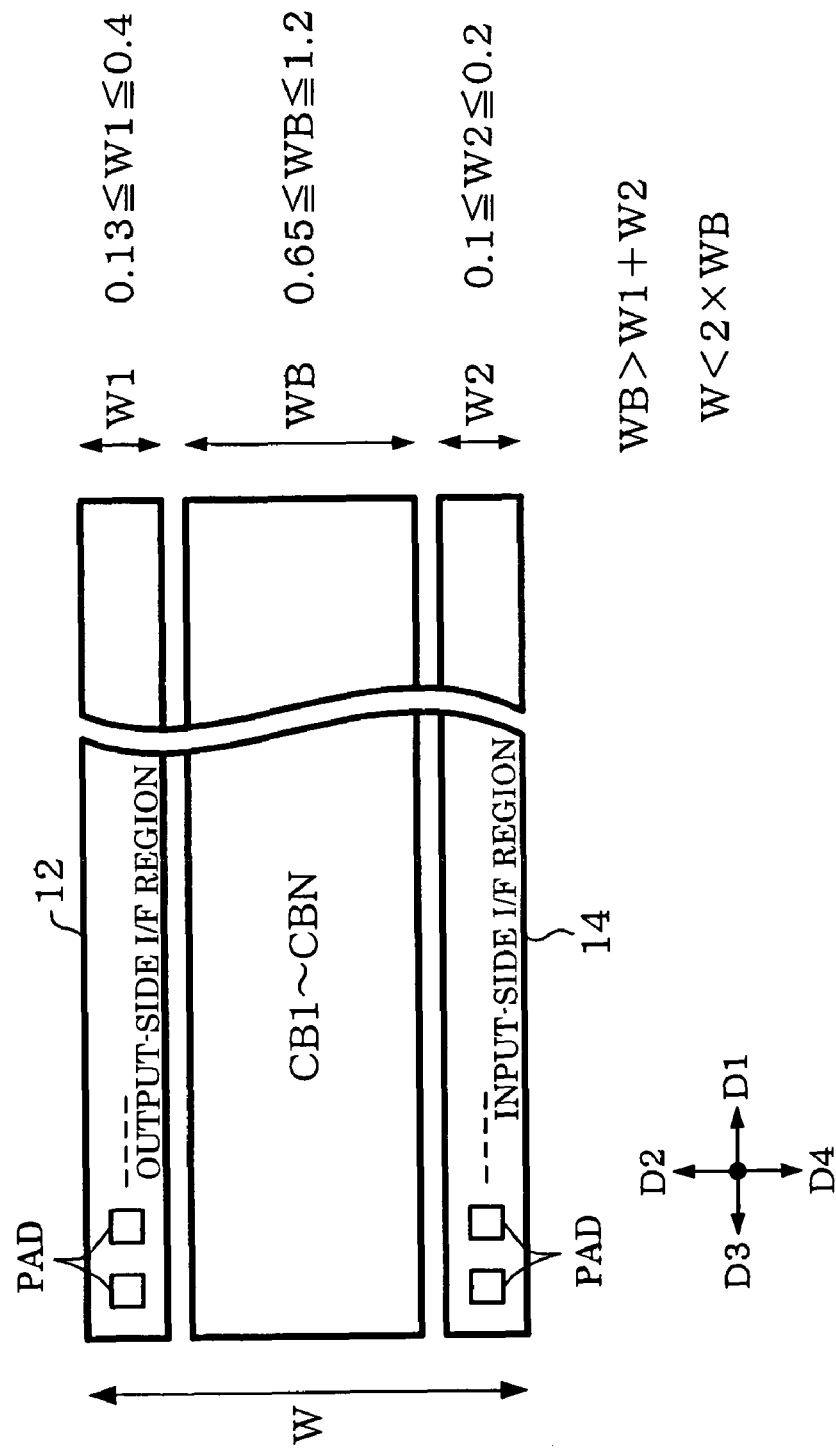

HORIZONTAL TYPE CELL

VERTICAL TYPE CELL

INTEGRATED CIRCUIT DEVICE AND ELECTRONIC INSTRUMENT

Japanese Patent Application No. 2005-192479 filed on Jun. 30, 2005 and Japanese Patent Application No. 2005-253387 filed on Sep. 1, 2005, are hereby incorporated by reference in their entirety.

BACKGROUND OF THE INVENTION

The present invention relates to an integrated circuit device and an electronic instrument.

A display driver (LCD driver) is an example of an integrated circuit device which drives a display panel such as a liquid crystal panel (JP-A-2001-222249). A reduction in the chip size is required for the display driver in order to reduce cost.

However, the size of the display panel incorporated in a portable telephone or the like is almost constant. Therefore, if the chip size is reduced by merely shrinking the integrated circuit device as the display driver by using a microfabrication technology, it becomes difficult to mount the integrated circuit device.

SUMMARY

A first aspect of the invention relates to an integrated circuit device comprising:

first and second transistors push-pull connected between first and second power supply lines and outputting a voltage of one of the first and second power supply lines to a connection node by a charge-pump operation;

an electrostatic discharge protection element connected between the first power supply line and the connection node; and a pad electrically connected with the connection node and electrically connected with a flying capacitor, to which a given voltage is applied at one end, at the other end of the flying capacitor;

the pad being disposed in an upper layer of at least one of the electrostatic discharge protection element and the first and second transistors so that the pad overlaps part or the entirety of at least one of the electrostatic discharge protection element and the first and second transistors.

A second aspect of the invention relates to an integrated circuit device comprising:

first and second transistors push-pull connected between first and second power supply lines and outputting a voltage of one of the first and second power supply lines to a connection node by a charge-pump operation; and a pad electrically connected with the connection node and electrically connected with a flying capacitor, to which a given voltage is applied at one end, at the other end of the flying capacitor;

the pad being disposed in an upper layer of at least one of the first and second transistors so that the pad overlaps part or the entirety of at least one of the first and second transistors.

A third aspect of the invention relates to an electronic instrument comprising:

the above integrated circuit device; and a display panel driven by the integrated circuit device.

BRIEF DESCRIPTION OF THE SEVERAL VIEWS OF THE DRAWING

FIG. 3 is a configuration example of an integrated circuit device according to one embodiment of the invention.

FIG. 4 is an example of various types of display drivers and circuit blocks provided in the display drivers.

FIGS. 27A and 27B are configuration examples of a memory block.

FIG. 28 is a view illustrative of the relationship among widths W1, W2, and WB.

DETAILED DESCRIPTION OF THE EMBODIMENT

Figure 1A:
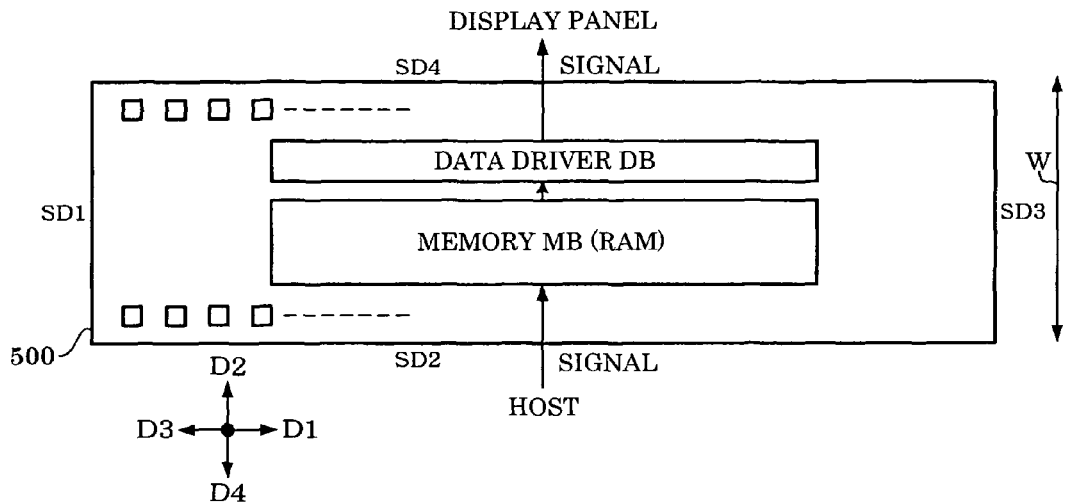
FIGS. 1A, 1B, and 1C are illustrative of a comparative example of one embodiment of the invention.

The invention may provide a narrow integrated circuit device and an electronic instrument including the same.

One embodiment of the invention relates to an integrated circuit device comprising:

first and second transistors push-pull connected between first and second power supply lines and outputting a voltage of one of the first and second power supply lines to a connection node by a charge-pump operation;

an electrostatic discharge protection element connected between the first power supply line and the connection node; and a pad electrically connected with the connection node and electrically connected with a flying capacitor, to which a given voltage is applied at one end, at the other end of the flying capacitor;

the pad being disposed in an upper layer of at least one of the electrostatic discharge protection element and the first and second transistors so that the pad overlaps part or the entirety of at least one of the electrostatic discharge protection element and the first and second transistors.

According to this embodiment, it suffices to provide only signal lines for gate-controlling the first and second transistors in the region near the pad without providing a thick signal line for supplying power generated by the charge-pump operation. Therefore, the wiring efficiency in the region near the pad can be increased, whereby the width of the integrated circuit device in the second direction can be reduced. Moreover, the width of the integrated circuit device in the second direction can be further reduced by disposing part or the entirety of the electrostatic discharge protection element and the first and second transistors under the pad. In addition, electrostatic discharge resistance can be enhanced by disposing the electrostatic discharge protection element under the pad.

Another embodiment of the invention relates to an integrated circuit device comprising:

first and second transistors push-pull connected between first and second power supply lines and outputting a voltage of one of the first and second power supply lines to a connection node by a charge-pump operation; and a pad electrically connected with the connection node and electrically connected with a flying capacitor, to which a given voltage is applied at one end, at the other end of the flying capacitor;

the pad being disposed in an upper layer of at least one of the first and second transistors so that the pad overlaps part or the entirety of at least one of the first and second transistors.

According to this embodiment, it suffices to provide only signal lines for gate-controlling the first and second transistors in the region near the pad without providing a thick signal line for supplying power generated by the charge-pump operation. Therefore, the wiring efficiency in the region near the pad can be increased, whereby the width of the integrated circuit device in the second direction can be reduced. Moreover, the width of the integrated circuit device in the second direction can be further reduced by disposing part or the entirety of the first and second transistors under the pad.

In the integrated circuit device according to this embodiment, the first transistor may serve as an electrostatic discharge protection element.

This further reduces the width of the integrated circuit device in the second direction.

The integrated circuit device according to this embodiment may comprise:

first to Nth circuit blocks (N is an integer of two or more) disposed along a first direction when a direction from a first side which is a short side of the integrated circuit device toward a third side opposite to the first side is the first direction and a direction from a second side which is a long side of the integrated circuit device toward a fourth side opposite to the second side is a second direction;

a first interface region provided along the fourth side on a side of the first to Nth circuit blocks in the second direction; and a second interface region provided along the second side on a side of the first to Nth circuit blocks in a fourth direction opposite to the second direction;

wherein the voltage of the second power supply line or a voltage generated based on the voltage of the second power supply line may be supplied as a power supply voltage of at least one of the first to Nth circuit blocks.

In the integrated circuit device according to this embodiment, the pad and the first and second transistors may be disposed in the second interface region.

In the integrated circuit device according to this embodiment, one of the first to Nth circuit blocks may be a power supply circuit block for gate-controlling the first and second transistors; and the pad and the first and second transistors may be disposed on a side of the power supply circuit block in the fourth direction.

According to the above embodiment, the width of the integrated circuit device in the second direction can be further reduced.

In the integrated circuit device according to this embodiment, the first to Nth circuit blocks may include at least one data driver block for driving data lines and a circuit block other than the data driver block; and when widths of the first interface region, the first to Nth circuit blocks, and the second interface region in the second direction are respectively W1, WB, and W2, the integrated circuit device mat have a width W in the second direction of "W1+WB+W2≦W<W1+2×WB+W2".

According to this embodiment, the first to Nth circuit blocks include the data driver block and the circuit block other than the data driver block. The widths W1, WB, and W2 of the first interface region, the first to Nth circuit blocks, and the second interface region satisfy the relationship expressed as "W1+WB+W2≦W<W1+2×WB+W2". According to the integrated circuit device in which such a relational expression is satisfied, the width in the second direction can be reduced while securing the width of the circuit block in the second direction (without causing the layout of the circuit block to become flat to a large extent), whereby a narrow integrated circuit device can be provided. This facilitates mounting and reduces the cost of the device. Moreover, since the circuit block has an appropriate width, the layout design is facilitated, whereby the device development period can be reduced.

In the integrated circuit device according to this embodiment, the width W of the integrated circuit device in the second direction may be "W<2×WB".

This enables the width of the integrated circuit device in the second direction to be reduced while sufficiently securing the width of the first to Nth circuit blocks in the second direction. Therefore, "W<2×WB" can be easily satisfied, whereby a narrower integrated circuit device can be provided.

In the integrated circuit device according to this embodiment, the first interface region may be disposed on a side of the data driver block in the second direction without another circuit block interposed therebetween; and the second interface region may be disposed on a side of the data driver block in the fourth direction without another circuit block interposed therebetween.

This enables the width of the first to Nth circuit blocks in the second direction to be set based on the width of the data driver block in the second direction. Since only one circuit block (data driver block) exists in the second direction in the area in which at least the data driver block exists, a narrow integrated circuit device can be realized without causing the layout of the data driver block to become flat to a large extent.

In the integrated circuit device according to this embodiment, a data driver included in the data driver block may include Q driver cells arranged along the second direction, each of the driver cells outputting a data signal corresponding to image data for one pixel; and when a width of the driver cell in the second direction is WD, the first to Nth circuit blocks may have a width WB in the second direction of "Q×WD≦WB<(Q+1)×WD".

The image data signals from another circuit block disposed along the first direction can be efficiently input to the driver cells by disposing the driver cells along the second direction. Moreover, the width of the integrated circuit device in the second direction can be reduced by minimizing the width of the data driver block in the second direction.

In the integrated circuit device according to this embodiment, when a number of pixels of a display panel in a horizontal scan direction is HPN, a number of data driver blocks is DBN, and a number of inputs of image data to the driver cell in one horizontal scan period is IN, the number Q of the driver cells arranged along the second direction may be "Q=HPN/(DBN×IN)".

This enables the width of the first to Nth circuit blocks in the second direction to be set at an optimum value corresponding to the number of data driver blocks and the number of inputs of image data, for example.

In the integrated circuit device according to this embodiment, the first to Nth circuit blocks may include at least one memory block which stores image data.

In the integrated circuit device according to this embodiment, a data driver included in the data driver block may include Q driver cells arranged along the second direction, each of the driver cells outputting a data signal corresponding to image data for one pixel; and when a width of the driver cell in the second direction is WD, and a width of a peripheral circuit section included in the memory block in the second direction is WPC, "Q×WD≦WB<(Q+1)×WD+WPC" may be satisfied.

This enables the width of the integrated circuit device in the second direction to be reduced by minimizing the width of the data driver block in the second direction.

In the integrated circuit device according to this embodiment, when a number of pixels of a display panel in a horizontal scan direction is HPN, a number of data driver blocks is DBN, and a number of inputs of image data to the driver cell in one horizontal scan period is IN, the number Q of the driver cells arranged along the second direction may be "Q=HPN/(DBN×IN)".

This enables the width of the integrated circuit device in the second direction to be reduced by minimizing the width of the memory block in the second direction.

In the integrated circuit device according to this embodiment, the memory block and the data driver block may be adjacently disposed along the first direction.

This enables the width of the integrated circuit device in the second direction to be reduced in comparison with the case of disposing the memory block and the data driver block along the second direction. Moreover, when the configuration of the memory block or the data driver block or the like has been changed, the effects on other circuit blocks can be minimized, whereby the design efficiency can be increased.

In the integrated circuit device according to this embodiment, image data stored in the memory block may be read from the memory block into the adjacent data driver block a plurality of times in one horizontal scan period.

This reduces the number of memory cells of the memory block in the second direction, whereby the width of the memory block in the second direction can be reduced. Therefore, the width of the integrated circuit device in the second direction can be reduced.

A further embodiment of the invention relates to an electronic instrument comprising:

the above integrated circuit device; and a display panel driven by the integrated circuit device.

These embodiments of the invention will be described in detail below. Note that the embodiments described below do not in any way limit the scope of the invention laid out in the claims herein. In addition, not all of the elements of the embodiments described below should be taken as essential requirements of the invention.

1. Comparative Example

FIG. 1A shows an integrated circuit device 500 which is a comparative example of one embodiment of the invention. The integrated circuit device 500 shown in FIG. 1A includes a memory block MB (display data RAM) and a data driver block DB. The memory block MB and the data driver block DB are disposed along a direction D2. The memory block MB and the data driver block DB are ultra-flat blocks of which the length along a direction D1 is longer than the width in the direction D2.

Image data supplied from a host is written into the memory block MB. The data driver block DB converts the digital image data written into the memory block MB into an analog data voltage, and drives data lines of a display panel. In FIG. 1A, the image data signal flows in the direction D2. Therefore, in the comparative example shown in FIG. 1A, the memory block MB and the data driver block DB are disposed along the direction D2 corresponding to the signal flow. This reduces the path between the input and the output so that a signal delay can be optimized, whereby an efficient signal transmission can be achieved.

However, the comparative example shown in FIG. 1A has the following problems.

Figure 2A:
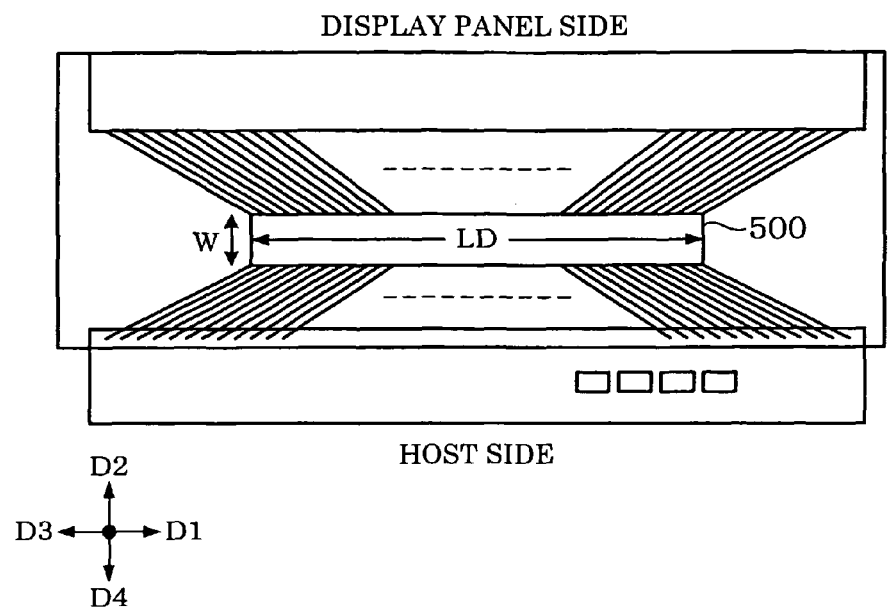
FIGS. 2A and 2B are illustrative of mounting of an integrated circuit device.

First, a reduction in the chip size is required for an integrated circuit device such as a display driver in order to reduce cost. However, if the chip size is reduced by merely shrinking the integrated circuit device 500 by using a microfabrication technology, the size of the integrated circuit device 500 is reduced not only in the short side direction but also in the long side direction. Therefore, it becomes difficult to mount the integrated circuit device 500 as shown in FIG. 2A. Specifically, it is desirable that the output pitch be 22 μm or more, for example. However, the output pitch is reduced to 17 μm by merely shrinking the integrated circuit device 500 as shown in FIG. 2A, for example, whereby it becomes difficult to mount the integrated circuit device 500 due to the narrow pitch. Moreover, the number of glass substrates obtained is decreased due to an increase in the glass frame of the display panel, whereby cost is increased.

Figure 1B:
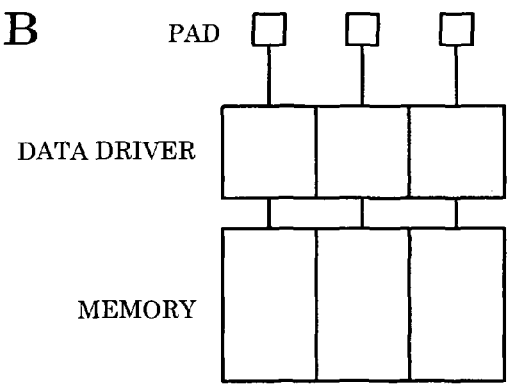
Figure 1C:
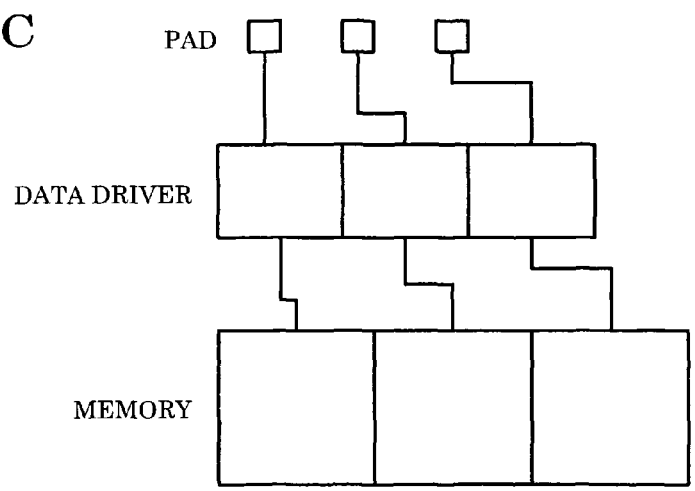

Second, the configurations of the memory and the data driver of the display driver are changed corresponding to the type of display panel (amorphous TFT or low-temperature polysilicon TFT), the number of pixels (QCIF, QVGA, or VGA), the specification of the product, and the like. Therefore, in the comparative example shown in FIG. 1A, even if the pad pitch, the cell pitch of the memory, and the cell pitch of the data driver coincide in one product as shown in FIG. 1B, the pitches do not coincide as shown in FIG. 1C when the configurations of the memory and the data driver are changed. If the pitches do not coincide as shown in FIG. 1C, an unnecessary wiring region for absorbing the pitch difference must be formed between the circuit blocks. In particular, in the comparative example shown in FIG. 1A in which the block is made flat in the direction D1, the area of an unnecessary wiring region for absorbing the pitch difference is increased. As a result, the width W of the integrated circuit device 500 in the direction D2 is increased, whereby cost is increased due to an increase in the chip area.

If the layout of the memory and the data driver is changed so that the pad pitch coincides with the cell pitch in order to avoid such a problem, the development period is increased, whereby cost is increased. Specifically, since the circuit configuration and the layout of each circuit block are individually designed and the pitch is adjusted thereafter in the comparative example shown in FIG. 1A, unnecessary area is provided or the design becomes inefficient.

2. Configuration of Integrated Circuit Device

FIG. 3 shows a configuration example of an integrated circuit device 10 according to one embodiment of the invention which can solve the above-described problems. In this embodiment, the direction from a first side SD1 (short side) of the integrated circuit device 10 toward a third side SD3 opposite to the first side SD1 is defined as a first direction D1, and the direction opposite to the first direction D1 is defined as a third direction D3. The direction from a second side SD2 (long side) of the integrated circuit device 10 toward a fourth side SD4 opposite to the second side SD2 is defined as a second direction D2, and the direction opposite to the second direction D2 is defined as a fourth direction D4. In FIG. 3, the left side of the integrated circuit device 10 is the first side SD1, and the right side is the third side SD3. However, the left side may be the third side SD3, and the right side may be the first side SD1.

As shown in FIG. 3, the integrated circuit device 10 according to this embodiment includes first to Nth circuit blocks CB1 to CBN (N is an integer larger than one) disposed along the direction D1. Specifically, while the circuit blocks are arranged in the direction D2 in the comparative example shown in FIG. 1A, the circuit blocks CB1 to CBN are arranged in the direction D1 in this embodiment. Each circuit block is a relatively square block differing from the ultra-flat block as in the comparative example shown in FIG. 1A.

The integrated circuit device 10 includes an output-side I/F region 12 (first interface region in a broad sense) provided along the side SD4 and on the D2 side of the first to Nth circuit blocks CB1 to CBN. The integrated circuit device 10 includes an input-side I/F region 14 (second interface region in a broad sense) provided along the side SD2 and on the D4 side of the first to Nth circuit blocks CB1 to CBN. In more detail, the output-side I/F region 12 (first I/O region) is disposed on the D2 side of the circuit blocks CB1 to CBN without other circuit blocks interposed therebetween, for example. The input-side I/F region 14 (second I/O region) is disposed on the D4 side of the circuit blocks CB1 to CBN without other circuit blocks interposed therebetween, for example. Specifically, only one circuit block (data driver block) exists in the direction D2 at least in the area in which the data driver block exists. When the integrated circuit device 10 is used as an intellectual property (IP) core and incorporated in another integrated circuit device, the integrated circuit device 10 may be configured to exclude at least one of the I/F regions 12 and 14.

The output-side (display panel side) I/F region 12 is a region which serves as an interface between the integrated circuit device 10 and the display panel, and includes pads and various elements such as output transistors and protective elements connected with the pads. In more detail, the output-side I/F region 12 includes output transistors for outputting data signals to data lines and scan signals to scan lines, for example. When the display panel is a touch panel, the output-side I/F region 12 may include input transistors.

The input-side I/F region 14 is a region which serves as an interface between the integrated circuit device 10 and a host (MPU, image processing controller, or baseband engine), and may include pads and various elements connected with the pads, such as input (input-output) transistors, output transistors, and protective elements. In more detail, the input-side I/F region 14 includes input transistors for inputting signals (digital signals) from the host, output transistors for outputting signals to the host, and the like.

An output-side or input-side I/F region may be provided along the short side SD1 or SD3. Bumps which serve as external connection terminals may be provided in the I/F (interface) regions 12 and 14, or may be provided in other regions (first to Nth circuit blocks CB1 to CBN). When providing the bumps in the region other than the I/F regions 12 and 14, the bumps are formed by using a small bump technology (e.g. bump technology using resin core) other than a gold bump technology.

The first to Nth circuit blocks CB1 to CBN may include at least two (or three) different circuit blocks (circuit blocks having different functions). Taking an example in which the integrated circuit device 10 is a display driver, the circuit blocks CB1 to CBN may include at least two of a data driver block, a memory block, a scan driver block, a logic circuit block, a grayscale voltage generation circuit block, and a power supply circuit block. In more detail, the circuit blocks CB1 to CBN may include at least a data driver block and a logic circuit block, and may further include a grayscale voltage generation circuit block. When the integrated circuit device 10 includes a built-in memory, the circuit blocks CB1 to CBN may further include a memory block.

FIG. 4 shows an example of various types of display drivers and circuit blocks provided in the display drivers. In an amorphous thin film transistor (TFT) panel display driver including a built-in memory (RAM), the circuit blocks CB1 to CBN include a memory block, a data driver (source driver) block, a scan driver (gate driver) block, a logic circuit (gate array circuit) block, a grayscale voltage generation circuit (γ-correction circuit) block, and a power supply circuit block. In a low-temperature polysilicon (LTPS) TFT panel display driver including a built-in memory, since the scan driver can be formed on a glass substrate, the scan driver block may be omitted. The memory block may be omitted in an amorphous TFT panel display driver which does not include a memory, and the memory block and the scan driver block may be omitted in a low-temperature polysilicon TFT panel display driver which does not include a memory. In a color super twisted nematic (CSTN) panel display driver and a thin film diode (TFD) panel display driver, the grayscale voltage generation circuit block may be omitted.

Figure 5A:
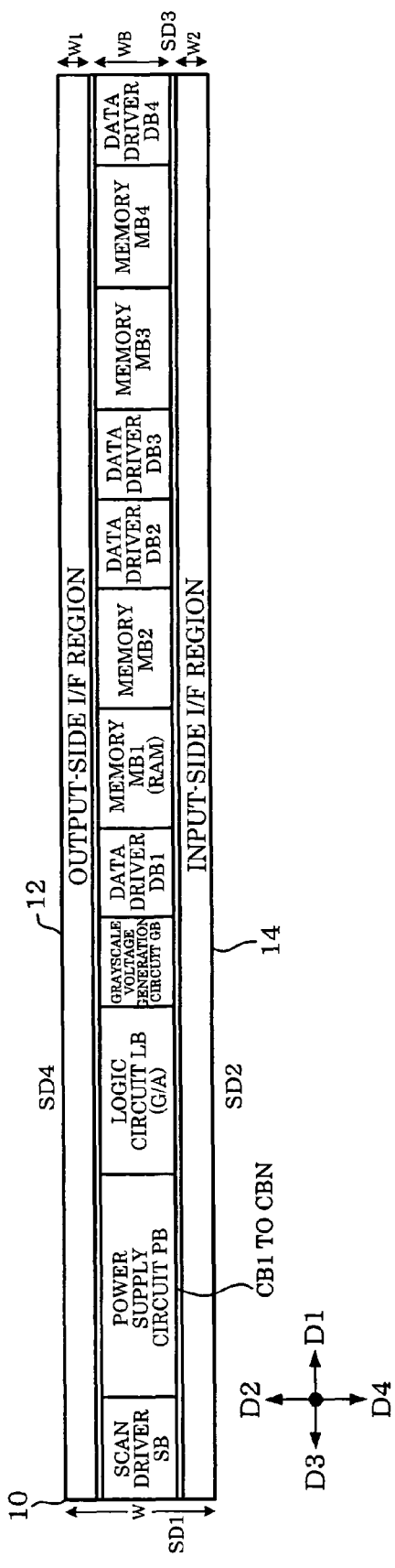
FIGS. 5A and 5B are planar layout examples of the integrated circuit device according to one embodiment of the invention.
Figure 5B:
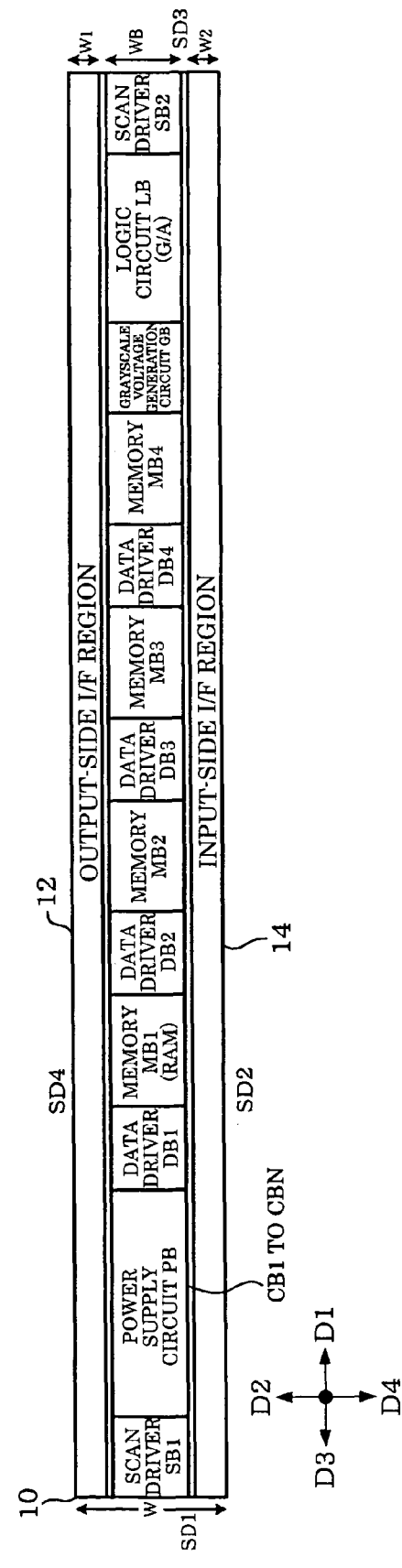

FIGS. 5A and 5B show examples of a planar layout of the integrated circuit device 10 as the display driver according to this embodiment. FIGS. 5A and 5B are examples of an amorphous TFT panel display driver including a built-in memory. FIG. 5A shows a QCIF and 32-grayscale display driver, and FIG. 5B shows a QVGA and 64-grayscale display driver.

In FIGS. 5A and 5B, the first to Nth circuit blocks CB1 to CBN include first to fourth memory blocks MB1 to MB4 (first to Ith memory blocks in a broad sense; I is an integer larger than one). The first to Nth circuit blocks CB1 to CBN include first to fourth data driver blocks DB1 to DB4 (first to Ith data driver blocks in a broad sense) respectively disposed adjacent to the first to fourth memory blocks MB1 to MB4 along the direction D1. In more detail, the memory block MB1 and the data driver block DB1 are disposed adjacent to each other along the direction D1, and the memory block MB2 and the data driver block DB2 are disposed adjacent to each other along the direction D1. The memory block MB1 adjacent to the data driver block DB1 stores image data (display data) used by the data driver block DB1 to drive the data line, and the memory block MB2 adjacent to the data driver block DB2 stores image data used by the data driver block DB2 to drive the data line.

In FIG. 5A, the data driver block DB1 (Jth data driver block in a broad sense; $1 \leq J < I$) of the data driver blocks DB1 to DB4 is disposed adjacently on the D3 side of the memory block MB1 (Jth memory block in a broad sense) of the memory blocks MB1 to MB4. The memory block MB2 ((J+1)th memory block in a broad sense) is disposed adjacently on the D1 side of the memory block MB1. The data driver block DB2 ((J+1)th data driver block in a broad sense) is disposed adjacently on the D1 side of the memory block MB2. The arrangement of the memory blocks MB3 and MB4 and the data driver blocks DB3 and DB4 is the same as described above. In FIG. 5A, the memory block MB1 and the data driver block DB1 and the memory block MB2 and the data driver block DB2 are disposed line-symmetrical with respect to the borderline between the memory blocks MB1 and MB2, and the memory block MB3 and the data driver block DB3 and the memory block MB4 and the data driver block DB4 are disposed line-symmetrical with respect to the borderline between the memory blocks MB3 and MB4. In FIG. 5A, the data driver blocks DB2 and DB3 are disposed adjacent to each other. However, another circuit block may be disposed between the data driver blocks DB2 and DB3.

In FIG. 5B, the data driver block DB1 (Jth data driver block) of the data driver blocks DB1 to DB4 is disposed adjacently on the D3 side of the memory block MB1 (Jth memory block) of the memory blocks MB1 to MB4. The data driver block DB2 ((J+1)th data driver block) is disposed on the D1 side of the memory block MB1. The memory block MB2 ((J+1)th memory block) is disposed on the D1 side of the data driver block DB2. The data driver block DB3, the memory block MB3, the data driver block DB4, and the memory block MB4 are disposed in the same manner as described above. In FIG. 5B, the memory block MB1 and the data driver block DB2, the memory block MB2 and the data driver block DB3, and the memory block MB3 and the data driver block DB4 are respectively disposed adjacent to each other. However, another circuit block may be disposed between these blocks.

The layout arrangement shown in FIG. 5A has an advantage in that a column address decoder can be used in common between the memory blocks MB1 and MB2 or the memory blocks MB3 and MB4 (between the Jth and (J+1)th blocks). The layout arrangement shown in FIG. 5B has an advantage in that the wiring pitch of the data signal output lines from the data driver blocks DB1 to DB4 to the output-side I/F region 12 can be equalized so that the wiring efficiency can be increased.

The layout arrangement of the integrated circuit device 10 according to this embodiment is not limited to those shown in FIGS. 5A and 5B. For example, the number of memory blocks and data driver blocks may be set at 2, 3, or 5 or more, or the memory block and the data driver block may not be divided into blocks. A modification in which the memory block is not disposed adjacent to the data driver block is also possible. A configuration is also possible in which the memory block, the scan driver block, the power supply circuit block, or the grayscale voltage generation circuit block is not provided. A circuit block having a width significantly small in the direction D2 (narrow circuit block having a width less than the width WB) may be provided between the circuit blocks CB1 to CBN and the output-side I/F region 12 or the input-side I/F region 14. The circuit blocks CB1 to CBN may include a circuit block in which different circuit blocks are arranged in stages in the direction D2. For example, the scan driver circuit and the power supply circuit may be formed in one circuit block.

Figure 6A:
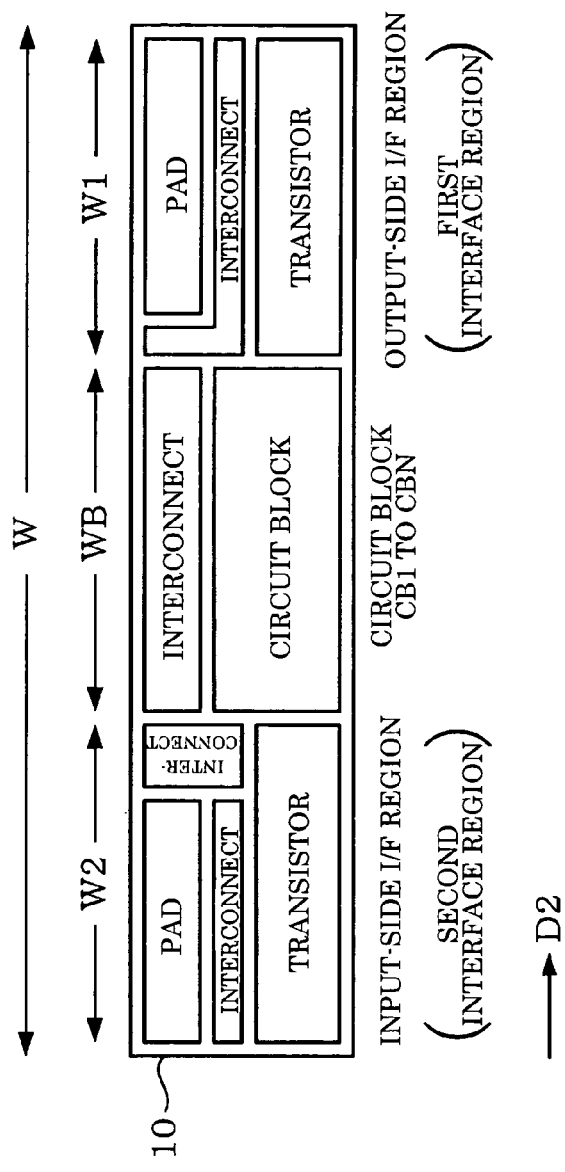
FIGS. 6A and 6B are examples of cross-sectional views of the integrated circuit device.
Figure 6B:
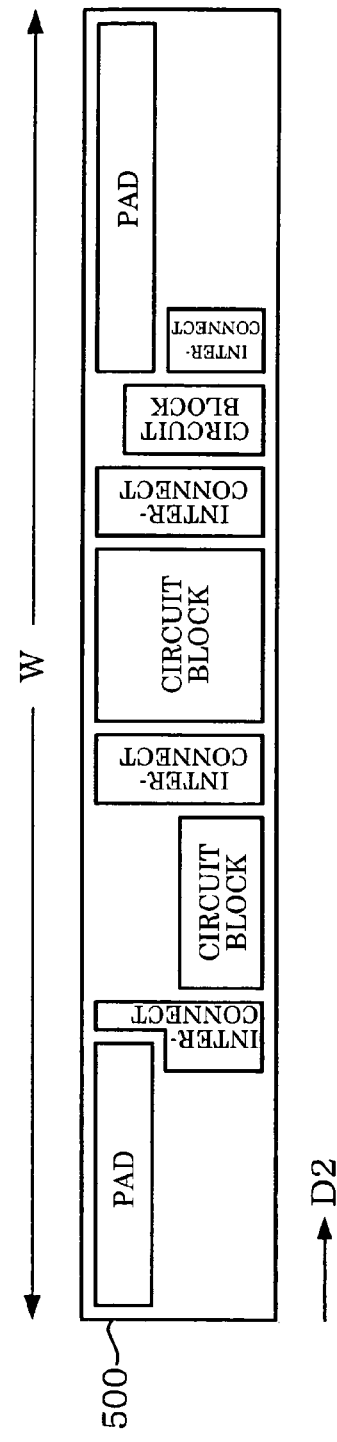

FIG. 6A shows an example of a cross-sectional view of the integrated circuit device 10 according to this embodiment along the direction D2. In the comparative example shown in FIG. 1A, two or more circuit blocks are disposed along the direction D2 as shown in FIG. 6B. Moreover, wiring regions are formed between the circuit blocks and between the circuit blocks and the I/F region in the direction D2. Therefore, since the width W of the integrated circuit device 500 in the direction D2 (short side direction) is increased, a slim chip cannot be realized. Therefore, even if the chip is shrunk by using a macrofabrication technology, the length LD in the direction D1 (long side direction) is decreased, as shown in FIG. 2A, so that the output pitch becomes narrow, whereby it becomes difficult to mount the integrated circuit device 500.

Figure 2B:
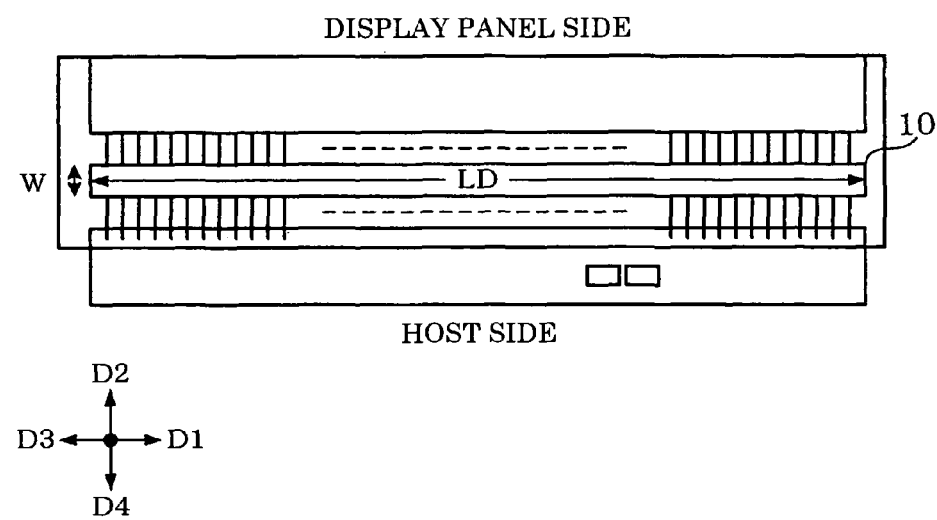

In this embodiment, the circuit blocks CB1 to CBN are disposed along the direction D1 as shown in FIGS. 3, 5A, and 5B. As shown in FIG. 6A, the transistor (circuit element) can be disposed under the pad (bump) (active surface bump). Moreover, the signal lines can be formed between the circuit blocks and between the circuit blocks and the I/F by using the global lines formed in the upper layer (lower layer of the pad) of the local lines in the circuit blocks. Therefore, since the width W of the integrated circuit device 10 in the direction D2 can be reduced while maintaining the length LD of the integrated circuit device 10 in the direction D1 as shown in FIG. 2B, a very slim chip can be realized. As a result, since the output pitch can be maintained at 22 μm or more, for example, mounting can be facilitated.

In this embodiment, since the circuit blocks CB1 to CBN are disposed along the direction D1, it is possible to easily deal with a change in the product specifications and the like. Specifically, since product of various specifications can be designed by using a common platform, the design efficiency can be increased. For example, when the number of pixels or the number of grayscales of the display panel is increased or decreased in FIGS. 5A and 5B, it is possible to deal with such a situation merely by increasing or decreasing the number of blocks of memory blocks or data driver blocks, the number of readings of image data in one horizontal scan period, or the like. FIGS. 5A and 5B show an example of an amorphous TFT panel display driver including a memory. When developing a low-temperature polysilicon TFT panel product including a memory, it suffices to remove the scan driver block from the circuit blocks CB1 to CBN. When developing a product which does not include a memory, it suffices to remove the memory block from the circuit blocks CB1 to CBN. In this embodiment, even if the circuit block is removed corresponding to the specification, since the effect on the remaining circuit blocks is minimized, the design efficiency can be increased.

In this embodiment, the widths (heights) of the circuit blocks CB1 to CBN in the direction D2 can be uniformly adjusted to the width (height) of the data driver block or the memory block, for example. Since it is possible to deal with an increase or decrease in the number of transistors of each circuit block by increasing or decreasing the length of each circuit block in the direction D1, the design efficiency can be further increased. For example, when the number of transistors is increased or decreased in FIGS. 5A and 5B due to a change in the configuration of the grayscale voltage generation circuit block or the power supply circuit block, it is possible to deal with such a situation by increasing or decreasing the length of the grayscale voltage generation circuit block or the power supply circuit block in the direction D1.

As a second comparative example, a narrow data driver block may be disposed in the direction D1, and other circuit blocks such as the memory block may be disposed along the direction D1 on the D4 side of the data driver block, for example. However, in the second comparative example, since the data driver block having a large width lies between other circuit blocks such as the memory block and the output-side I/F region, the width W of the integrated circuit device in the direction D2 is increased, so that it is difficult to realize a slim chip. Moreover, an additional wiring region is formed between the data driver block and the memory block, whereby the width W is further increased. Furthermore, when the configuration of the data driver block or the memory block is changed, the pitch difference described with reference to FIGS. 1B and 1C occurs, whereby the design efficiency cannot be increased.

As a third comparative example of this embodiment, only circuit blocks (e.g. data driver blocks) having the same function may be divided and arranged in the direction D1. However, since the integrated circuit device can be provided with only a single function (e.g. function of the data driver) in the third comparative example, development of various products cannot be realized. In this embodiment, the circuit blocks CB1 to CBN include circuit blocks having at least two different functions. Therefore, various integrated circuit devices corresponding to various types of display panels can be provided as shown in FIGS. 4, 5A, and 5B.

3. Circuit Configuration

Figure 7:
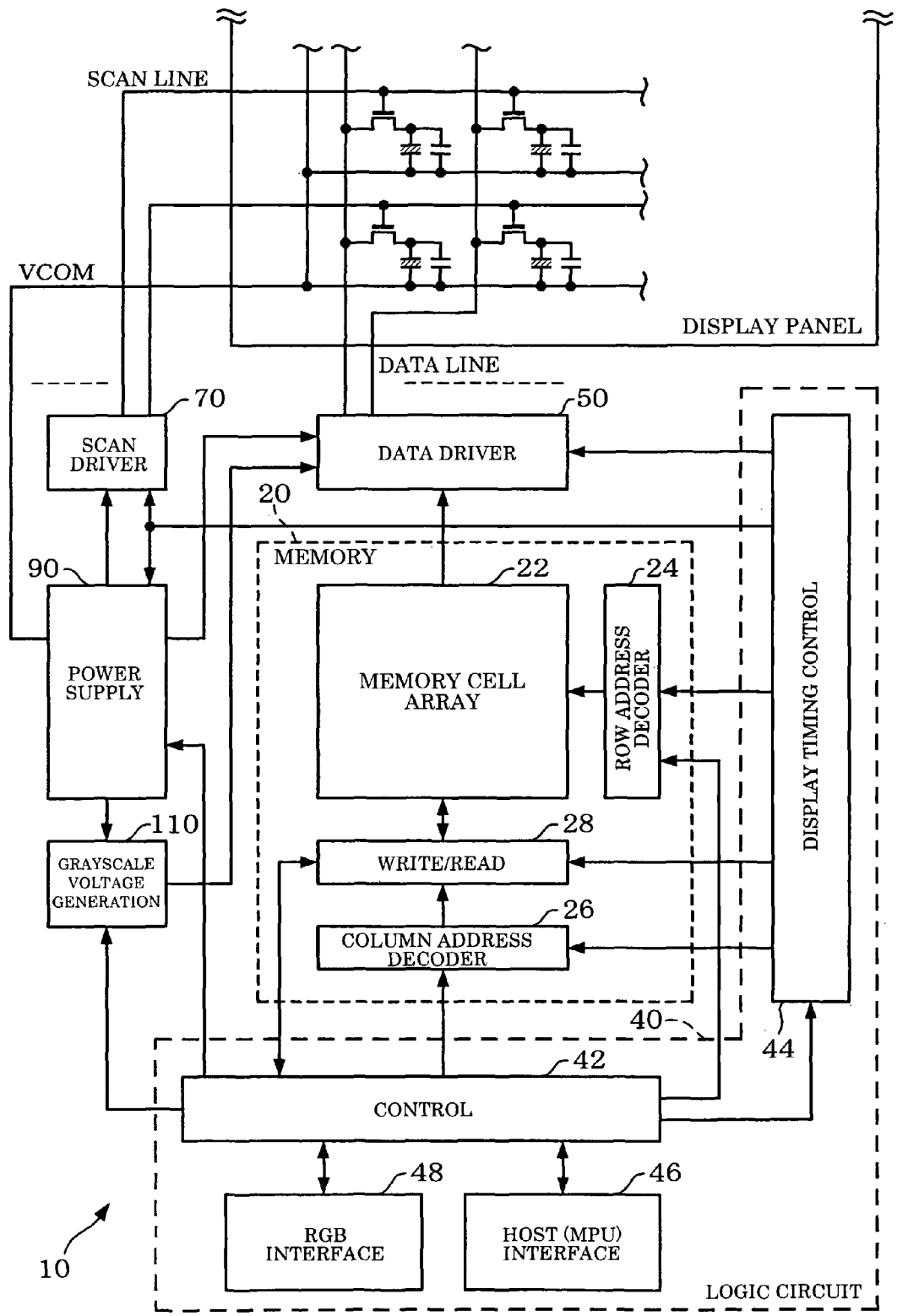
FIG. 7 is a circuit configuration example of the integrated circuit device.

FIG. 7 shows a circuit configuration example of the integrated circuit device 10. The circuit configuration of the integrated circuit device 10 is not limited to the circuit configuration shown in FIG. 7. Various modifications and variations may be made. A memory 20 (display data RAM) stores image data. A memory cell array 22 includes a plurality of memory cells, and stores image data (display data) for at least one frame (one screen). In this case, one pixel is made up of R, G, and B subpixels (three dots), and 6-bit (k-bit) image data is stored for each subpixel, for example. A row address decoder 24 (MPU/LCD row address decoder) decodes a row address and selects a wordline of the memory cell array 22. A column address decoder 26 (MPU column address decoder) decodes a column address and selects a bitline of the memory cell array 22. A write/read circuit 28 (MPU write/read circuit) writes image data into the memory cell array 22 or reads image data from the memory cell array 22. An access region of the memory cell array 22 is defined by a rectangle having a start address and an end address as opposite vertices. Specifically, the access region is defined by the column address and the row address of the start address and the column address and the row address of the end address so that memory access is performed.

A logic circuit 40 (e.g. automatic placement and routing circuit) generates a control signal for controlling display timing, a control signal for controlling data processing timing, and the like. The logic circuit 40 may be formed by automatic placement and routing such as a gate array (G/A). A control circuit 42 generates various control signals and controls the entire device. In more detail, the control circuit 42 outputs grayscale characteristic (γ-characteristic) adjustment data (γ-correction data) to a grayscale voltage generation circuit 110 and controls voltage generation of a power supply circuit 90. The control circuit 42 controls write/read processing for the memory using the row address decoder 24, the column address decoder 26, and the write/read circuit 28. A display timing control circuit 44 generates various control signals for controlling display timing, and controls reading of image data from the memory into the display panel. A host (MPU) interface circuit 46 realizes a host interface which accesses the memory by generating an internal pulse each time accessed by the host. An RGB interface circuit 48 realizes an RGB interface which writes motion picture RGB data into the memory based on a dot clock signal. The integrated circuit device 10 may be configured to include only one of the host interface circuit 46 and the RGB interface circuit 48.

In FIG. 7, the host interface circuit 46 and the RGB interface circuit 48 access the memory 20 in pixel units. Image data designated by a line address and read in line units is supplied to a data driver 50 in line cycle at an internal display timing independent of the host interface circuit 46 and the RGB interface circuit 48.

Figure 8A:
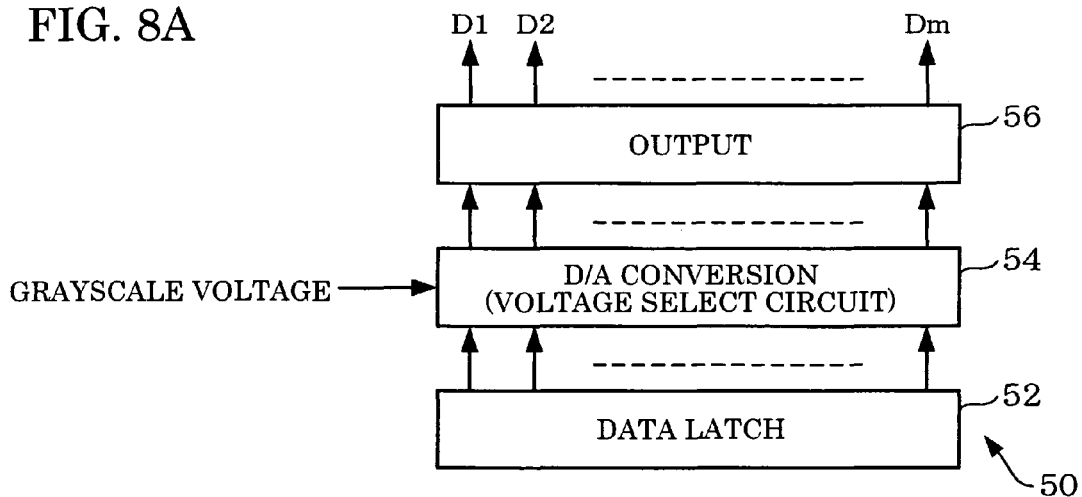
FIGS. 8A, 8B, and 8C are illustrative of configuration examples of a data driver and a scan driver.

The data driver 50 is a circuit for driving a data line of the display panel. FIG. 8A shows a configuration example of the data driver 50. A data latch circuit 52 latches the digital image data from the memory 20. A D/A conversion circuit 54 (voltage select circuit) performs D/A conversion of the digital image data latched by the data latch circuit 52, and generates an analog data voltage. In more detail, the D/A conversion circuit 54 receives a plurality of (e.g. 64 stages) grayscale voltages (reference voltages) from the grayscale voltage generation circuit 110, selects a voltage corresponding to the digital image data from the grayscale voltages, and outputs the selected voltage as the data voltage. An output circuit 56 (driver circuit or buffer circuit) buffers the data voltage from the D/A conversion circuit 54, and outputs the data voltage to the data line of the display panel to drive the data line. A part of the output circuit 56 (e.g. output stage of operational amplifier) may not be included in the data driver 50 and may be disposed in other region.

Figure 8B:
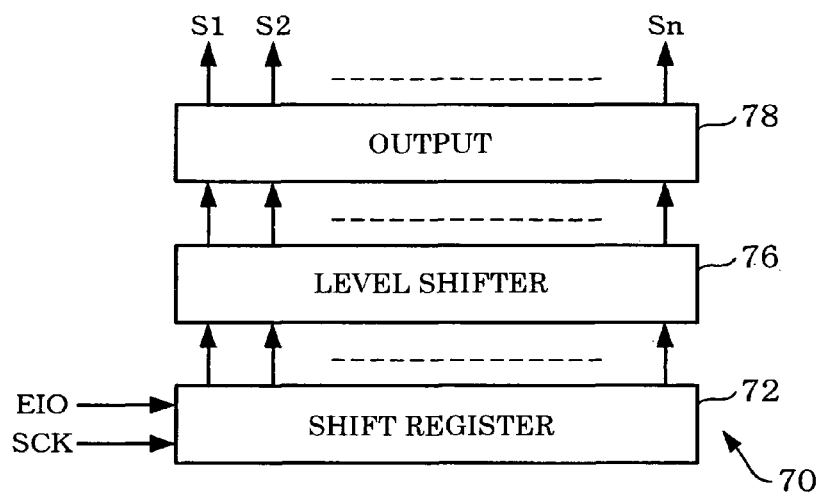
Figure 8C:
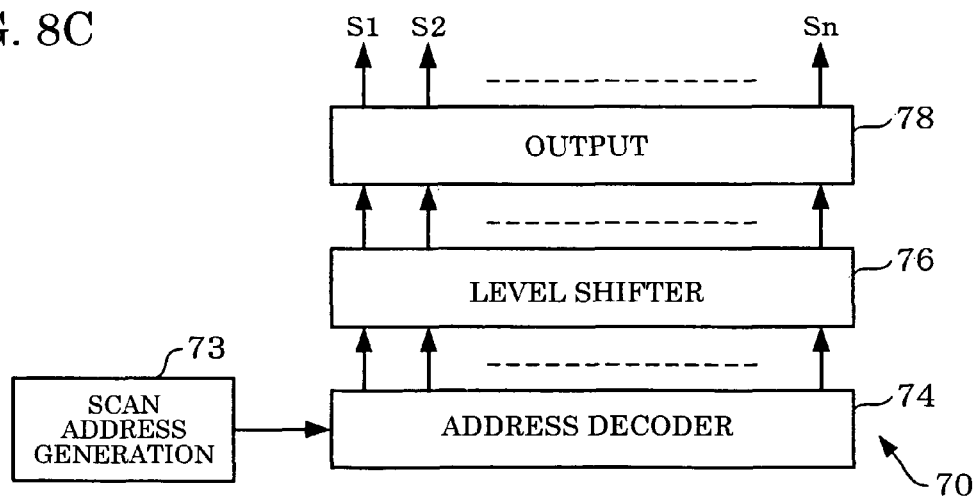

A scan driver 70 is a circuit for driving a scan line of the display panel. FIG. 8B shows a configuration example of the scan driver 70. A shift register 72 includes a plurality of sequentially connected flip-flops, and sequentially shifts an enable input-output signal EIO in synchronization with a shift clock signal SCK. A level shifter 76 converts the voltage level of the signal from the shift register 72 into a high voltage level for selecting the scan line. An output circuit 78 buffers a scan voltage converted and output by the level shifter 76, and outputs the scan voltage to the scan line of the display panel to drive the scan line. The scan driver 70 may be configured as shown in FIG. 8C. In FIG. 8C, a scan address generation circuit 73 generates and outputs a scan address, and an address decoder decodes the scan address. The scan voltage is output to the scan line specified by the decode processing through the level shifter 76 and the output circuit 78.

Figure 9A:
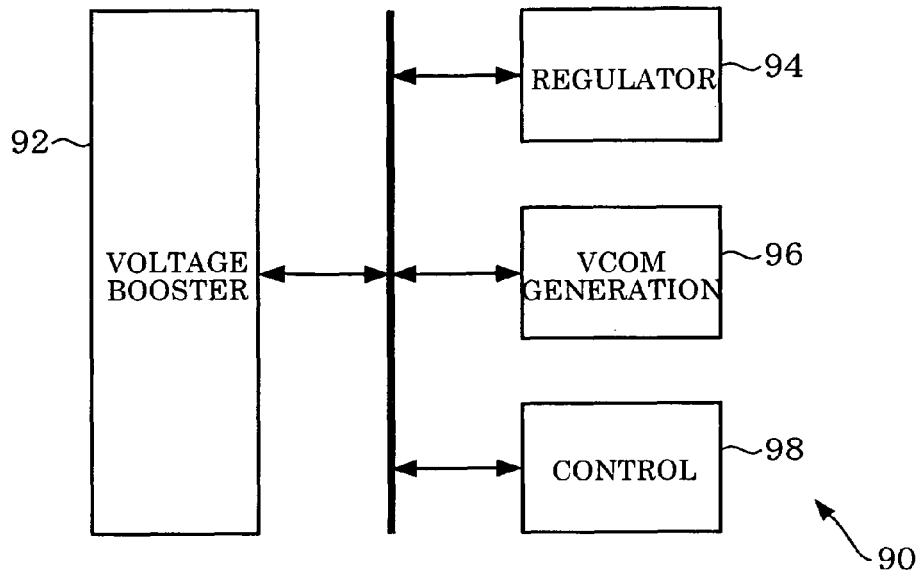
FIGS. 9A and 9B are configuration examples of a power supply circuit and a grayscale voltage generation circuit.

The power supply circuit 90 is a circuit which generates various power supply voltages. FIG. 9A shows a configuration example of the power supply circuit 90. A voltage booster circuit 92 is a circuit which generates a boost voltage by boosting an input power source voltage or an internal power supply voltage by a charge-pump method using a boost capacitor and a boost transistor, and may include first to fourth voltage booster circuits and the like. A high voltage used by the scan driver 70 and the grayscale voltage generation circuit 110 can be generated by the voltage booster circuit 92. A regulator circuit 94 regulates the level of the boost voltage generated by the voltage booster circuit 92. A VCOM generation circuit 96 generates and outputs a voltage VCOM supplied to a common electrode of the display panel. A control circuit 98 controls the power supply circuit 90, and includes various control registers and the like.

Figure 9B:
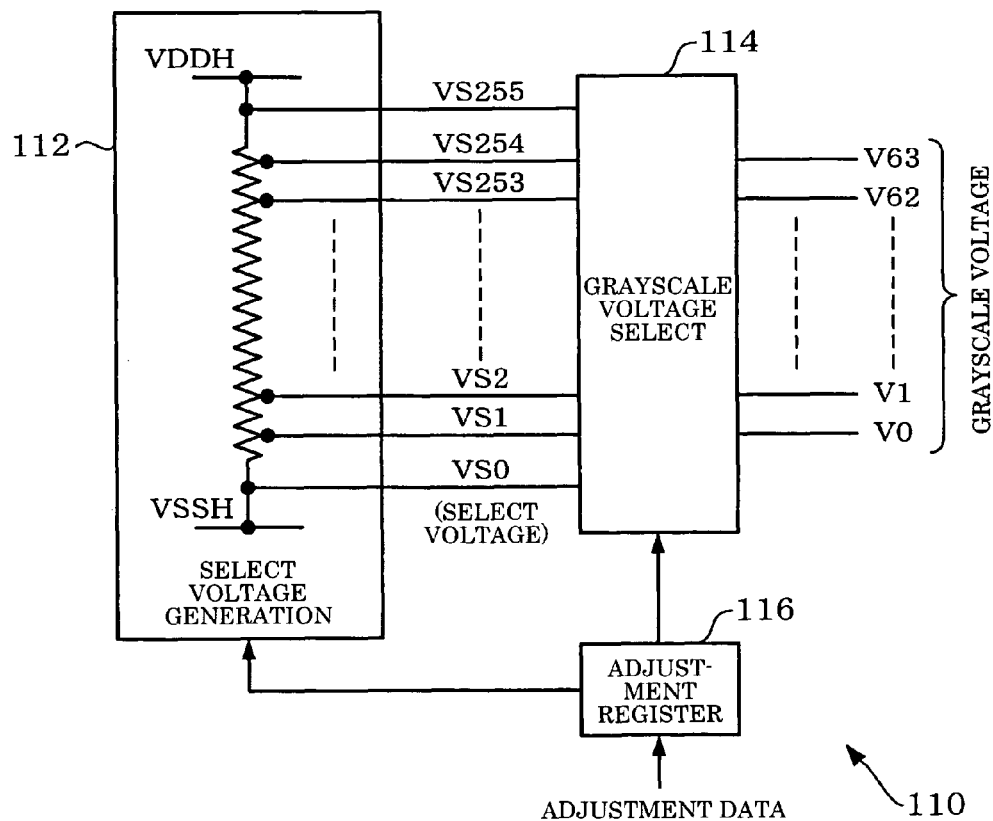

The grayscale voltage generation circuit 110 (γ-correction circuit) is a circuit which generates grayscale voltages. FIG. 9B shows a configuration example of the grayscale voltage generation circuit 110. A select voltage generation circuit 112 (voltage divider circuit) outputs select voltages VS0 to VS255 (R select voltages in a broad sense) based on high-voltage power supply voltages VDDH and VSSH generated by the power supply circuit 90. In more detail, the select voltage generation circuit 112 includes a ladder resistor circuit including a plurality of resistor elements connected in series. The select voltage generation circuit 112 outputs voltages obtained by dividing the power supply voltages VDDH and VSSH using the ladder resistor circuit as the select voltages VS0 to VS255. A grayscale voltage select circuit 114 selects 64 (S in a broad sense; R>S) voltages from the select voltages VS0 to VS255 in the case of using 64 grayscales based on the grayscale characteristic adjustment data set in an adjustment register 116 by the logic circuit 40, and outputs the selected voltages as grayscale voltages V0 to V63. This enables generation of a grayscale voltage having grayscale characteristics (γ-correction characteristics) optimum for the display panel. In the case of performing a polarity reversal drive, a positive ladder resistor circuit and a negative ladder resistor circuit may be provided in the select voltage generation circuit 112. The resistance value of each resistor element of the ladder resistor circuit may be changed based on the adjustment data set in the adjustment register 116. An impedance conversion circuit (voltage-follower-connected operational amplifier) may be provided in the select voltage generation circuit 112 or the grayscale voltage select circuit 114.

Figure 10A:
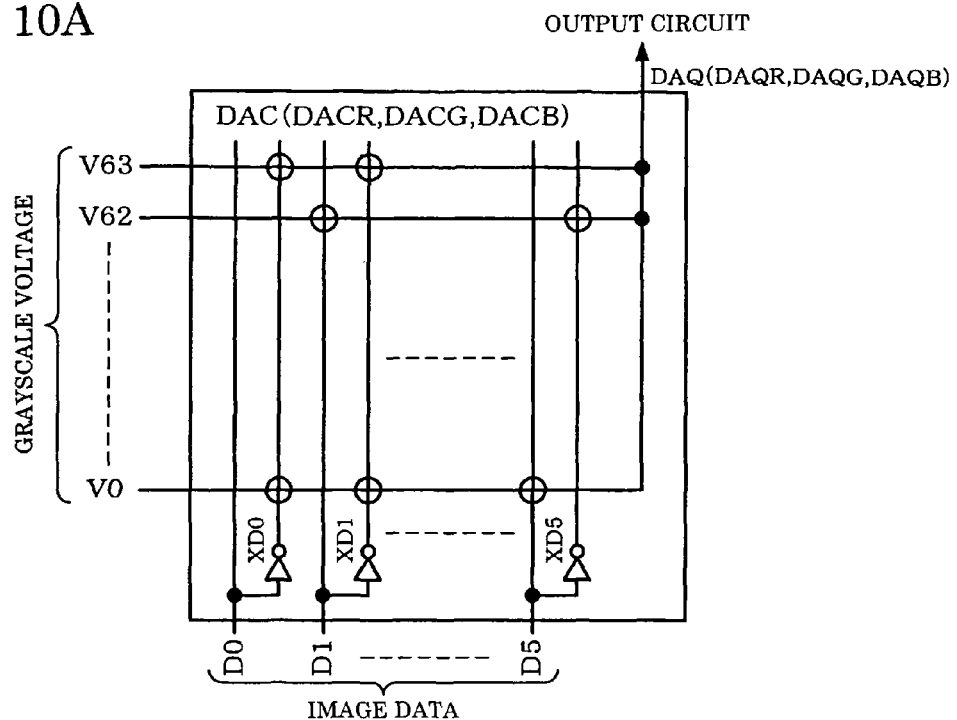
FIGS. 10A, 10B, and 10C are configuration examples of a D/A conversion circuit and an output circuit.

FIG. 10A shows a configuration example of a digital-analog converter (DAC) included in the D/A conversion circuit 54 shown in FIG. 8A. The DAC shown in FIG. 10A may be provided in subpixel units (or pixel units), and may be formed by a ROM decoder and the like. The DAC selects one of the grayscale voltages V0 to V63 from the grayscale voltage generation circuit 110 based on 6-bit digital image data D0 to D5 and inverted data XD0 to XD5 from the memory 20 to convert the image data D0 to D5 into an analog voltage. The DAC outputs the resulting analog voltage signal DAQ (DAQR, DAQG; DAQB) to the output circuit 56.

When R, G, and B data signals are multiplexed and supplied to a low-temperature polysilicon TFT display driver or the like (FIG. 10C), R, G, and B image data may be D/A converted by using one common DAC. In this case, the DAC shown in FIG. 10A is provided in pixel units.

Figure 10B:
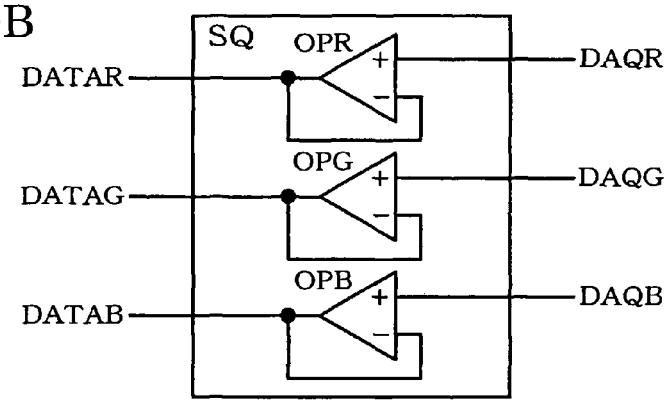
Figure 10C:
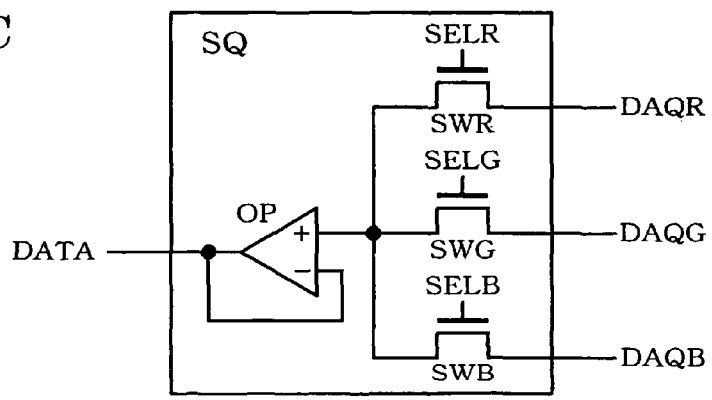

FIG. 10B shows a configuration example of an output section SQ included in the output circuit 56 shown in FIG. 8A. The output section SQ shown in FIG. 10B may be provided in pixel units. The output section SQ includes R (red), G (green), and B (blue) impedance conversion circuits OPR, OPG, and OPB (voltage-follower-connected operational amplifiers), performs impedance conversion of the signals DAQR, DAQG, and DAQB from the DAC, and outputs data signals DATAR, DATAG, and DATAB to R, G, and B data signal output lines. When using a low-temperature polysilicon TFT panel, switch elements (switch transistors) SWR, SWG, and SWB as shown in FIG. 10C may be provided, and the impedance conversion circuit OP may output a data signal DATA in which the R, G, and B data signals are multiplexed. The data signals may be multiplexed over a plurality of pixels. Only the switch elements and the like may be provided in the output section SQ without providing the impedance conversion circuit as shown in FIGS. 10B and 10C.

4. Width of Integrated Circuit Device
4.1 Boost Transistor

In this embodiment, the power supply voltage of each circuit block of the integrated circuit device is generated by the voltage booster circuit 92 using a charge pump method. The voltage booster circuit 92 generates a voltage increased by a charge-pump operation using a boost capacitor as a flying capacitor and a boost transistor.

Figure 11A:
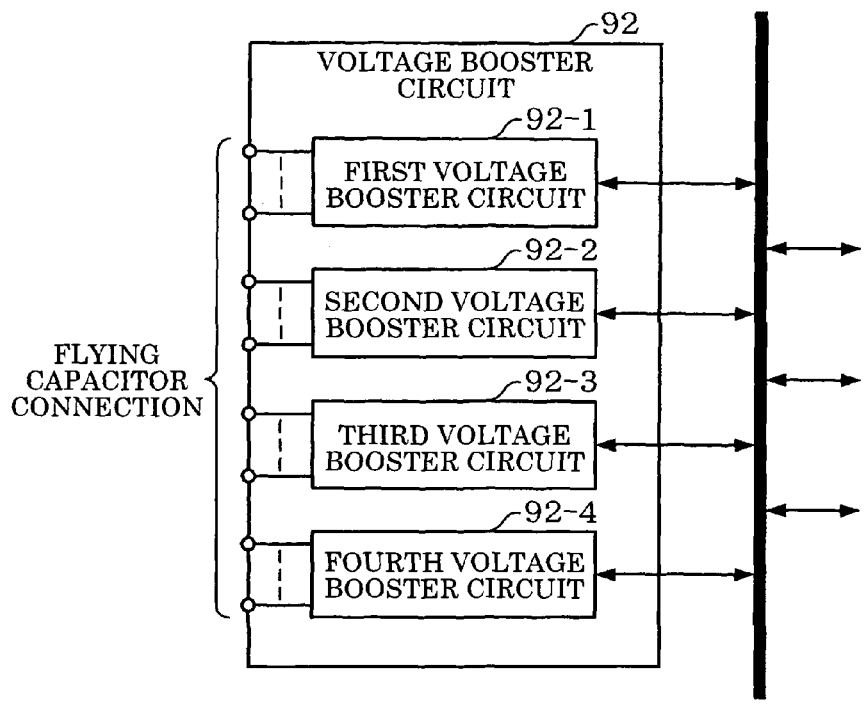
FIG. 11A is a block diagram of a configuration example of a voltage booster circuit shown in FIG. 9A.
Figure 11B:
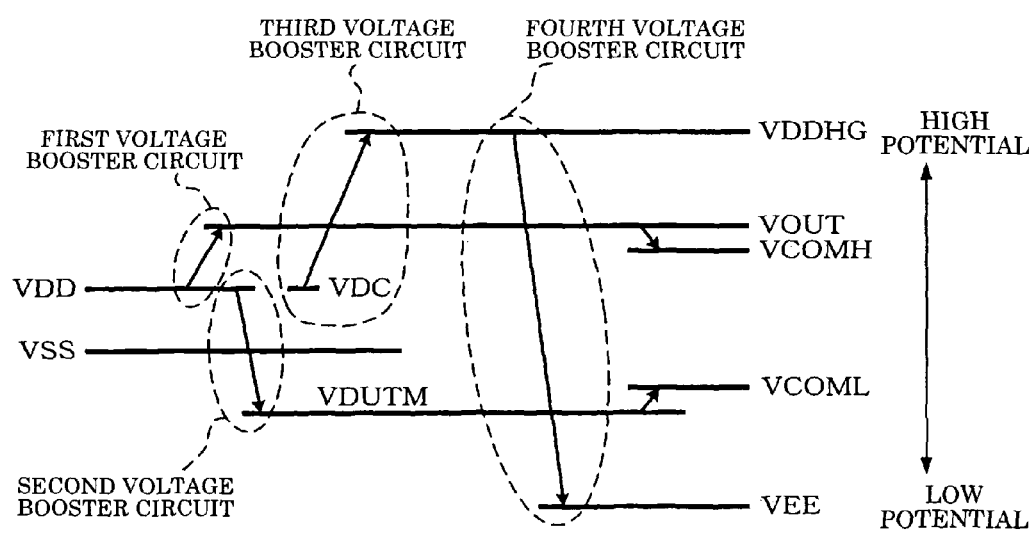
FIG. 11B is a view showing an example of the potential relationship among various power supply voltages.

FIG. 11A is a block diagram of a configuration example of the voltage booster circuit 92 shown in FIG. 9A. FIG. 11B shows an example of the potential relationship among the power supply voltages of each circuit block of the integrated circuit device according to this embodiment. As shown in FIG. 11A, the voltage booster circuit 92 may include a first voltage booster circuit 92-1, a second voltage booster circuit 92-2, a third voltage booster circuit 92-3, and a fourth voltage booster circuit 92-4. Each of the first to fourth voltage booster circuits 92-1 to 92-4 includes one or more terminals (pads) for connection with a flying capacitor provided outside the integrated circuit device 10. A first boost voltage generated by the first voltage booster circuit 92-1 is supplied to the third voltage booster circuit 92-3. The second voltage booster circuit 92-2 generates a second boost voltage increased in the negative direction, differing from the first voltage booster circuit 92-1. The third voltage booster circuit 92-3 increases the first boost voltage from the first voltage booster circuit 92-2 to generate a third boost voltage. The third boost voltage is supplied to the fourth voltage booster circuit 92-4. The fourth voltage booster circuit 92-4 increases the third boost voltage from the third voltage booster circuit 92-3 to generate a fourth boost voltage.

As shown in FIG. 11B, the first voltage booster circuit 92-1 increases the voltage between a system power supply voltage VDD and a system ground power supply voltage VSS to generate a power supply voltage VOUT as the first boost voltage. The second voltage booster circuit 92-2 increases the voltage between the system power supply voltage VDD and the system ground power supply voltage VSS in the negative direction to generate a voltage VOUTM lower in potential than the system ground power supply voltage VSS. The third voltage booster circuit 92-3 increases the voltage between the system power supply voltage VDD or a specific internal voltage VDC and the system ground power supply voltage VSS in the positive direction to generate a high-potential-side power supply voltage VDDHG. The fourth voltage booster circuit 92-4 increases the voltage between a given voltage and the high-potential-side power supply voltage VDDHG in the negative direction with respect to the given voltage to generate a low-potential-side power supply voltage VEE.

The regulator circuit 94 regulates the potential of the power supply voltage VOUT to generate a high-potential-side voltage VCOMH of the voltage VCOM. The regulator circuit 94 regulates the potential of the voltage VOUTM to generate a low-potential-side voltage VCOML of the voltage VCOM. The regulator circuit 94 may also generate a power supply voltage VCORE (not shown) by decreasing the potential of the system power supply voltage VDD.

The voltage VOUT is supplied as the power supply voltage of the data driver blocks DB1 to DB4 and a grayscale voltage generation circuit block GB. The power supply voltage VCORE is supplied as the power supply voltage of a logic circuit block LB (memory block MB when a memory is provided). The high-potential-side voltage VCOMH and the low-potential-side voltage VCOML of the voltage VCOM are supplied as the common voltage of the display panel. The high-potential-side power supply voltage VDDHG and the low-potential-side power supply voltage VEE are supplied as the power supply voltages of the scan driver block.

Figure 12A:
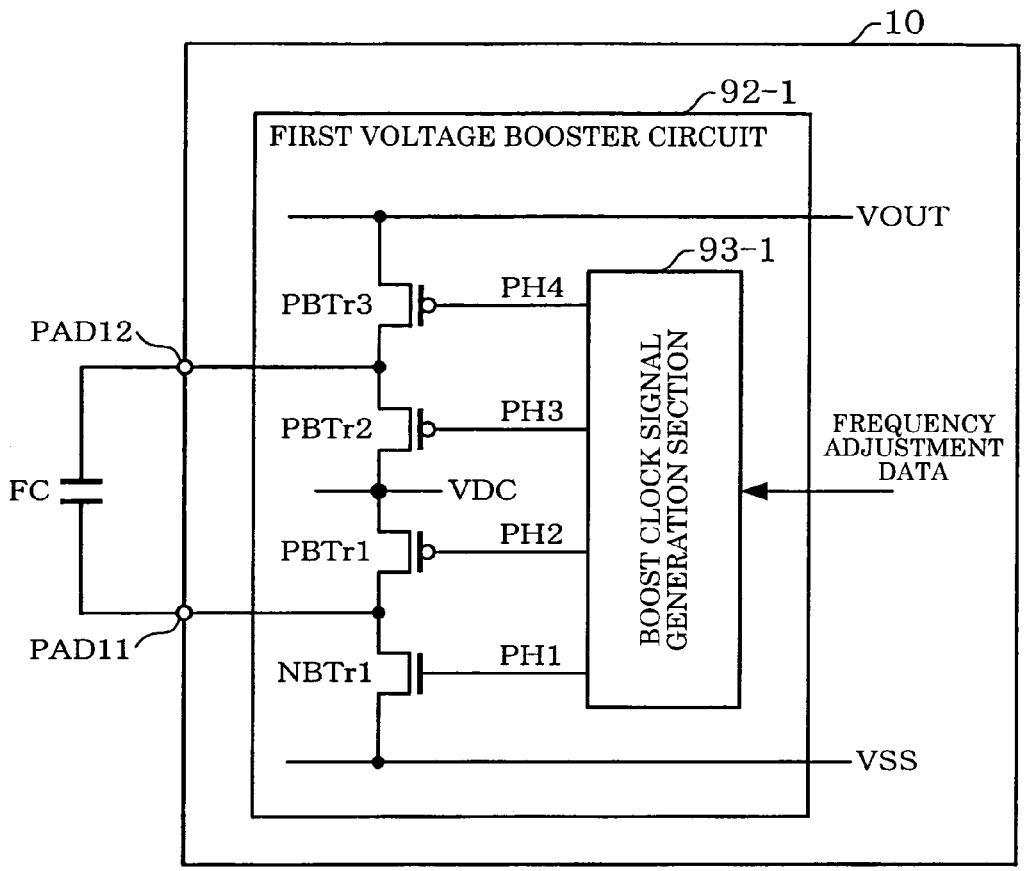
FIGS. 12A and 12B are views illustrative of a first voltage booster circuit.
Figure 12B:
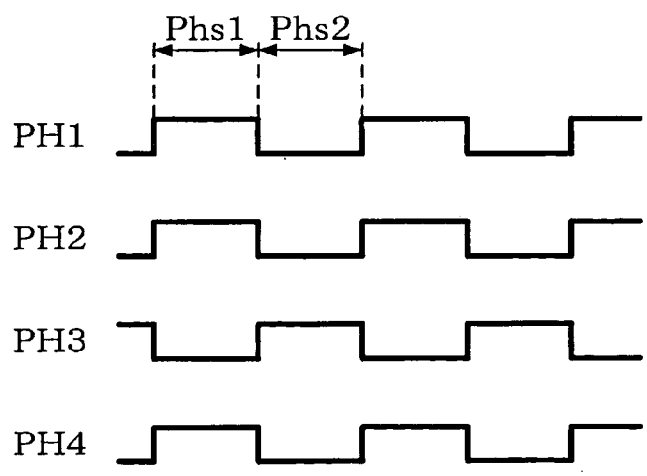

FIGS. 12A and 12B illustrate a configuration example and a control timing example of the first voltage booster circuit 92-1. In FIG. 12A, the first voltage booster circuit 92-1 generates the power supply voltage VOUT by increasing the voltage between two power supply lines twice. The system ground power supply voltage VSS is supplied to one of the two power supply lines, and a given internal power supply voltage VDC is supplied to the other power supply line. As shown in FIG. 12A, the first voltage booster circuit 92-1 includes an N-type metal oxide semiconductor (MOS) transistor NBTr1 and a P-type MOS transistor PBTr1 which are push-pull connected between the power supply lines. In more detail, the drain of the transistor NBTr1, of which the source is connected with the power supply line to which the system ground power supply voltage VSS is supplied, is connected with the drain of the transistor PBTr1. The source of the transistor PBTr1 is connected with the other power supply line. A connection node between the transistors NBTr1 and PBTr1 is electrically connected with a pad (connection terminal) PAD11 electrically connected with one end of a flying capacitor FC provided outside the integrated circuit device 10. The transistors NBTr1 and PBTr1 are gate-controlled in order to perform the charge-pump operation so that the voltage of one of the two power supply lines is output to the connection node.

The first voltage booster circuit 92-1 also includes P-type MOS transistors PBTr2 and PBTr3 which are push-pull connected between the power supply line to which the power supply voltage VDC is supplied and a power supply line for outputting the power supply voltage VOUT. A connection node between the transistors PBTr2 and PBTr3 is electrically connected with a pad PAD12 electrically connected with the other end of the flying capacitor FC provided outside the integrated circuit device 10. The transistors PBTr2 and PBTr3 are gate-controlled in order to perform the charge-pump operation so that the voltage of the connection node is set at the same potential as one of the two power supply lines.

The first voltage booster circuit 92-1 includes a boost clock signal generation section 93-1. The boost clock signal generation section 93-1 generates boost clock signals PH1 to PH4 which gate-control the transistors NBTr1, PBTr1, PBTr2, and PBTr3. The boost clock signals PH1 to PH4 change at timings shown in FIG. 12B. The charge-pump operation is controlled by using the boost clock signals PH1 to PH4. In practice, in order to prevent a drain current shoot-through phenomenon of the push-pull connected (serially connected) transistors (transistors NBTr1 and PBTr1 or transistors PBTr2 and PBTr3), the gate signals are generated so that the rise timing and the fall timing of the gate signals do not overlap.

In the first voltage booster circuit 92-1, the transistors NBTr1 and PBTr2 are turned ON and the transistors PBTr1 and PBTr3 are turned OFF in a phase Phs1 in which the boost clock signal PH1 is set at the H level. Therefore, the system ground power supply voltage VSS is supplied to one end of the flying capacitor FC, and the power supply voltage VDC is supplied to the other end of the flying capacitor FC. Therefore, electric charges corresponding to the voltage between the power supply voltage VDC and the system ground power supply voltage VSS are stored in the flying capacitor FC in the phase Phs1. In a phase Phs2 in which the boost clock signal PH1 is set at the L level, the transistors NBTr1 and PBTr2 are turned OFF and the transistors PBTr1 and PBTr3 are turned ON. Therefore, the power supply voltage VDC is supplied to one end of the flying capacitor FC. Therefore, the other end of the flying capacitor FC is set at a voltage at a potential higher than the power supply voltage VDC in an amount corresponding to the voltage between the power supply voltage VDC and the system ground power supply voltage VSS. The voltage at the other end of the flying capacitor FC is output as the power supply voltage VOUT through the transistor PBTr3. As a result, the power supply voltage VOUT is a voltage twice the voltage between the power supply voltage VDC and the system ground power supply voltage VSS.

The power supply voltage VOUT shown in FIGS. 12A and 12B is supplied as the power supply voltage of at least one of the circuit blocks CB1 to CBN. When the power supply line to which the power supply voltage VDC is supplied is referred to as a first power supply line and the transistors PBTr2 and PBTr3 are referred to as first and second transistors, the voltage of the power supply line (second power supply line) to which the power supply voltage VOUT is output or the voltage generated based on that voltage is supplied as the power supply voltage of at least one of the circuit blocks CB1 to CBN. FIGS. 12A and 12B illustrate the configuration example and the operation of the first voltage booster circuit 92-1. Note that the second voltage booster circuit 92-2, the third voltage booster circuit 92-3, and the fourth voltage booster circuit 92-4 may also be realized using a known configuration.

In this embodiment, the boost clock signal generation section of the voltage booster circuit (first voltage booster circuit 92-1) shown in FIG. 12A is provided in the power supply circuit block PB, and the boost transistors (first and second transistors) and the like are disposed in the input-side I/F region 14 in which the pads are arranged. In this case, it is preferable to dispose the boost transistors and the pads in the region of the input-side I/F region 14 near the power supply circuit block PB on the side of the power supply circuit block PB in the direction D4. At least one of the push-pull connected first and second transistors is disposed in the lower layer of the pad electrically connected with the connection node between the first and second transistors. When disposing a transistor in the lower layer of a pad, the threshold voltage of the transistor may change due to stress applied when bonding a bonding wire or the like. Moreover, the capacitance of an interlayer dielectric of the transistor may change from the designed capacitance. Therefore, the characteristics of the transistor on a wafer may differ from the characteristics during mounting. However, since the push-pull connected first and second transistors do not change in threshold voltage or the like during the operation, the above problems do not occur even if the first and second transistors are disposed in the lower layer of the pad. This reduces the layout area of the circuits around the pad, thereby contributing to provision of a narrow integrated circuit device.

Figure 13:
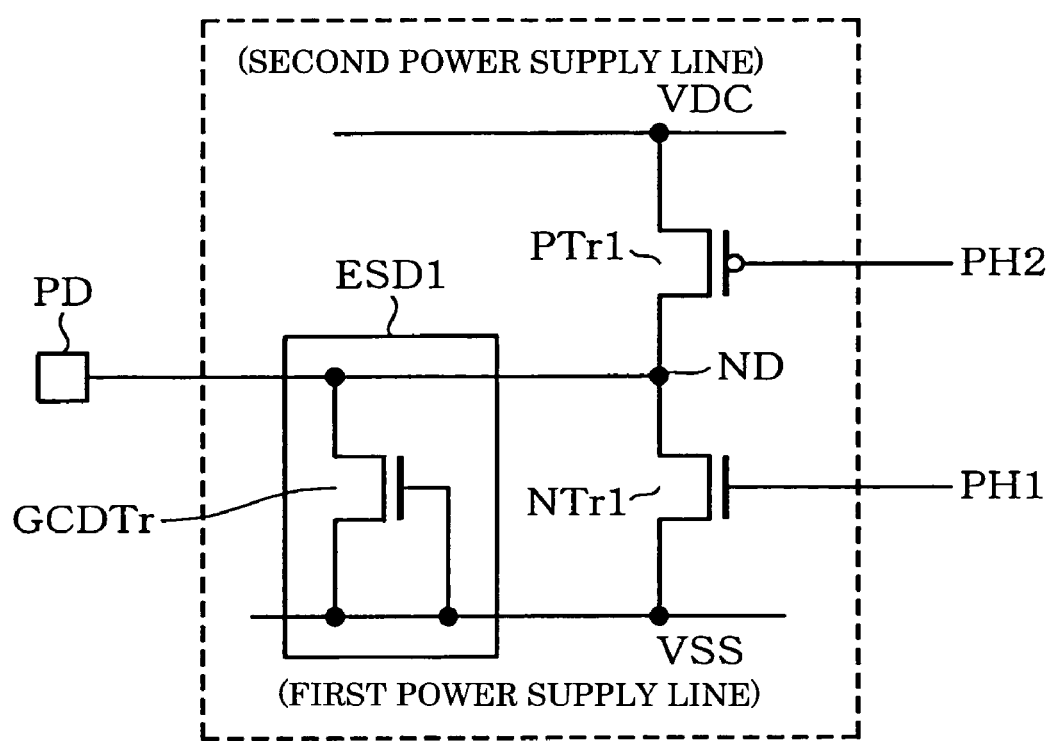
FIG. 13 is a view illustrative of a circuit including a transistor formed under a pad according to one embodiment of the invention.

FIG. 13 is a view illustrative of a circuit according to this embodiment including a transistor disposed under the pad. FIG. 13 is a detailed view of the transistors NBTr1 and PBTr1 shown in FIG. 12A, for example. Specifically, the integrated circuit device 10 includes first and second transistors NTr1 and PTr1 (transistors NBTr1 and PBTr1 in FIG. 12A), an electrostatic discharge protection element ESD1, and a pad PD. The first and second transistors NTr1 and PTr1 are push-pull connected between a power supply line (first power supply line) provided with the system ground power supply voltage VSS and a power supply line (second power supply line) provided with the power supply voltage VDC, and output the voltage of one of the first and second power supply lines to a connection node ND by a charge-pump operation. The electrostatic discharge protection element ESD1 is connected between the power supply line (first power supply line) provided with the system ground power supply voltage VSS and the connection node ND. The pad PD is electrically connected with the connection node ND, and is electrically connected with a flying capacitor (flying capacitor FC in FIG. 12A), to which a given voltage is supplied at one end, at the other end of the flying capacitor. The pad PD is disposed in the upper layer of at least one of the electrostatic discharge protection element ESD1 and the first and second transistors NTr1 and PTr1 so that the pad PD overlaps part or the entirety of at least one of the electrostatic discharge protection element ESD1 and the first and second transistors NTr1 and PTr1 (when viewed from the top side). The term "upper layer" refers to a layer higher than the active region of the transistor.

The electrostatic discharge protection element ESD1 is formed using an N-type MOS transistor GCDTr. The gate of the transistor GCDTr is connected with the source of the transistor GCDTr. The transistor GCDTr is provided in parallel with the transistor NTr1 between the drain and the source of the transistor NTr1. When a high voltage is applied to the drain of the transistor GCDTr, current can be released to the power supply line provided with the system ground power supply voltage VSS in order to prevent destruction of the transistor NTr1.

Figure 14A:
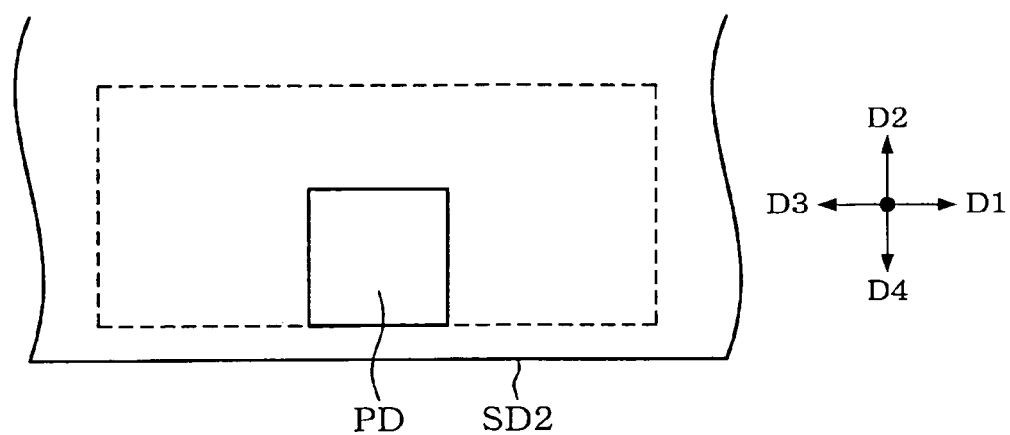
FIGS. 14A and 14B are views illustrative of a transistor formed under a pad.
Figure 14B:
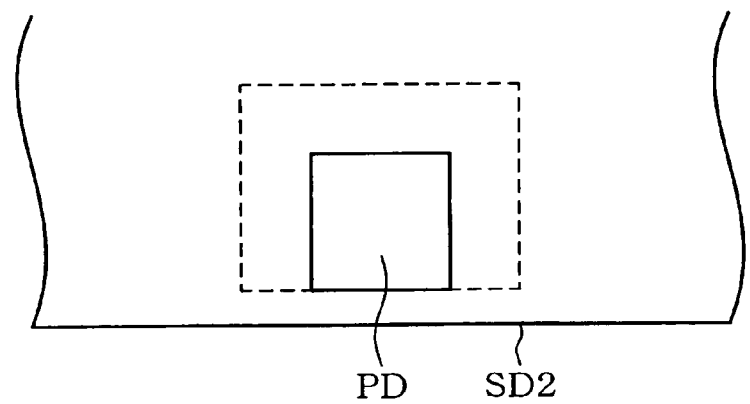

FIGS. 14A and 14B illustrate examples of the arrangement region of the transistor and the like under the pad. In this embodiment, at least one of the transistors NTr1 and PTr1 and the electrostatic discharge protection element ESD1 is disposed in the area enclosed by the broken line in the lower layer of the pad PD among the pads disposed along the second side SD2 of the integrated circuit device 10 so that at least one of the transistors NTr1 and PTr1 and the electrostatic discharge protection element ESD1 overlaps the pad PD when viewed from the top side. Note that only the electrostatic discharge protection element ESD1 may be disposed in the area enclosed by the broken line in FIG. 14B in the lower layer of the pad PD so that the electrostatic discharge protection element ESD1 overlaps the pad PD when viewed from the top side. As a result, the width of the input-side I/F region 14 of the integrated circuit device 10 in the direction D2 (direction D4) can be reduced, as shown in FIGS. 14A and 14B. Since several hundred data driver/scan driver output pads are arranged in the output-side I/F region 12, the wiring efficiency in the output-side I/F region 12 is not decreased. As a result, the width W of the integrated circuit device 10 in the direction D2 can be significantly reduced.

The withstand voltage of the electrostatic discharge protection element ESD1 when static electricity is applied to the electrostatic discharge protection element ESD1 depends on the structure of the transistor GCDTr.

Figure 15A:
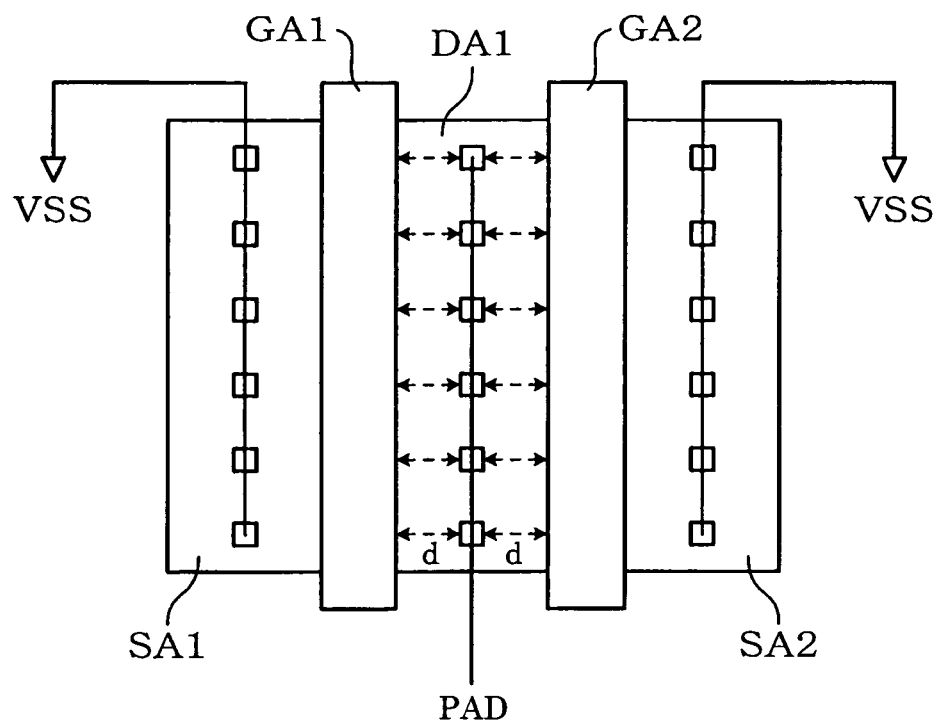
FIG. 15A is a view illustrative of an electrostatic discharge protection element.

FIG. 15A shows an example of a planar layout of the transistor GCDTr. In FIG. 15A, two source regions SA1 and SA2 and one drain region DA1 are provided. A gate electrode GA1 is disposed over a channel region between the source region SA1 and the drain region DA1 through a gate insulating film, and a gate electrode GA2 is disposed over a channel region between the source region SA2 and the drain region DA1 through a gate insulating film. The system ground power supply voltage VSS is supplied to the source regions SA1 and SA2 through contacts. The drain region DA1 is electrically connected with the pad PD through contacts. As described above, the planar structure of the transistor GCDTr is similar to that of the transistor NTr1.

When a high voltage is applied to the pad due to static electricity, a current path must be uniformly formed from the drain region DA1 to the source regions SA1 and SA2. The distance d between each contact in the drain region DA1 and the gate electrodes GA1 and GA2 is considered to be an important factor. The withstand voltage decreases when the distance d is small, whereby the element is easily destroyed. When the distance d is not uniform, current is concentrated on one point, whereby the element is also easily destroyed. Therefore, the transistor NTr1 can also function as the transistor GCDTr by adjusting the current drive capability while providing a sufficient distance between each contact of the drain region DA1 and the gate electrodes GA1 and GA2 for electrostatic discharge protection and uniformly disposing the contacts. In this case, since the electrostatic discharge protection element ESD1 can be omitted, as shown in FIG. 15B, the layout area can be further reduced.

Figure 15B:
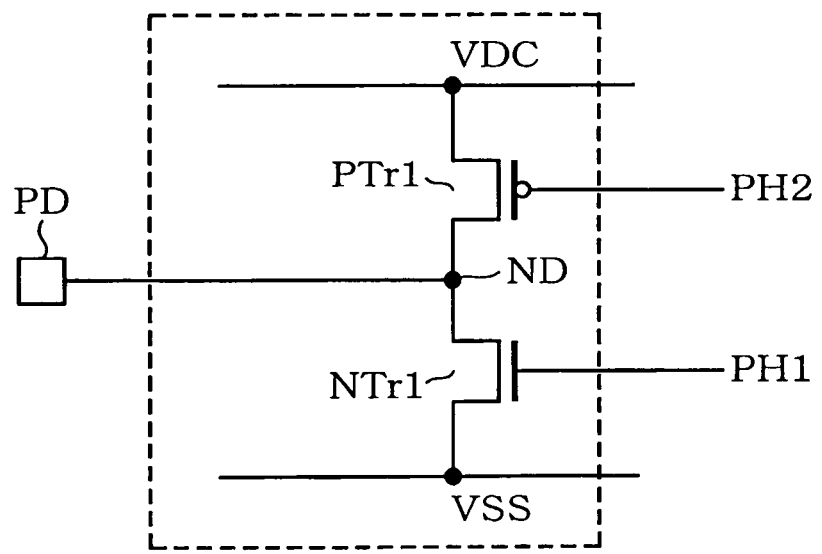
FIG. 15B is a configuration example when an electrostatic discharge protection element is omitted.

In FIGS. 13, 15A, and 15B, the push-pull connected transistors are made up of P-type and N-type transistors. Note that this embodiment is not limited thereto. For example, when the P-type transistors are connected with the pad PAD12, as shown in FIG. 12A, the transistors may also be disposed under the pad in the same manner as in FIGS. 13, 15A, and 15B. When performing a charge-pump operation for a negative-potential voltage lower than the system ground power supply voltage VSS, N-type transistors having a known triple-well structure may be used as the push-pull connected transistors. In this case, the transistors may also be disposed under the pad in the same manner as in FIGS. 13, 15A, and 15B.

Figure 16:
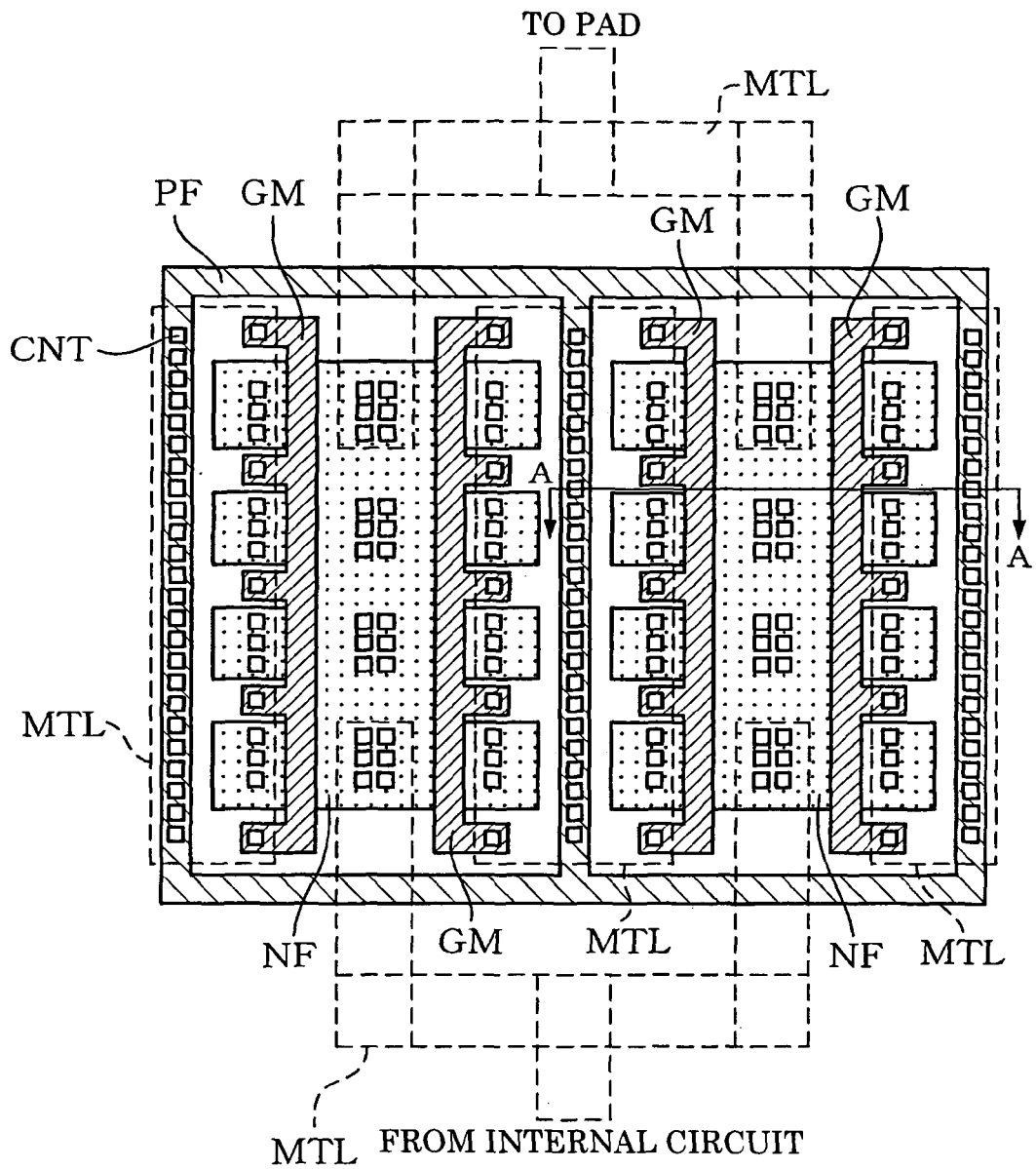
FIG. 16 is an example of a layout plan view of an electrostatic discharge protection element.
Figure 17:
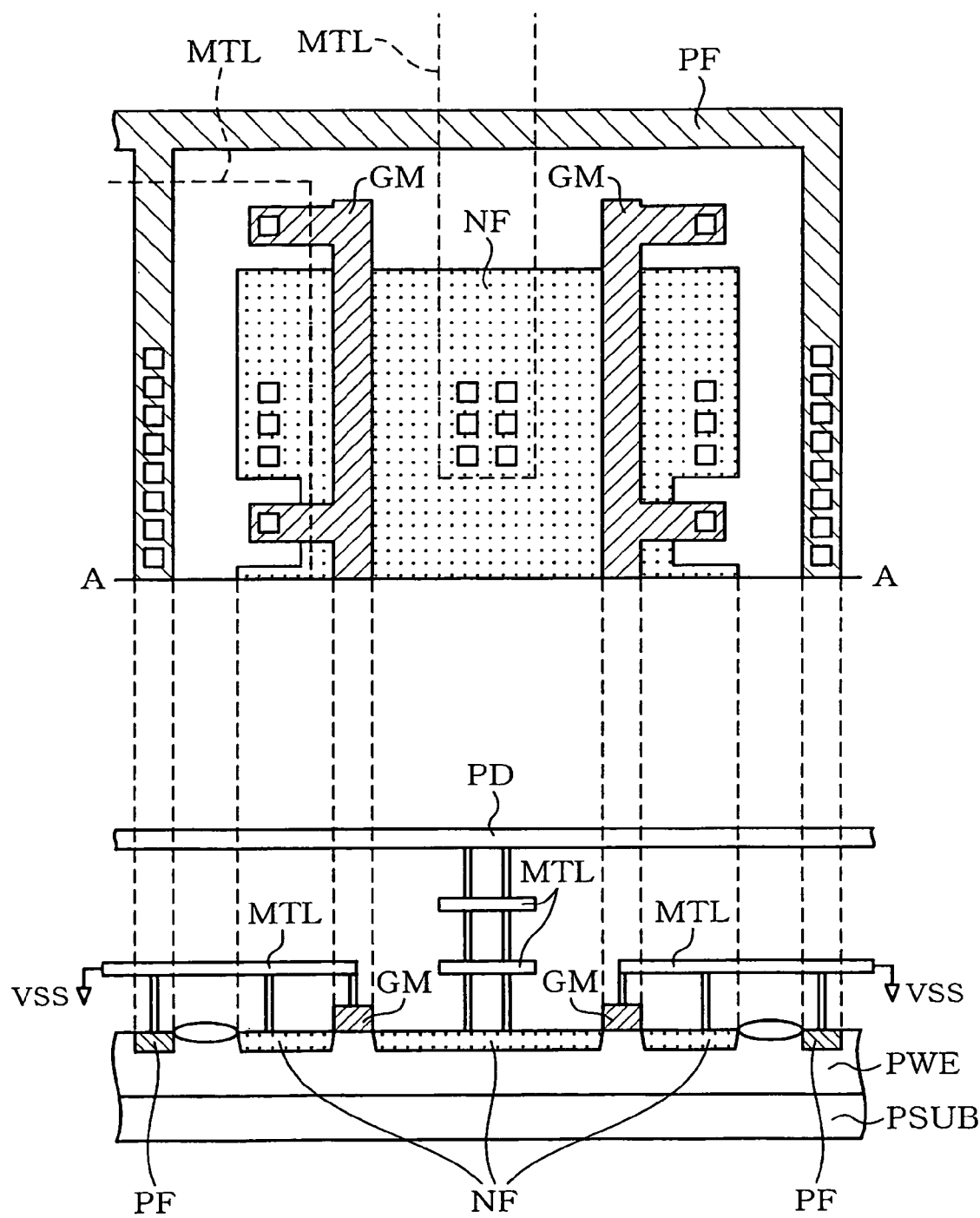
FIG. 17 is an example of a cross-sectional structure of FIG. 16.

FIG. 16 shows an example of a planar layout of the transistor GCDTr formed as the electrostatic discharge protection element ESD1. FIG. 17 schematically shows an example of the cross-sectional structure along the line A-A in FIG. 16.

In FIG. 16, a P-type well region PWE is formed in a P-type semiconductor substrate PSUB, as shown in FIG. 17. In the P-type well region PWE, N-type impurity diffusion regions NF are formed in each of two regions formed to be enclosed by a P-type impurity diffusion region PF. A gate electrode GM is provided between the N-type impurity diffusion regions NF, and the three N-type impurity diffusion regions NF serve as two source regions and one drain region. The low-potential-side power supply voltage VSS is supplied to the P-type impurity diffusion region PF, the N-type impurity diffusion region NF, and the gate electrode GM through contacts CNT. The P-type impurity diffusion region PF and the N-type impurity diffusion region NF are isolated, as shown in FIG. 17.

The N-type impurity diffusion region NF provided as the drain region of the transistor GCDTr is electrically connected with the pad PD shown in FIG. 13 through one or more through-holes and wiring layers MTL, for example.

In FIG. 17, the drain region of the transistor GCDTr is provided right under the pad PD, and the voltage applied to the pad PD is applied to the drain region along the shortest route through a plurality of paths having almost the same impedance. This enhances the electrostatic discharge protection capability.

FIG. 17 illustrates a structure when the transistor GCDTr is formed in the lower layer of the pad. Note that the transistors NTr1 and PTr1 may also be formed in the lower layer of the pad in the same manner as the transistor GCDTr.

Figure 18:
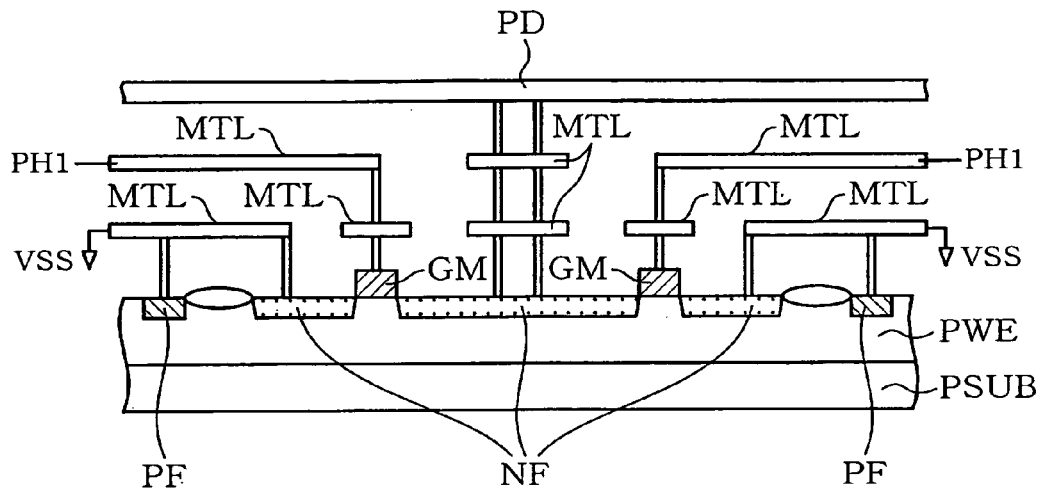
FIG. 18 is an example of a cross-sectional structure of a transistor formed under a pad.

FIG. 18 shows an example of a cross-sectional structure of the transistor NTr1 formed in the lower layer of the pad PD. The structure shown in FIG. 18 differs from the structure shown in FIG. 17 in that the boost clock signal PH1 is supplied to the gate electrode. The transistor PTr1 may be similarly formed in the lower layer of the pad PD.

Figure 19:
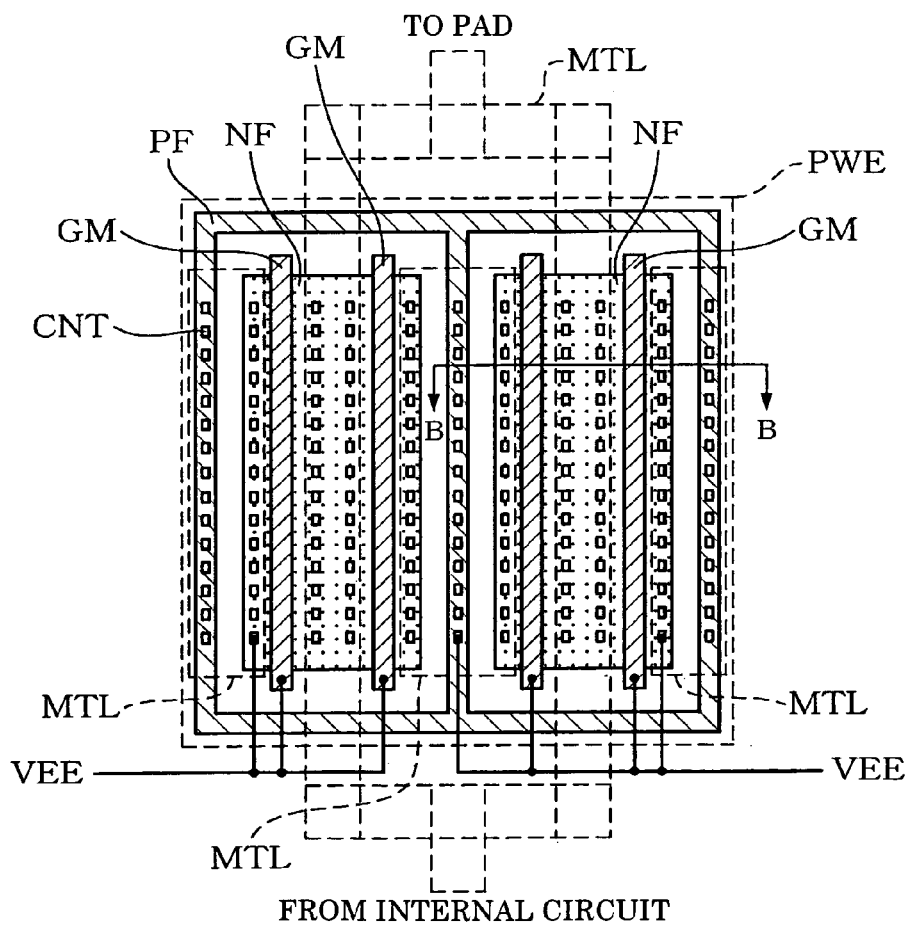
FIG. 19 is another example of a layout plan view of an electrostatic discharge protection element.
Figure 20:
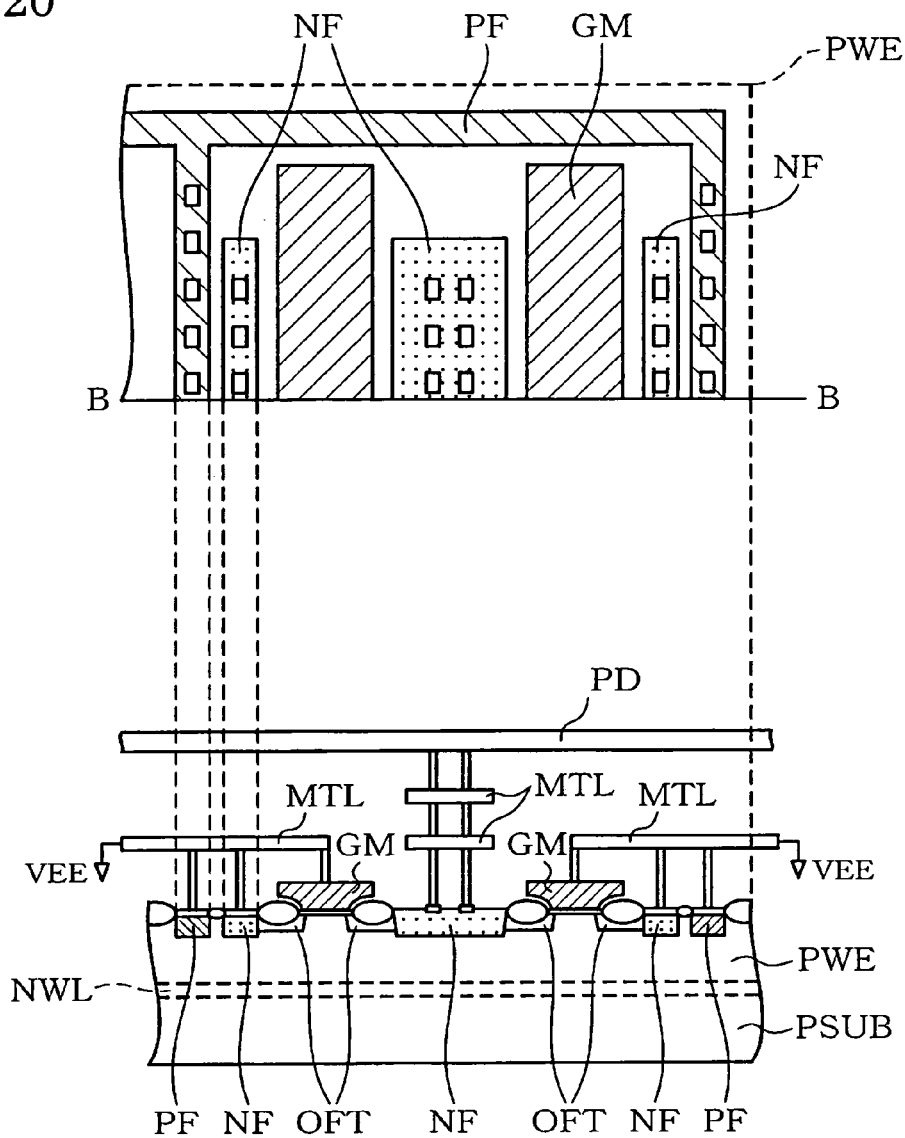
FIG. 20 is an example of a cross-sectional structure of FIG. 19.

FIG. 19 shows another example of a planar layout of the transistor GCDTr formed as the electrostatic discharge protection element ESD1. FIG. 20 schematically shows an example of the cross-sectional structure along the line B-B in FIG. 19. The electrostatic discharge protection element shown in FIGS. 19 and 20 has a triple-well structure, and is connected with a boost transistor to which the low-potential-side power supply voltage VEE is supplied, for example.

In FIG. 19, the P-type well region PWE is formed in an N-type well region NWL formed in the P-type semiconductor substrate PSUB. In the P-type well region PWE, electrically isolated three N-type impurity diffusion regions NF are formed in each of two regions formed to be enclosed by the P-type impurity diffusion region PF. The gate electrode GM is provided between the N-type impurity diffusion regions NF, and the three N-type impurity diffusion regions NF serve as two source regions and one drain region. The low-potential-side power supply voltage VEE is supplied to the P-type impurity diffusion region PF, the N-type impurity diffusion region NF, and the gate electrode GM through the contacts CNT.

As shown in FIG. 20, a LOCOS oxide film is formed in a channel region under the gate electrode GM, and an offset layer OFT is formed under the LOCOS oxide film. The N-type impurity diffusion region NF provided as the drain region of the transistor GCDTr is electrically connected with the pad PD shown in FIG. 13 through one or more through-holes and wiring layers MTL, for example.

In FIG. 20, the drain region of the transistor GCDTr is provided right under the pad PD, and the voltage applied to the pad PD is applied to the drain region along the shortest route through a plurality of paths having almost the same impedance. This enhances the electrostatic discharge protection capability.

FIG. 20 illustrates a structure when the transistor GCDTr is formed in the lower layer of the pad. Note that the transistors NTr1 and PTr1 may also be formed in the lower layer of the pad in the same manner as the transistor GCDTr.

Figure 21:
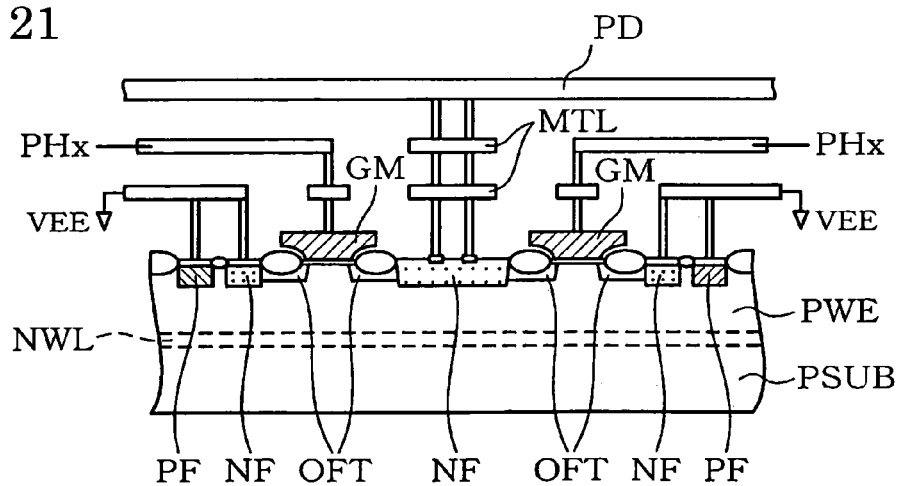
FIG. 21 is an example of a cross-sectional structure of a transistor formed under a pad.

FIG. 21 shows an example of a cross-sectional structure of the transistor NTr1 formed in the lower layer of the pad PD. The structure shown in FIG. 21 differs from the structure shown in FIG. 20 in that the boost clock signal PHx is supplied to the gate electrode. The transistor PTr1 may be similarly formed in the lower layer of the pad PD.

Figure 22A:
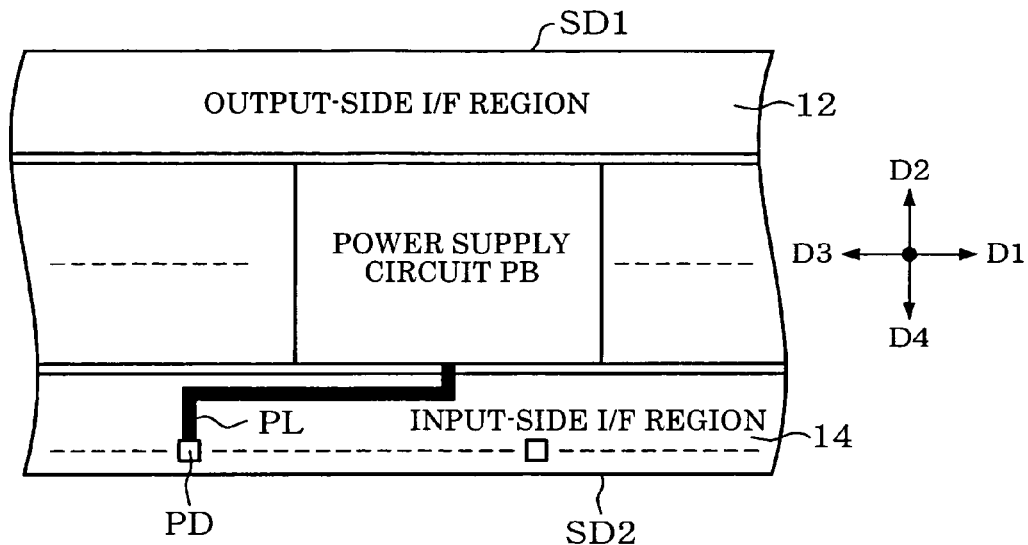
FIGS. 22A and 22B are views illustrative of one embodiment of the invention.
Figure 22B:
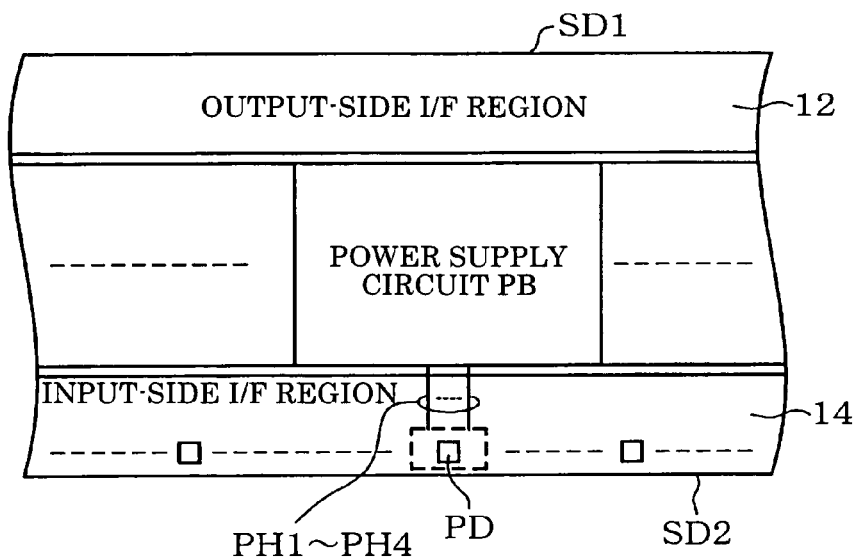

When increasing the voltage using the charge pump method, it is necessary to store electric charges in the flying capacitor FC. Therefore, it is necessary to decrease the on-resistance of the push-pull connected transistors and the resistance of the signal line connected with the drains of the push-pull connected transistors as much as possible. This is because the amount of electric charges stored in the flying capacitor FC decreases as the resistance increases, whereby the efficiency of the boost operation decreases. Therefore, it is necessary to sufficiently increase the size of the push-pull connected transistors and sufficiently increase the width and the thickness of the signal line connected with the drains of the push-pull connected transistors, for example. When electrically connecting the pad PD disposed in the input-side I/F region 14 with a signal line PL from the power supply circuit block PB, as shown in FIG. 22A, a number of signal lines PL are disposed in the input-side I/F region 12. Since the signal line PL has a large width and a large thickness, the wiring efficiency in the input-side I/F region 12 is decreased, whereby it becomes difficult to reduce the width of the integrated circuit device 10 in the direction D2.

In this embodiment, since only the boost clock signal generation section of the voltage booster circuit is provided in the power supply circuit block PB and the boost transistors are disposed in the input-side I/F region 14 in which the pads are disposed, only the signal lines for the boost clock signals PH1 to PH4 which gate-control the boost transistors can be provided in the input-side I/F region 14. Since only the gate control signals are transmitted through these signal lines, the width of the signal lines can be reduced without taking the resistance into consideration. Therefore, the wiring efficiency in the input-side I/F region 12 can be increased, whereby the width of the integrated circuit device 10 in the direction D2 can be further reduced.

Moreover, the width W of the integrated circuit device 10 in the direction D2 can be further reduced by forming some or all of the boost transistors under the output pad, whereby a narrow integrated circuit device 10 can be realized. The width W of the integrated circuit device 10 in the direction D2 can be further reduced by allowing the boost transistor to function as an electrostatic discharge protection element. Moreover, electrostatic discharge protection capability can also be increased.

4.2 Narrow Integrated Circuit Device

Figure 23A:
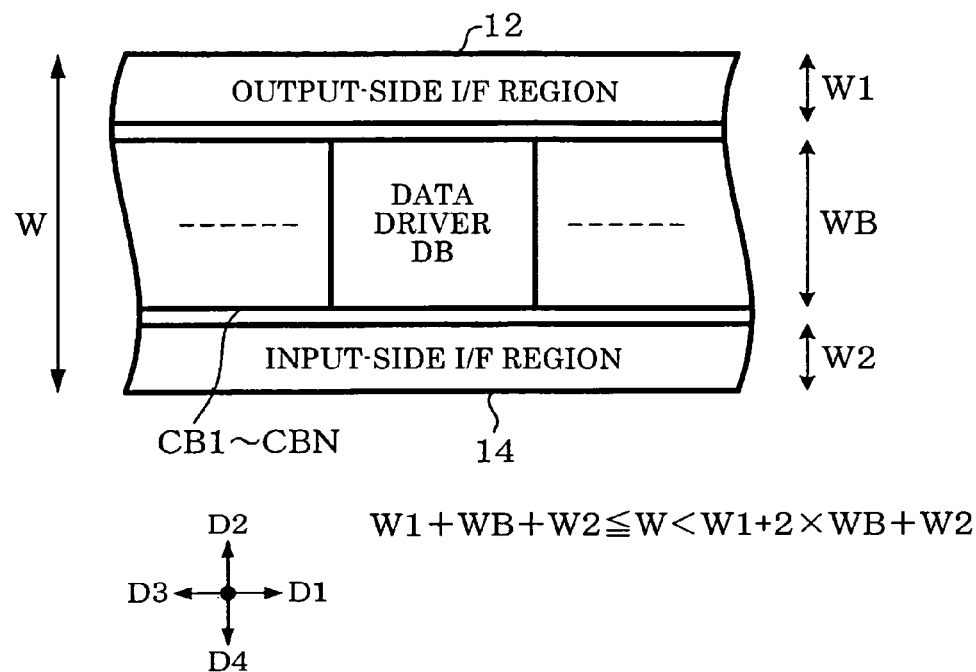
FIGS. 23A and 23B are views illustrative of the width of the integrated circuit device.

In this embodiment, the first to Nth circuit blocks CB1 to CBN include at least one data driver block DB for driving the data lines, as shown in FIG. 23A. The first to Nth circuit blocks CB1 to CBN also include a circuit block other than the data driver block DB (circuit block which realizes a function differing from that of the data driver block DB). The circuit block other than the data driver block DB is a logic circuit block (40 in FIG. 7), for example. Or, the circuit block other than the data driver block DB is a grayscale voltage generation circuit block (110 in FIG. 7) or a power supply circuit block (90 in FIG. 7). Or, the circuit block other than the data driver block DB is a memory block (20 in FIG. 7) when the integrated circuit device includes a memory, or a scan driver block (70 in FIG. 7) when the integrated circuit device is used for an amorphous TFT.

In FIG. 23A, W1, WB, and W2 respectively indicate the widths of the output-side I/F region 12 (first interface region), the first to Nth circuit blocks CB1 to CBN, and the input-side I/F region 14 (second interface region) in the direction D2.

In this embodiment, when the width of the integrated circuit device 10 in the direction D2 is W, "W1+WB+W2≦W<W1+2×WB+W2" is satisfied, as shown in FIG. 23A. In the comparative example shown in FIG. 6B, two or more circuit blocks are disposed along the direction D2. Therefore, the width W in the direction D2 is equal to or greater than "W1+2×WB+W2". In this embodiment, the output-side I/F region 12 is disposed on the side of the data driver block DB (or the memory block) in the direction D2 without another circuit block interposed therebetween. Specifically, the data driver block DB and the output-side I/F region 12 are adjacently disposed. The input-side I/F region 14 is disposed on the side of the data driver block DB (or the memory block) in the direction D4 without another circuit block interposed therebetween. Specifically, the data driver block DB and the input-side I/F region 14 are adjacently disposed. In this case, the other circuit block refers to the major macro circuit block (e.g. grayscale voltage generation circuit block, power supply circuit block, memory block, or logic circuit block) which makes up the display driver, for example.

In the comparative example shown in FIGS. 1A and 6B, since the width W is equal to or greater than "W1+2×WB+W2", the width W of the integrated circuit device 500 in the direction D2 (short side direction) is increased, whereby a narrow chip cannot be realized. Therefore, even if the chip is shrunk using a microfabrication technology, the length LD in the direction D1 (long side direction) is decreased, as shown in FIG. 2A, whereby the output pitch becomes narrow. As a result, it becomes difficult to mount the integrated circuit device 500.

In this embodiment, since another circuit block is not provided between the data driver block DB and the I/F regions 12 and 14, "W<W1+2×WB+W2" is satisfied. Therefore, the width W of the integrated circuit device in the direction D2 can be reduced, whereby a narrow chip as shown in FIG. 2B can be realized. In more detail, the width W in the direction D2 (short side direction) may be set at "W<2 mm". More specifically, the width W in the direction D2 may be set at "W<1.5 mm". It is preferable that "W>0.9 mm" taking inspection and mounting of the chip into consideration. The length LD in the long side direction may be set at "15 mm<LD<27 mm". A chip shape ratio SP (=LD/W) may be set at "SP>10". More specifically, the chip shape ratio SP may be set at "SP>12". This realizes a narrow integrated circuit device in which W=1.3 mm, LD=22 mm, and SP=16.9 or W=1.35 mm, LD=17 mm, and SP=12.6 corresponding to the specification such as the number of pins, for example. As a result, mounting can be facilitated as shown in FIG. 2B. Moreover, cost can be reduced due to a reduction in the chip area. Specifically, facilitation of mounting and a reduction in cost can be achieved in combination.

Figure 23B:
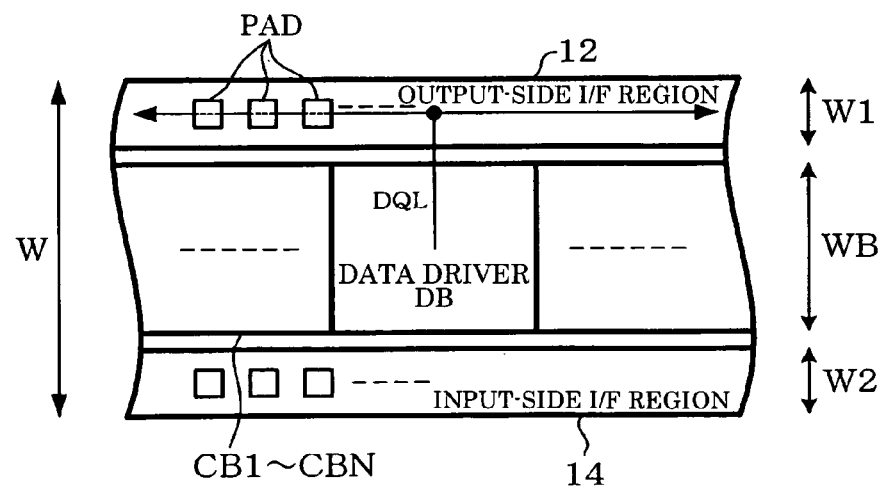

The arrangement method of the comparative example shown in FIG. 1A is reasonable taking the image data signal flow into consideration. In this embodiment, the output line DQL of the data signal from the data driver block DB is provided in the data driver block along the direction D2, as shown in FIG. 23B. On the other hand, the data signal output line DQL is provided in the output-side I/F region 12 (first interface region) along the direction D1 (D3). In more detail, the data signal output line DQL is provided in the output-side I/F region 12 along the direction D1 using a global line located in the lower layer of the pad and in the upper layer of a local line (transistor line) inside the output-side I/F region 12. This allows the data signal from the data driver block DB to be appropriately output to the display panel through the pad, even when using the arrangement method in which another circuit block is not provided between the data driver block DB and the I/F regions 12 and 14, as shown in FIG. 23A. Moreover, when the data signal output line DQL is provided as shown in FIG. 23B, the data signal output line DQL can be connected with the pad or the like by utilizing the output-side I/F region 12, whereby an increase in the width W of the integrated circuit device in the direction D2 can be prevented.

The widths W1, WB, and W2 shown in FIG. 23A indicate the widths of transistor formation regions (bulk regions or active regions) of the output-side I/F region 12, the circuit blocks CB1 to CBN, and the input-side I/F region 14, respectively. Specifically, output transistors, input transistors, input-output transistors, transistors of electrostatic discharge protection elements, and the like are formed in the I/F regions 12 and 14. The transistors of the circuits are formed in the circuit blocks CB1 to CBN. The widths W1, WB, and W2 are determined based on the well regions and the diffusion regions in which such transistors are formed. For example, in order to realize a narrower integrated circuit device, it is preferable to form bumps (active surface bumps) on the transistors of the circuit blocks CB1 to CBN. In more detail, a resin core bump, in which the core is formed of a resin and a metal layer is formed on the surface of the resin, or the like is formed on the transistor (active region). The bumps (external connection terminals) are connected with the pads disposed in the I/F regions 12 and 14 through metal lines. The widths W1, WB, and W2 according to this embodiment are not the widths of the bump formation regions, but the widths of the transistor formation regions formed under the bumps.

The widths of the circuit blocks CB1 to CBN in the direction D2 may be identical, for example. In this case, it suffices that the width of each circuit block be substantially identical, and the width of each circuit block may differ in the range of several to 20 microns (several tens of microns), for example. When a circuit block with a different width exists in the circuit blocks CB1 to CBN, the width WB may be the maximum width of the circuit blocks CB1 to CBN. In this case, the maximum width may be the width of the data driver block in the direction D2, for example. When the integrated circuit device includes a memory, the maximum width may be the width of the memory block in the direction D2. A space region with a width of about 20 to 30 microns may be provided between the circuit blocks CB1 to CBN and the I/F regions 12 and 14, for example.

It is preferable that the data driver blocks DB1 to DB4 be disposed between the power supply circuit block PB and the logic circuit LB. This makes it possible to arrange a number of pads of the data driver blocks DB1 to DB4 for driving the data lines in the output-side I/F region 12. In this case, it is preferable to arrange the input/output pads of the logic circuit LB in the input-side I/F region 14 along the second side SD2 on the side of the logic circuit LB in the direction D4. It is preferable to arrange the pads of the power supply circuit block PB in the input-side I/F region 14 along the second side SD2 on the side of the power supply circuit block PB in the direction D4. As a result, the wiring efficiency in the output-side I/F region 12 and the input-side I/F region 14 can be increased, whereby the width of the integrated circuit device 10 in the direction D2 can be reduced.

4.3 Width of Data Driver Block

Figure 24A:
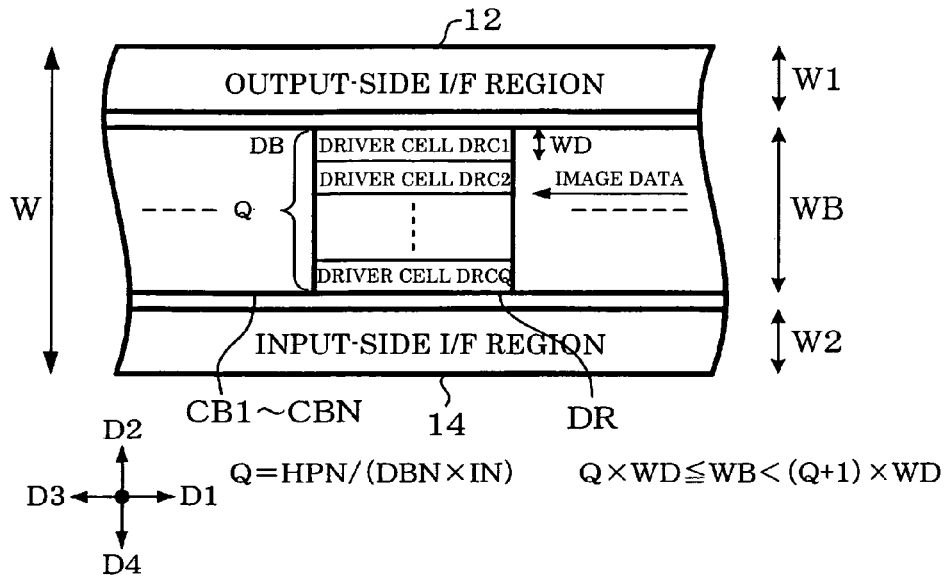
FIG. 24A to 24E are views illustrative of the width of a data driver block.

In this embodiment, a data driver DR included in the data driver block DB may include Q driver cells DRC1 to DRCQ disposed along the direction D2, as shown in FIG. 24A. Each of the driver cells DRC1 to DRCQ receives image data for one pixel. Each of the driver cells DRC1 to DRCQ performs D/A conversion of image data for one pixel, and outputs data signals corresponding to the image data for one pixel. Each of the driver cells DRC1 to DRCQ may include a data latch circuit, the DAC (DAC for one pixel) shown in FIG. 10A, and the output section SQ shown in FIGS. 10B and 10C.

When the width (pitch) of the driver cells DRC1 to DRCQ in the direction D2 is WD, the width WB (maximum width) of the circuit blocks CB1 to CBN in the direction D2 may be set at "Q×WD≦WB<(Q+1)×WD", as shown in FIG. 24A.

Specifically, the circuit blocks CB1 to CBN are disposed along the direction D1 in this embodiment. Therefore, a signal line for image data input from another circuit block (e.g. logic circuit block or memory block) of the circuit blocks CB1 to CBN to the data driver block DB is provided along the direction D1. The driver cells DRC1 to DRCQ are provided along the direction D2, as shown in FIG. 24A, so as to be connected with the image data signal lines provided along the direction D1. Each of the driver cells DRC1 to DRCQ is connected with the image data signal lines for one pixel.

In an integrated circuit device which does not include a memory, the width WB of the circuit blocks CB1 to CBN may be determined based on the width of the data driver DB in the direction D2, for example. Therefore, in order to reduce the width WB of the circuit blocks CB1 to CBN by reducing the width of the data driver block DB in the direction D2, it is preferable to set the width WB at about "Q×WD", which is the width in which the driver cells DRC1 to DRCQ are arranged. The width WB is "Q×WD≦WB<(Q+1)×WD" taking the margin for the wiring region or the like into consideration. This enables the width WB of the circuit blocks CB1 to CBN to be reduced by minimizing the width of the data driver block DB in the direction D2, whereby a narrow integrated circuit device as shown in FIG. 2B can be provided.

Suppose that the number of pixels of the display panel in the horizontal scan direction (the number of pixels in the horizontal scan direction driven by each integrated circuit device when a plurality of integrated circuit devices cooperate to drive the data lines of the display panel) is HPN, the number of data driver blocks (number of block divisions) is DBN, and the number of inputs of image data to the driver cell in one horizontal scan period is IN. The number IN is equal to the number of readings RN of image data in one horizontal scan period described later. In this case, the number Q of driver cells DRC1 to DRCQ disposed along the direction D2 may be expressed as "Q=HPN/(DBN×IN)". When "HPN=240", "DBN=4", and "IN=2", "Q=240/(4×2)=30".

Figure 24B:
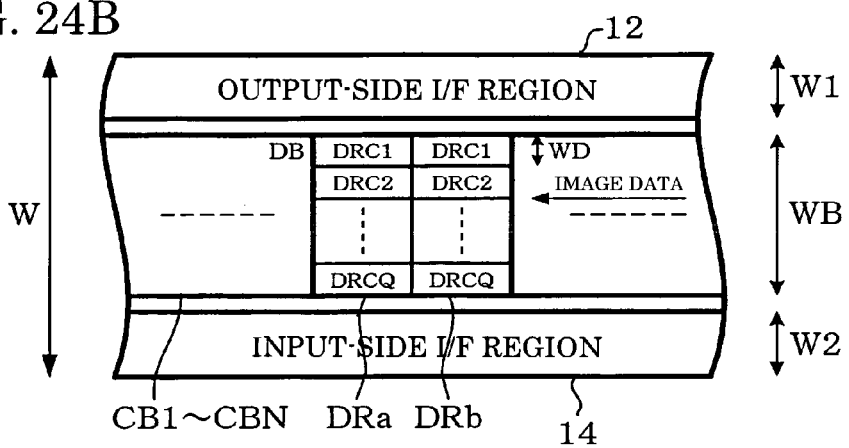

As shown in FIG. 24B, the data driver block DB may include a plurality of data drivers DRa and DRb (first to mth data drivers) disposed along the direction D1. A problem in which the width W of the integrated circuit device in the direction D2 is increased due to an increase in the size of the data driver can be prevented by disposing (stacking) the data drivers DRa and DRb along the direction D1. The data driver is configured in various ways depending on the type of display panel. In this case, data drivers having various configurations can be efficiently arranged by disposing the data drivers along the direction D1. FIG. 24B illustrates the case where the number of data drivers disposed in the direction D1 is two. Note that the number of data drivers disposed in the direction D1 may be three or more.

Figure 24C:
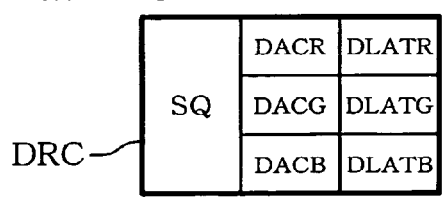

FIG. 24C shows an example of the configuration and the arrangement of the driver cell DRC. The driver cell DRC which receives image data for one pixel includes R (red), G (green), and B (blue) data latch circuits DLATR, DLATG, and DLATB. Each of the data latch circuits DLATR, DLATG, and DLATB latches image data when the latch signal has been set to active. The driver cell DRC includes the R, G, and B digital-analog converters DACR, DACG, and DACB described with reference to FIG. 10A. The driver cell DRC includes the output section SQ described with reference to FIGS. 10B and 10C.

Figure 24D:
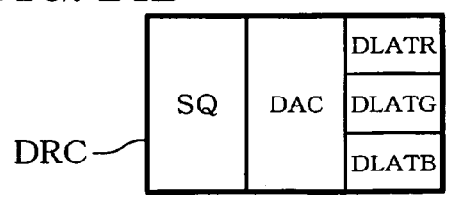
Figure 24E:
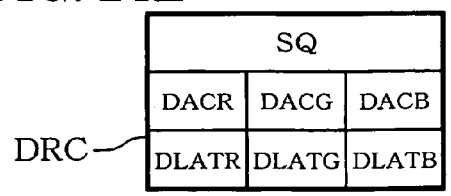

The configuration and the arrangement of the driver cell DRC are not limited to those shown in FIG. 24C. Various modifications and variations may be made. For example, when a low-temperature polysilicon TFT display driver or the like multiplexes and supplies R, G, and B data signals to the display panel as shown in FIG. 10C, R, G, and B image data (image data for one pixel) may be D/A converted by using one common DAC. In this case, it suffices that the driver cell DRC include one common DAC having the configuration shown in FIG. 10A, as shown in FIG. 24D. In FIGS. 24C and 24D, the R circuits (DLATR and DACR), the G circuits (DLATG and DACG), and the B circuits (DLATB and DACB) are disposed along the direction D2 (D4). Note that the R, G, and B circuits may be disposed along the direction D1 (D3), as shown in FIG. 24E.

4.4 Width of Memory Block

Figure 25A:
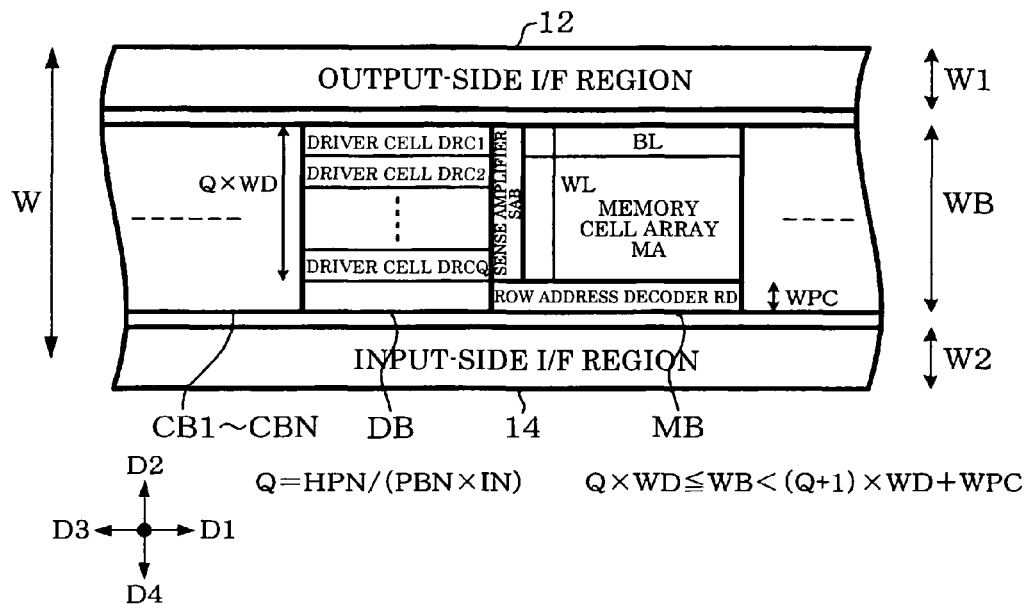
FIGS. 25A and 25B are views illustrative of the width of a memory block.

In an integrated circuit device including a memory, the data driver block DB and the memory block MB may be adjacently disposed in the direction D1, as shown in FIG. 25A.

Figure 26A:
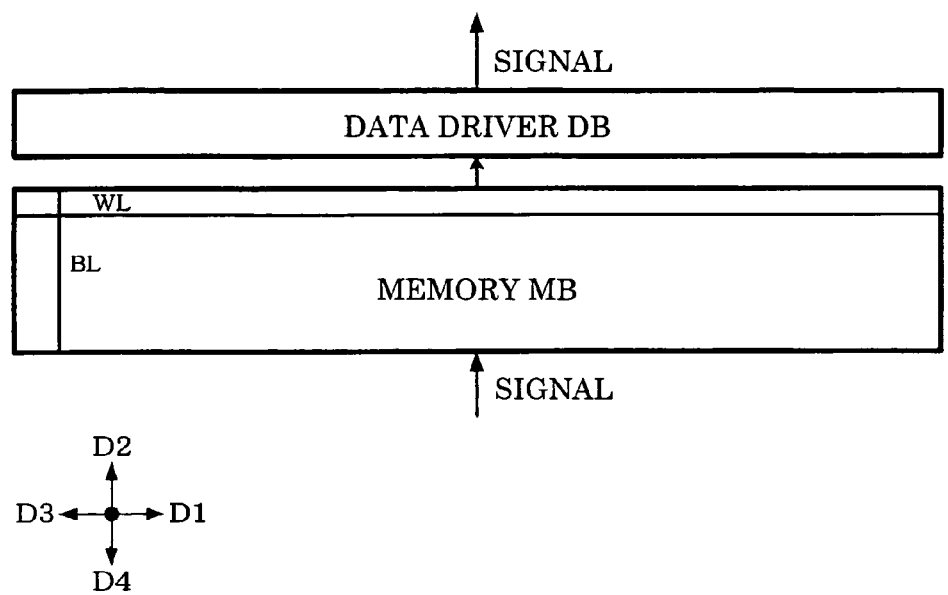
FIGS. 26A and 26B are illustrative of a comparative example.

In the comparative example shown in FIG. 1A, the memory block MB and the data driver block DB are disposed along the direction D2 (short side direction) corresponding to the signal flow, as shown in FIG. 26A. Therefore, since the width of the integrated circuit device in the direction D2 is increased, it is difficult to realize a narrow chip. Moreover, when the number of pixels of the display panel, the specification of the display driver, the configuration of the memory cell, or the like is changed so that the width in the direction D2 or the length in the direction D1 of the memory block MB or the data driver block DB is changed, the remaining circuit blocks are affected by such a change, whereby the design efficiency is decreased.

In FIG. 25A, since the data driver block DB and the memory block MB are adjacently disposed in the direction D1, the width W of the integrated circuit device in the direction D2 can be reduced. Moreover, since it is possible to deal with a change in the number of pixels of the display panel or the like by dividing the memory block, the design efficiency can be improved.

Figure 26B:
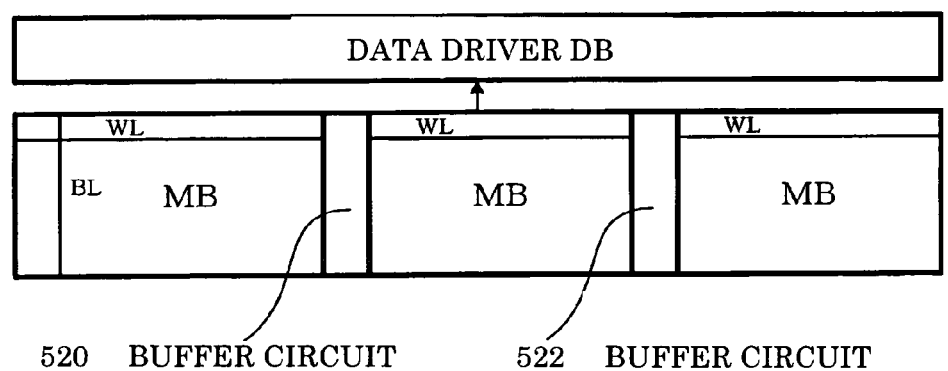

In the comparative example shown in FIG. 26A, since the wordline WL is disposed along the direction D1 (long side direction), a signal delay in the wordline WL is increased, whereby the image data read speed is decreased. In particular, since the wordline WL connected with the memory cells is formed using a polysilicon layer, the signal delay problem is serious. In this case, buffer circuits 520 and 522 as shown in FIG. 26B may be provided in order to reduce the signal delay. However, this method increases the circuit scale, whereby cost is increased.

In FIG. 25A, the wordline WL is disposed in the memory block MB along the direction D2 (short side direction), and the bitline BL is disposed along the direction D1 (long side direction). In this embodiment, the width W of the integrated circuit device in the direction D2 is small. Therefore, since the length of the wordline WL in the memory block MB can be reduced, a signal delay in the wordline WL can be significantly reduced in comparison with the comparative example shown in FIG. 26A. Moreover, since it is unnecessary to provide the buffer circuits 520 and 522 as shown in FIG. 26B, the circuit area can be reduced. In the comparative example shown in FIG. 26A, since the wordline WL, which is long in the direction D1 and has a large parasitic capacitance, is selected even when only the access region of the memory is accessed from the host, power consumption is increased. According to the method of dividing the memory into blocks in the direction D1 described in this embodiment, since only the wordline WL of the memory block corresponding to the access region is selected during host access, a reduction in power consumption can be realized.

In this embodiment, when the width of the peripheral circuit section included in the memory block in the direction D2 is WPC, "Q×WD≦WB<(Q+1)×WD+WPC" may be satisfied, as shown in FIG. 25A. The peripheral circuit section used herein refers to a peripheral circuit (e.g. row address decoder or control circuit) or a wiring region disposed on the side of the memory cell array MA in the direction D2 or D4 or disposed between divided memory cell arrays, for example.

In the arrangement shown in FIG. 25A, it is preferable that the width "Q×WD" of the driver cells DRC1 to DRCQ coincide with the width of the sense amplifier block SAB. If the width "Q×WD" of the driver cells DRC1 to DRCQ does not coincide with the width of the sense amplifier block SAB, it is necessary to change the wiring pitch of the signal lines when connecting the image data signal lines from the sense amplifier block SAB with the driver cells DRC1 to DRCQ, whereby an unnecessary wiring region is formed.

The memory block MB includes the peripheral circuit section such as the row address decoder RD in addition to the memory cell array MA. Therefore, the width of the memory block MB shown in FIG. 25A is greater than the width "Q×WD" of the driver cells DRC1 to DRCQ in an amount corresponding to the width WPC of the peripheral circuit section.

In an integrated circuit device including a memory, the width WB of the circuit blocks CB1 to CBN may be determined based on the width of the memory block MB in the direction D2. Therefore, in order to reduce the width WB of the circuit blocks CB1 to CBN by reducing the width of the memory block MB in the direction D2, it is preferable to set the width WB at "Q×WD≦WB(Q+1)×WD+WPC". This allows the width WB to be reduced by minimizing the width of the memory block MB in the direction D2, whereby a narrow integrated circuit device as shown in FIG. 2B can be provided.

Figure 25B:
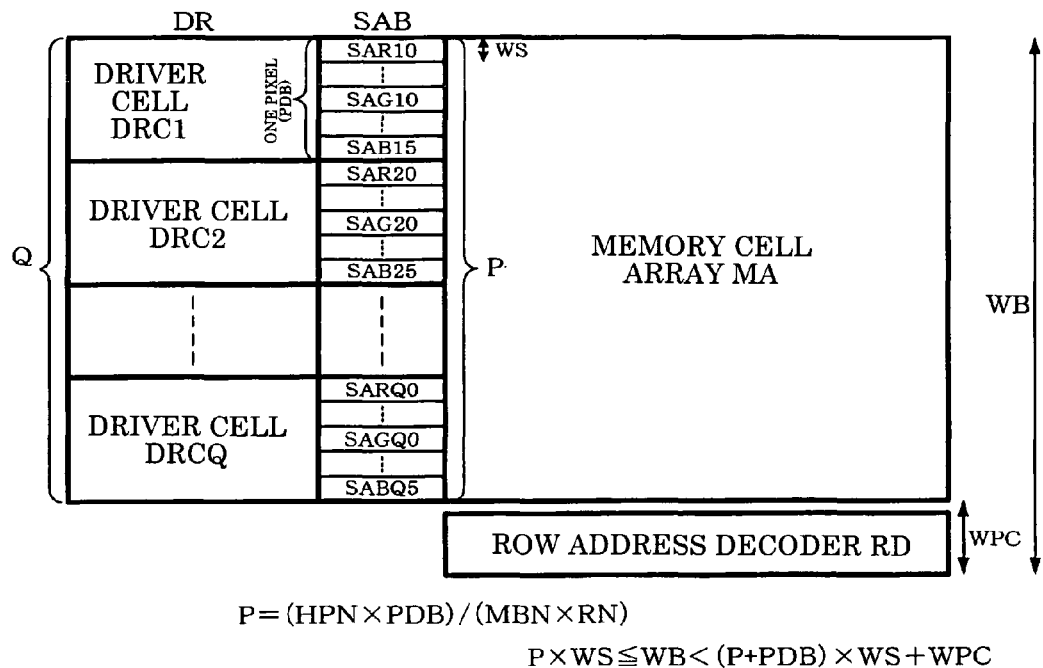

FIG. 25B shows the arrangement relationship between the driver cells DRC1 to DRCQ and the sense amplifier block SAB. As shown in FIG. 25B, sense amplifiers for one pixel (R sense amplifiers SAR10 to SAR15, G sense amplifiers SAG10 to SAG15, and B sense amplifiers SAB10 to SAB15) are connected with the driver cell DRC1 which receives image data for one pixel. This also applies to connection between the remaining driver cells DRC2 to DRCQ and the sense amplifiers.

As shown in FIG. 25B, when the width of the peripheral circuit section (row address decoder RD) included in the memory block in the direction D2 is WPC and the number of bits of image data for one pixel is PDB, the width WB (maximum width) of the circuit blocks CB1 to CBN in the direction D2 may be expressed as "P×WS≦WB<(P+PDB)×WS+WPC". The number of bits PDB is 18 bits (PDB=18) when each of R, G, and B is six bits.

Suppose that the number of pixels of the display panel in the horizontal scan direction is HPN, the number of bits of image data for one pixel is PDB, the number of memory blocks is MBN (=DBN), and the number of readings of image data from the memory block in one horizontal scan period is RN. In this case, the number P of sense amplifiers disposed in the sense amplifier block SAB along the direction D2 is expressed as "P=(HPN×PDB)/(MBN×RN)".

The number P is the number of effective sense amplifiers corresponding to the number of effective memory cells, and excludes the number of ineffective sense amplifiers such as sense amplifiers for dummy memory cells. The number P is the number of sense amplifiers each of which outputs 1-bit image data. For example, when selectively outputting 1-bit image data by using first and second sense amplifiers and a selector connected with outputs of the first and second sense amplifiers, the first and second sense amplifiers and the selector correspond to the sense amplifier which outputs 1-bit image data.

FIGS. 27A and 27B illustrate detailed layout examples of the memory block MB. FIG. 27A is an arrangement example of the memory block MB when using a horizontal type cell described later. An MPU/LCD row address decoder RD controls wordline selection during host access and wordline selection during output to the data driver block (LCD). The sense amplifier block SAB amplifies a signal of image data read from the memory cell array MA during output to the data driver block, and outputs the image data to the data driver block. An MPU write/read circuit WR writes image data into or reads image data from the access target memory cell (access region) of the memory cell array MA during the host access. The MPU write/read circuit WR may include a sense amplifier for reading image data. The MPU column address decoder CD controls selection of the bitline corresponding to the access target memory cell during the host access. A control circuit CC controls each circuit block in the memory block MB.

FIG. 27B is an arrangement example of the memory block MB when using a vertical type cell described later. In FIG. 27B, the memory cell array includes a first memory cell array MA1 and a second memory cell array MA2. The MPU/LCD row address decoder RD is provided between the memory cell arrays MA1 and MA2. The MPU/LCD row address decoder RD selects the wordline of one of the memory cell arrays MA1 and MA2 during host access. The MPU/LCD row address decoder RD selects the wordlines of both the memory cell arrays MA1 and MA2 when outputting image data to the data driver block. According to this configuration, since only the wordline of the access target memory cell array can be selected during the host access, a signal delay in the wordline and power consumption can be reduced in comparison with the case of always selecting the wordlines of both memory cell arrays.

The MPU/LCD row address decoder RD, the control circuit CC, and the wiring regions provided on the side of the memory cell array MA in the direction D2 (or D4) in FIG. 27A or provided between the memory cell arrays MA1 and MA2 in FIG. 27B make up the peripheral circuit section, and the width of the peripheral circuit section is WPC.

In this embodiment, the arrangement of the driver cell and the sense amplifier is described above on the assumption that the driver cell and the sense amplifier are disposed in pixel units. Note that a modification in which the driver cell and the sense amplifier are disposed in subpixel units is also possible. The subpixels are not limited to the three subpixel configuration for RGB, but may have a four subpixel configuration of RGB+1 (e.g. white).

4.5 Relationship Among WB, W1, and W2

In this embodiment, the width W1 of the output-side I/F region 12 in the direction D2 may be set at "0.13 mm≦W1≦0.4 mm", as shown in FIG. 28. The width WB of the circuit blocks CB1 to CBN may be set at "0.65 mm≦WB≦1.2 mm". The width W2 of the input-side I/F region 14 may be set at "0.1 mm≦W2≦0.2 mm".

In the output-side I/F region 12, a pad is disposed of which the number of stages in the direction D2 is one or more, for example. The width W1 of the output-side I/F region 12 is minimized by disposing output transistors, transistors for electrostatic discharge protection elements, and the like under the pads as shown in FIG. 6A. Therefore, the width W1 is "0.13 mm≦W1≦0.4 mm" taking the pad width (e.g. 0.1 mm) and the pad pitch into consideration.

In the input-side I/F region 14, a pad is disposed of which the number of stages in the direction D2 is one. The width W2 of the input-side I/F region 14 is minimized by disposing input transistors, transistors for electrostatic discharge protection elements, and the like under the pads as shown in FIG. 6A. Therefore, the width W2 is "0.1 mm≦W2≦0.2 mm" taking the pad width and the pad pitch into consideration. The number of stages of the pad in the direction D2 is set at one or more in the output-side I/F region 12 because the number (or size) of transistors which must be disposed under the pads is greater in the output-side I/F region 12 than in the input-side I/F region 14.

The width WB of the circuit blocks CB1 to CBN is set based on the width of the data driver block DB or the memory block MB in the direction D2 as described with reference to FIGS. 24A and 25A. In order to realize a narrow integrated circuit device, wiring for a logic signal from the logic circuit block, a grayscale voltage signal from the grayscale voltage generation circuit block, and a power supply must be formed on the circuit blocks CB1 to CBN using global lines. The total wiring width is about 0.8 to 0.9 mm, for example. Therefore, the width WB of the circuit blocks CB1 to CBN is "0.65 mm≦WB≦1.2 mm" taking the total wiring width into consideration.

Since "0.65 mm≦WB≦1.2 mm" is satisfied even if W1=0.4 mm and W2=0.2 mm, "WB>W1+W2" is satisfied. When the widths W1, WB, and W2 are minimum values, W1=0.13 mm, WB=0.65 mm, and W2=0.1 mm so that the width W of the integrated circuit device is about 0.88 mm. Therefore, "W=0.88 mm<2×WB=1.3 mm" is satisfied. When the widths W1, WB, and W2 are maximum values, W1=0.4 mm, WB=1.2 mm, and W2=0.2 mm so that the width W of the integrated circuit device is about 1.8 mm. Therefore, "W=1.8 mm<2×WB=2.4 mm" is satisfied. Specifically, "W<2×WB" is satisfied. If "W<2×WB" is satisfied, a narrow integrated circuit device as shown in FIG. 2B can be realized.

Moreover, this embodiment allows the width W1 of the integrated circuit device to be significantly reduced by disposing at least one of the boost transistors and the electrostatic discharge protection element in the lower layer of the pad. Therefore, "W<2×WB" can be easily satisfied. As a result, a narrower integrated circuit device can be provided.

5. Details of Memory Block and Data Driver Block 5.1 Block Division

Figure 29A:
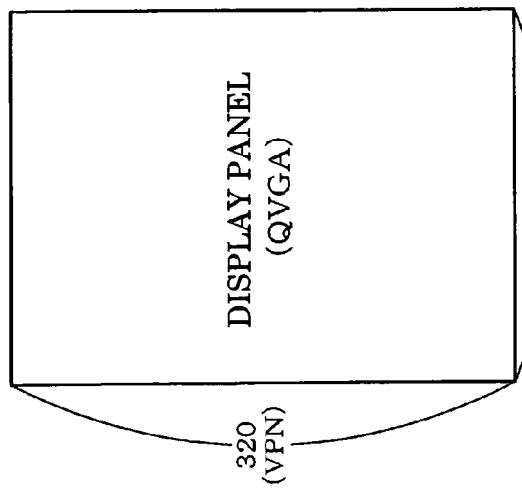
FIGS. 29A and 29B are views illustrative of arrangement of a memory block and a data driver block.

Consider the case where the display panel is a QVGA panel in which the number of pixels VPN in the vertical scan direction (data line direction) is 320 and the number of pixels HPN in the horizontal scan direction (scan line direction) is 240, as shown in FIG. 29A. Suppose that the number of bits PDB of image (display) data of one pixel is 18 bits (six bits each for R, G, and B). In this case, the number of bits of image data required to display one frame on the display panel is "VPN× HPN×PDB=320×240×18" bits. Therefore, the memory of the integrated circuit device stores at least "320×240×18" bits of image data. The data driver outputs data signals for 240 (=HPN) data lines (data signals corresponding to "240×18" bits of image data) to the display panel in units of horizontal scan periods (in units of periods in which one scan line is scanned).

Figure 29B:
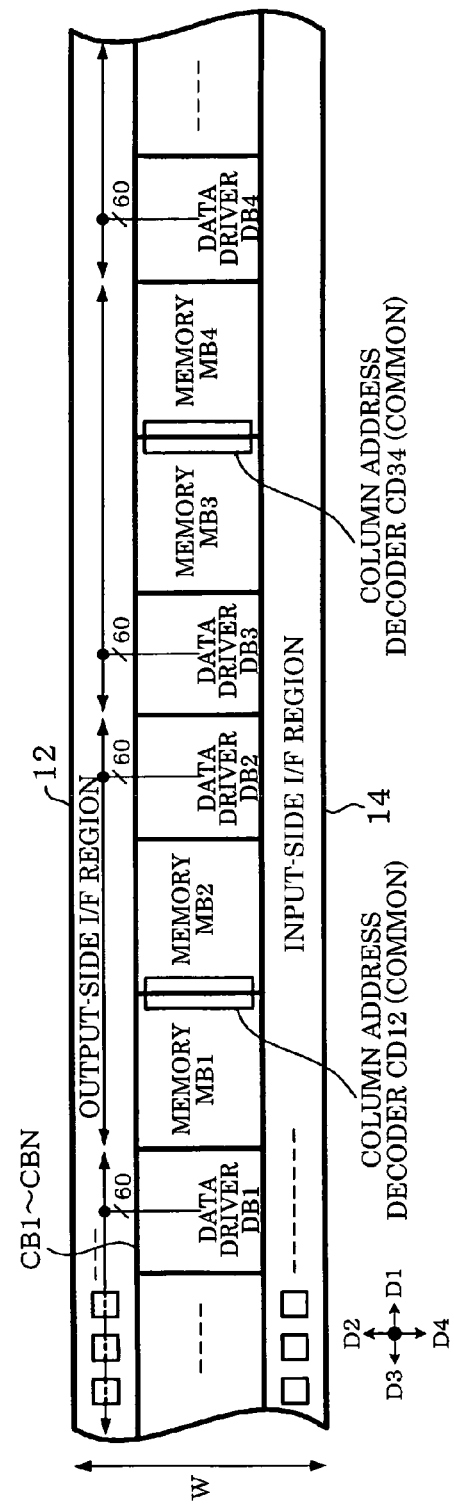

In FIG. 29B, the data driver is divided into four (=DBN) data driver blocks DB1 to DB4. The memory is also divided into four (=MBN=DBN) memory blocks MB1 to MB4. Therefore, each of the data driver blocks DB1 to DB4 outputs data signals for 60 (=HPN/DBN=240/4) data lines to the display panel in units of horizontal scan periods. Each of the memory blocks MB1 to MB4 stores "(VPN×HPN×PDB)/ MBN=(320×240×18)/4" bits of image data. In FIG. 29B, the column address decoder CD12 is used by the memory blocks MB1 and MB2, and the column address decoder CD34 is used by the memory blocks MB3 and MB4.

5.2 Plurality of Read Operations in One Horizontal Scan Period

In FIG. 29B, each of the data driver blocks DB1 to DB4 outputs data signals for 60 data lines in one horizontal scan period. Therefore, image data corresponding to data signals for 240 data lines must be read from the data driver blocks DB1 to DB4 corresponding to the data driver blocks DB1 to DB4 in units of horizontal scan periods.

However, when the number of bits of image data read in one horizontal scan period is increased, it is necessary to increase the number of memory cells (sense amplifiers) arranged in the direction D2. As a result, the width W of the integrated circuit device is increased in the direction D2 to hinder a reduction in the width of the chip. Moreover, the length of the wordline WL is increased, whereby a signal delay occurs in the wordline WL.

In this embodiment, image data stored in the memory blocks MB1 to MB4 is read from the memory blocks MB1 to MB4 into the data driver blocks DB1 to DB4 a plurality of times (RN times) in one horizontal scan period.

Figure 30:
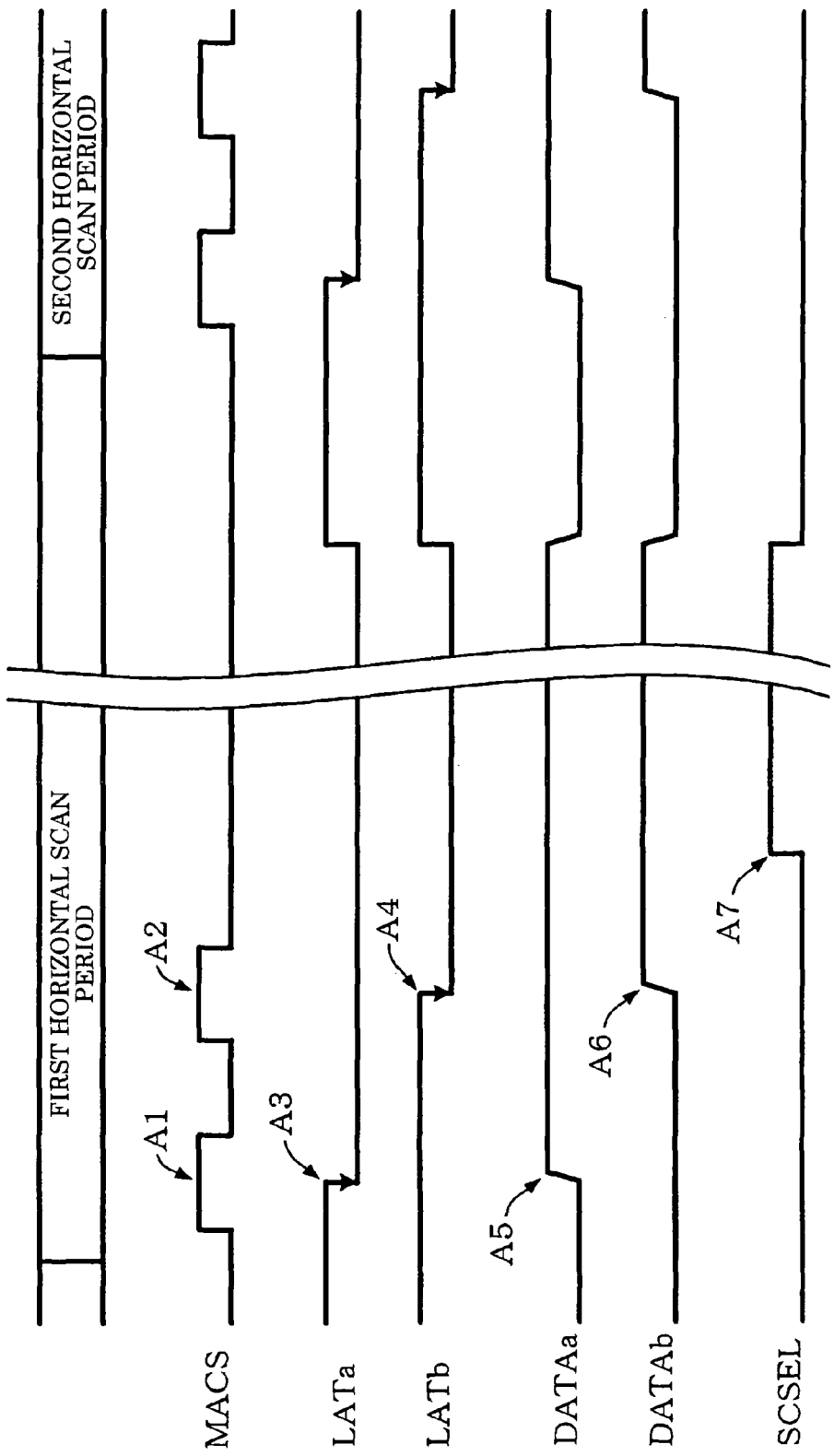
FIG. 30 is a view illustrative of a method of reading image data a plurality of times in one horizontal scan period.
Figure 31:
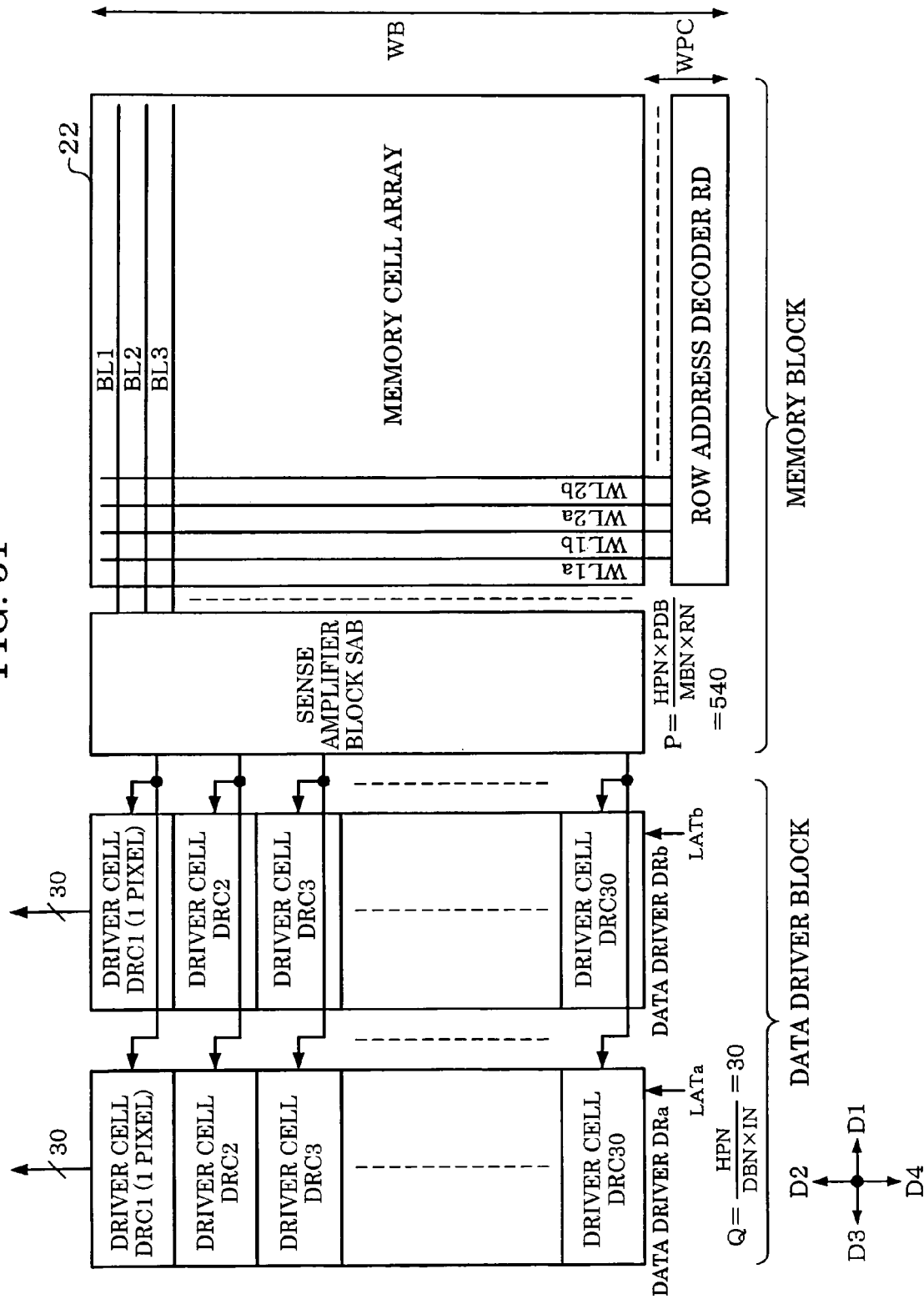
FIG. 31 is an arrangement example of a data driver and a driver cell.

In FIG. 30, a memory access signal MACS (word select signal) goes active (high level) twice (RN=2) in one horizontal scan period, as indicated by A1 and A2, for example. This allows image data to be read from each memory block into each data driver block twice (RN=2) in one horizontal scan period. Then, data latch circuits included in data drivers DRa and DRb shown in FIG. 31 provided in the data driver block latch the image data read from the memory block based on latch signals LATa and LATb indicated by A3 and A4. D/A conversion circuits included in the data drivers DRa and DRb perform D/A conversion of the latched image data, and output circuits included in the data drivers DRa and DRb output data signals DATAa and DATAb obtained by D/A conversion to the data signal output lines, as indicated by A5 and A6. A scan signal SCSEL input to the gate of the TFT of each pixel of the display panel then goes active, as indicated by A7, and the data signal is input to and held in each pixel of the display panel.

In FIG. 30, the image data is read twice in the first horizontal scan period, and the data signals DATAa and DATAb are output to the data signal output lines in the first horizontal scan period. Note that the image data may be read twice and latched in the first horizontal scan period, and the data signals DATAa and DATAb corresponding to the latched image data may be output to the data signal output lines in the subsequent second horizontal scan period. FIG. 30 illustrates the case where the number RN of read operations is two. Note that the number RN may be three or more (RN≧3).

According to the method shown in FIG. 30, the image data corresponding to the data signals for 30 data lines is read from each memory block, and each of the data drivers DRa and DRb outputs the data signals for 30 data lines, as shown in FIG. 31. Therefore, the data signals for 60 data lines are output from each data driver block. In FIG. 30, it suffices to read the image data corresponding to the data signals for 30 data lines from each memory block in one read operation, as described above. Therefore, the number of memory cells and sense amplifiers can be reduced in the direction D2 in FIG. 31 in comparison with a method in which the image data is read only once in one horizontal scan period. As a result, the width of the integrated circuit device can be reduced in the direction D2, whereby a narrow chip as shown in FIG. 2B can be realized. In a QVGA display, the length of one horizontal scan period is about 52 microseconds. On the other hand, the memory read time is about 40 nanoseconds, which is sufficiently shorter than 52 microseconds. Therefore, even if the number of read operations in one horizontal scan period is increased from one to two or more, the display characteristics are not affected to a large extent.

In addition to the QVGA (320×240) display panel shown in FIG. 29A, it is also possible to deal with a VGA (640×480) display panel by increasing the number of read operations in one horizontal scan period to four (RN=4), for example, whereby the degrees of freedom of the design can be increased.

A plurality of read operations in one horizontal scan period may be implemented using a first method in which the row address decoder (wordline select circuit) selects different wordlines in each memory block in one horizontal scan period, or a second method in which the row address decoder (wordline select circuit) selects a single wordline in each memory block a plurality of times in one horizontal scan period. Or, a plurality of read operations in one horizontal scan period may be implemented by combining the first method and the second method.

5.3 Arrangement of Data Driver and Driver Cell

FIG. 31 shows an arrangement example of data drivers and driver cells included in the data drivers. As shown in FIG. 31, the data driver block includes data drivers DRa and DRb arranged along the direction D1. Each of the data drivers DRa and DRb includes 30 (Q in a broad sense) driver cells DRC1 to DRC30.

When the wordline WL1a of the memory block has been selected and the first image data has been read from the memory block, as indicated by A1 in FIG. 30, the data driver DRa latches the read image data based on the latch signal LATa indicated by A3. The data driver DRa performs D/A conversion of the latched image data, and outputs the data signal DATAa corresponding to the first image data to the data signal output line, as indicated by A5.

When the wordline WL1b of the memory block has been selected and the second image data has been read from the memory block, as indicated by A2 in FIG. 30, the data driver DRb latches the read image data based on the latch signal LATb indicated by A4. The data driver DRb performs D/A conversion of the latched image data, and outputs the data signal DATAb corresponding to the second image data to the data signal output line, as indicated by A6.

Each of the data drivers DRa and DRb outputs data signals for 30 data lines corresponding to 30 pixels, whereby the data signals for 60 data lines corresponding to 60 pixels are output in total.

As described above, the number Q of driver cells DRC1 to DRC30 disposed along the direction D2 may be expressed as "Q=HPN/(DBN×IN)". In FIG. 31, since "HPN=240", "DBN=4", and "IN=2", "Q=240/(4×2)=30". As described above, the number P of sense amplifiers disposed in the sense amplifier block SAB along the direction D2 may be expressed as "P=(HPN×PDB)/(MBN×RN)". In FIG. 31, since "HPN=240", "PDB=18", "MBN=4", and "RN=2", "P=(240×18)/(4×2)=540".

5.4 Memory Cell

Figure 32A:
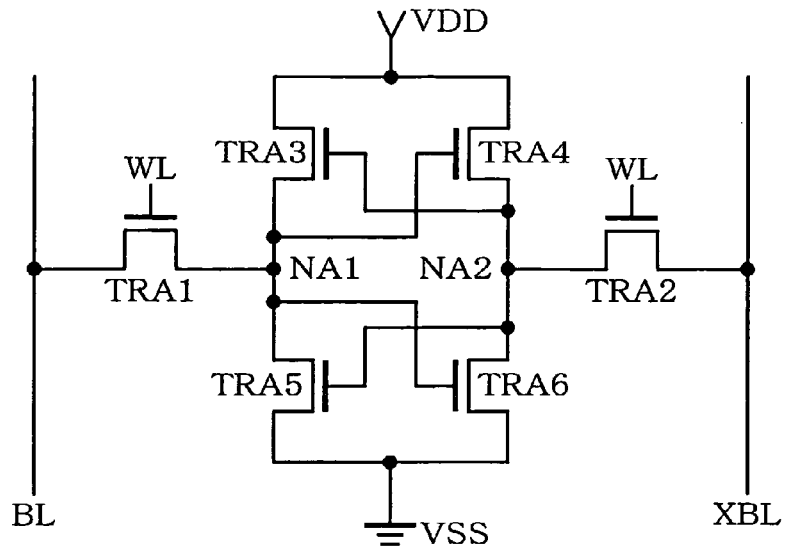
FIGS. 32A, 32B, and 32C are configuration examples of a memory cell.

FIG. 32A shows a configuration example of the memory cell (SRAM) included in the memory block. The memory cell includes transfer transistors TRA1 and TRA2, load transistors TRA3 and TRA4, and driver transistors TRA5 and TRA6. The transfer transistors TRA1 and TRA2 are turned ON when the wordline WL goes active, whereby the image data can be written into nodes NA1 and NA2 or the image data can be read from the nodes NA1 and NA2. The image data written into the memory cell is held at the nodes NA1 and NA2 using flip-flop circuits formed by the transistors TRA3 to TRA6. The configuration of the memory cell according to this embodiment is not limited to that shown in FIG. 32A. Various modifications and variations may be made, such as using resistor elements as the load transistors TRA3 and TRA4 or adding another transistor.

Figure 32B:
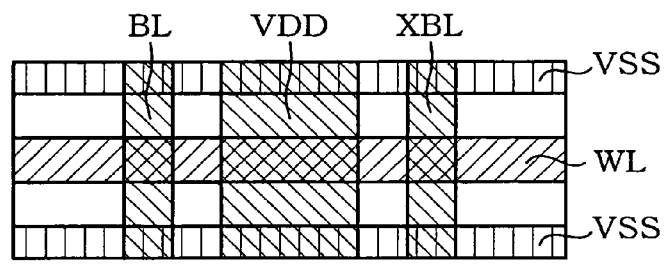
Figure 32C:
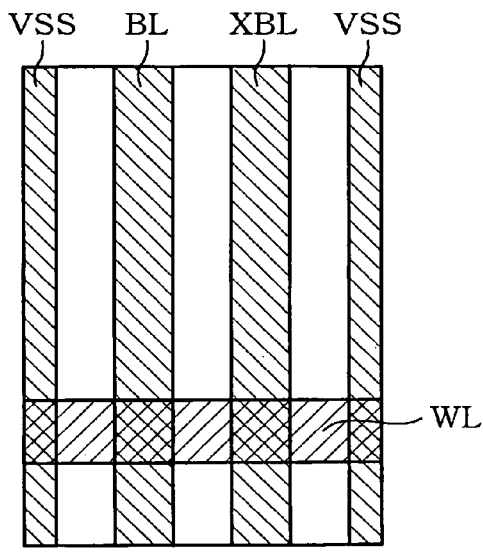

FIGS. 32B and 32C illustrate layout examples of the memory cell. FIG. 32B is a layout example of a horizontal type cell, and FIG. 32C is a layout example of a vertical type cell. As shown in FIG. 32B, the horizontal type cell is a cell in which the wordline WL is longer than the bitlines BL and XBL in each memory cell. As shown in FIG. 32C, the vertical type cell is a cell in which the bitlines BL and XBL are longer than the wordline WL in each memory cell. The wordline WL shown in FIG. 32C is a local wordline which is formed by a polysilicon layer and connected with the transfer transistors TRA1 and TRA2. Note that a wordline formed using a metal layer may be further provided to prevent a signal delay and to stabilize the potential of the wordline WL.

Figure 33:
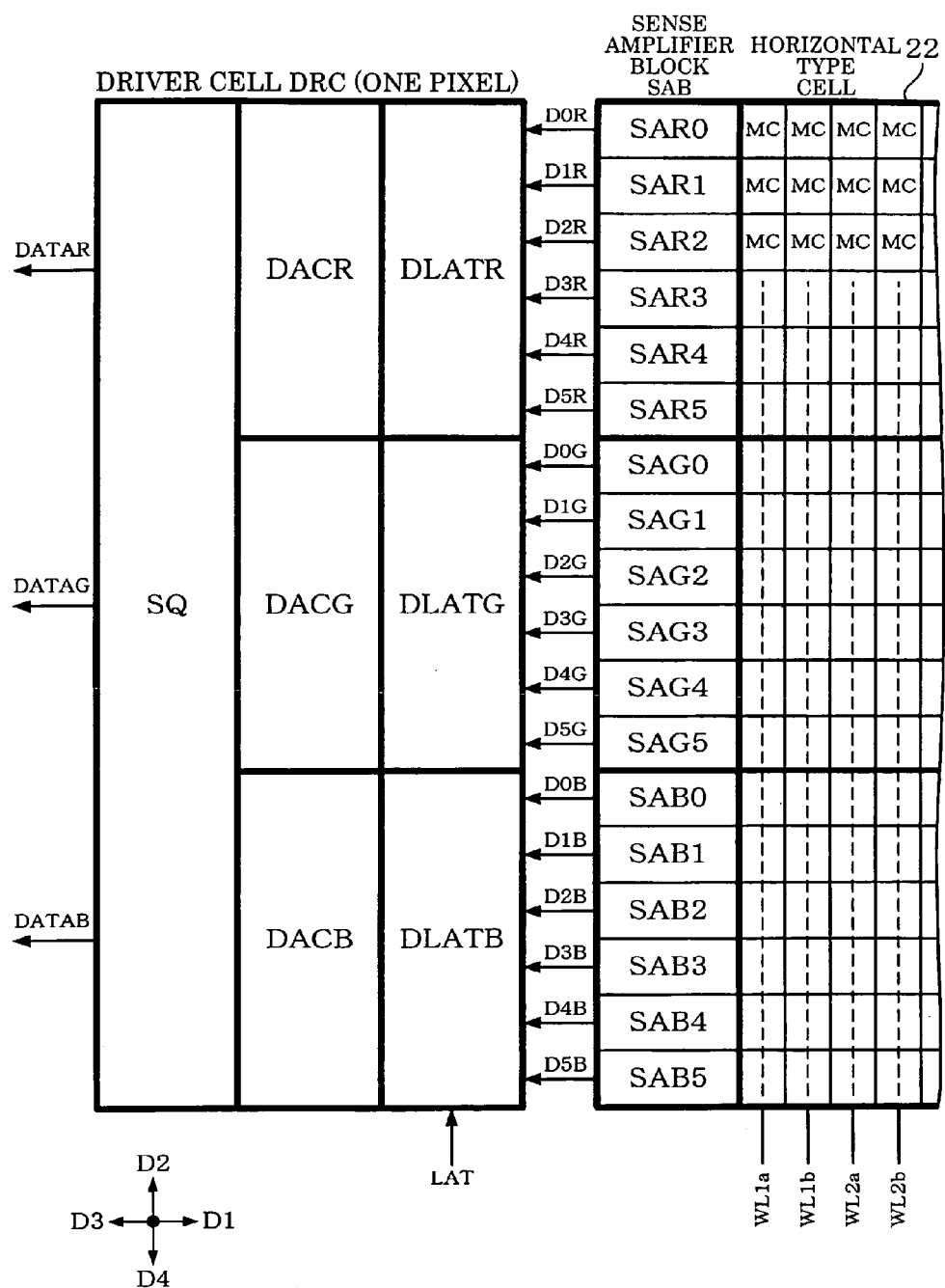
FIG. 33 is an arrangement example of the memory block and the driver cell when using a horizontal type cell.

FIG. 33 shows an arrangement example of the memory block and the driver cell when using the horizontal type cell shown in FIG. 32B as the memory cell. FIG. 33 minutely shows the section of the driver cell and the memory block corresponding to one pixel.

As shown in FIG. 33, the driver cell DRC which receives the image data for one pixel includes R, G, and B data latch circuits DLATR, DLATG, and DLATB. Each of the data latch circuits DLATR, DLATG, and DLATB latches the image data when the latch signal LAT (LATa, LATb) goes active. The driver cell DRC includes the R, G, and B digital-analog converters DACR, DACG, and DACB described with reference to FIG. 10A. The driver cell DRC also includes the output section SQ described with reference to FIGS. 10B and 10C.

The section of the sense amplifier block SAB corresponding to one pixel includes R sense amplifiers SAR0 to SAR5, G sense amplifiers SAG0 to SAG5, and B sense amplifiers SAB0 to SAB5. The bitlines BL and XBL of the memory cells MC arranged along the direction D1 on the side of the sense amplifier SAR0 in the direction D1 are connected with the sense amplifier SAR0. The bitlines BL and XBL of the memory cells MC arranged along the direction D1 on the side of the sense amplifier SAR1 in the direction D1 are connected with the sense amplifier SAR1. The above description also applies to the relationship between the remaining sense amplifiers and the memory cells.

When the wordline WL1a is selected, the image data is read from the memory cells MC of which the gate of the transfer transistor is connected with the wordline WL1a through the bitlines BL and XBL, and the sense amplifiers SAR0 to SAR5, SAG0 to SAG5, and SAB0 to SAB5 amplify the signals. The data latch circuit DLATR latches 6-bit R image data D0R to D5R from the sense amplifiers SAR0 to SAR5, the DACR performs D/A conversion of the latched image data, and the output section SQ outputs the data signal DATAR. The data latch circuit DLATG latches 6-bit G image data D0G to D5G from the sense amplifiers SAG0 to SAG5, the DACG performs D/A conversion of the latched image data, and the output section SQ outputs the data signal DATAG The data latch circuit DLATB latches 6-bit G image data D0B to D5B from the sense amplifiers SAB0 to SAB5, the DACB performs D/A conversion of the latched image data, and the output section SQ outputs the data signal DATAB.

In the configuration shown in FIG. 33, a plurality of image data read operations in one horizontal scan period shown in FIG. 30 may be realized as follows. Specifically, in the first horizontal scan period (first scan line select period), the first image data read operation is performed by selecting the wordline WL1a, and the first data signal DATAa is output as indicated by A5 in FIG. 30. Then, the second image data read operation is performed in the first horizontal scan period by selecting the wordline WL1b, and the second data signal DATAb is output, as indicated by A6 in FIG. 30. In the second horizontal scan period (second scan line select period), the first image data read operation is performed by selecting the wordline WL2a, and the first data signal DATAa is output. In the second horizontal scan period, the second image data read operation is performed by selecting the wordline WL2b, and the second data signal DATAb is output. As described above, when using the horizontal type cell, a plurality of read operations in one horizontal scan period can be realized by selecting different wordlines (WL1a and WL1b) in the memory block in one horizontal scan period.

Figure 34:
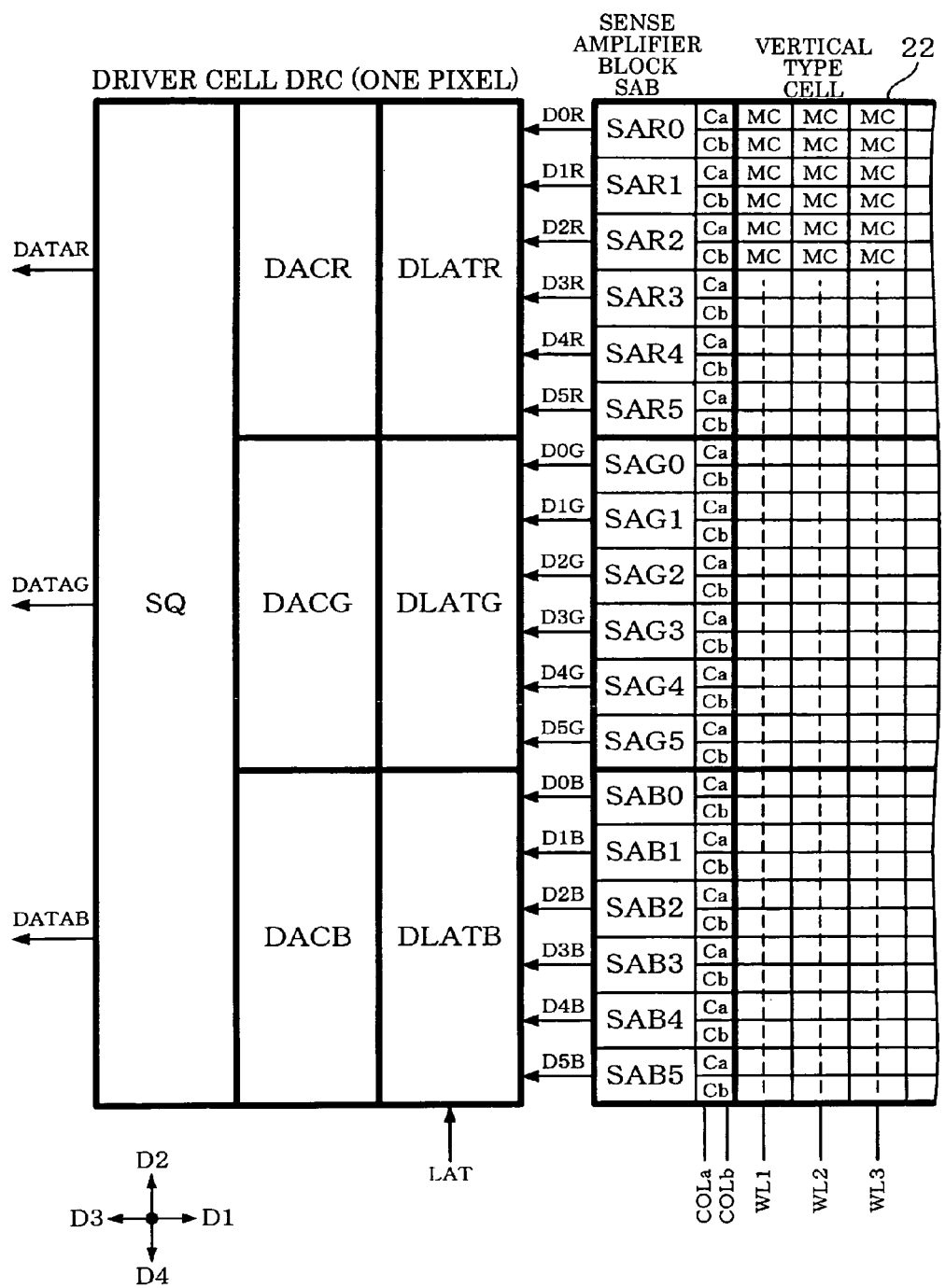
FIG. 34 is an arrangement example of the memory block and the driver cell when using a vertical type cell.

FIG. 34 shows an arrangement example of the memory block and the driver cell when using the vertical type cell shown in FIG. 32C as the memory cell. The width of the vertical type cell in the direction D2 can be reduced in comparison with the horizontal type cell. Therefore, the number of memory cells in the direction D2 can be doubled in comparison with the horizontal type cell. When using the vertical type cell, the column of the memory cells connected with each sense amplifier is switched by using column select signals COLa and COLb.

In FIG. 34, when the column select signal COLa goes active, the column Ca side memory cells MC provided on the side of the sense amplifiers SAR0 to SAR5 in the direction D1 are selected, and connected with the sense amplifiers SAR0 to SAR5, for example. The signals of the image data stored in the selected memory cells MC are amplified and output as the image data D0R to D5R. When the column select signal COLb goes active, the column Cb side memory cells MC provided on the side of the sense amplifiers SAR0 to SAR5 in the direction D1 are selected, and connected with the sense amplifiers SAR0 to SAR5. The signals of the image data stored in the selected memory cells MC are amplified and output as the image data D0R to D5R. The above description also applies to the read operation of the image data from the memory cells connected to the remaining sense amplifiers.

In the configuration shown in FIG. 34, a plurality of image data read operations in one horizontal scan period shown in FIG. 30 may be realized as follows. Specifically, in the first horizontal scan period, the first image data read operation is performed by selecting the wordline WL1 a and setting the column select signal COLa to active, and the first data signal DATAa is output, as indicated by A5 shown in FIG. 30. In the first horizontal scan period, the second image data read operation is performed by selecting the wordline WL1 and setting the column select signal COLb to active, and the second data signal DATAb is output, as indicated by A6 shown in FIG. 30. In the second horizontal scan period, the first image data read operation is performed by selecting the wordline WL2 and setting the column select signal COLa to active, and the first data signal DATAa is output. In the second horizontal scan period, the second image data read operation is performed by selecting the wordline WL2 and setting the column select signal COLb to active, and the second data signal DATAb is output. As described above, when using the vertical type cell, a plurality of read operations in one horizontal scan period can be realized by selecting a single wordline in the memory block a plurality of times in one horizontal scan period.

6. Electronic Instrument

Figure 35A:
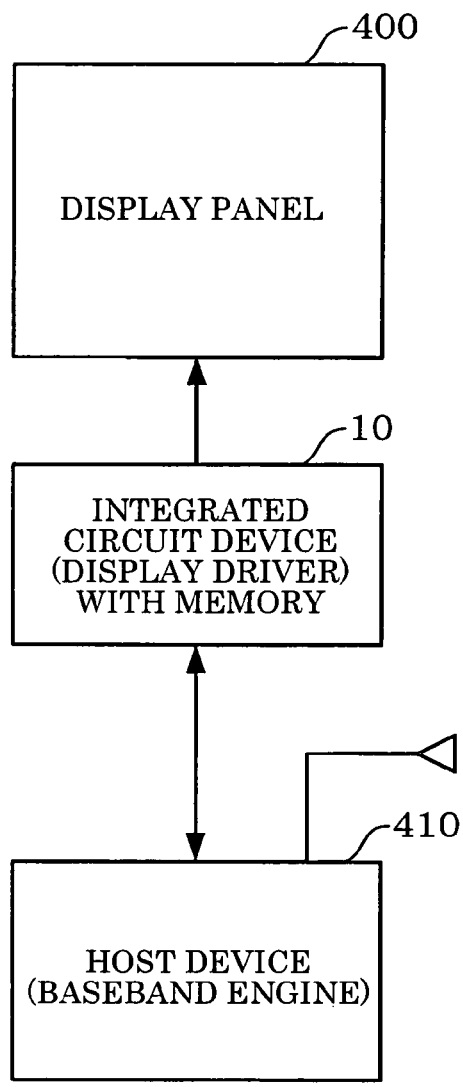
FIGS. 35A and 35B are configuration examples of an electronic instrument.
Figure 35B:
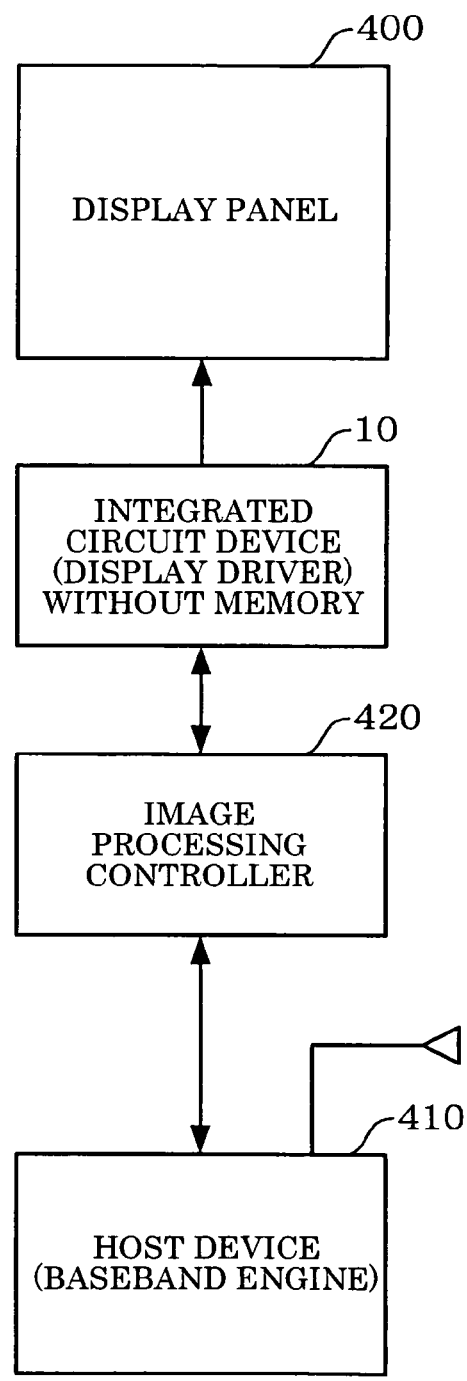

FIGS. 35A and 35B show examples of an electronic instrument (electro-optical device) including the integrated circuit device 10 according to the above embodiment. The electronic instrument may include constituent elements (e.g. camera, operation section, or power supply) other than the constituent elements shown in FIGS. 35A and 35B. The electronic instrument according to this embodiment is not limited to a portable telephone, and may be a digital camera, PDA, electronic notebook, electronic dictionary, projector, rear-projection television, portable information terminal, or the like.

In FIGS. 35A and 35B, a host device 410 is a microprocessor unit (MPU), a baseband engine (baseband processor), or the like. The host device 410 controls the integrated circuit device 10 as a display driver. The host device 410 may perform processing as an application engine and a baseband engine or processing as a graphic engine such as compression, decompression, or sizing. An image processing controller (display controller) 420 shown in FIG. 35B performs processing as a graphic engine such as compression, decompression, or sizing instead of the host device 410.

A display panel 400 includes a plurality of data lines (source lines), a plurality of scan lines (gate lines), and a plurality of pixels specified by the data lines and the scan lines. A display operation is realized by changing the optical properties of an electro-optical element (liquid crystal element in a narrow sense) in each pixel region. The display panel 400 may be formed by an active matrix type panel using switch elements such as a TFT or TFD. The display panel 400 may be a panel other than an active matrix type panel, or may be a panel other than a liquid crystal panel.

In FIG. 35A, the integrated circuit device 10 may include a memory. In this case, the integrated circuit device 10 writes image data from the host device 410 into the built-in memory, and reads the written image data from the built-in memory to drive the display panel. In FIG. 35B, the integrated circuit device 10 may not include a memory. In this case, image data from the host device 410 is written into a memory provided in the image processing controller 420. The integrated circuit device 10 drives the display panel 400 under control of the image processing controller 420.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention. Any term (e.g. output-side I/F region and input-side I/F region) cited with a different term having a broader meaning or the same meaning (e.g. first interface region and second interface region) at least once in the specification and the drawings can be replaced by the different term in any place in the specification and the drawings. The configuration, arrangement, and operation of the integrated circuit device and the electronic instrument are not limited to those described in the above embodiments. Various modifications and variations may be made.

What is claimed is:

1. An integrated circuit device comprising:
    first to Nth circuit blocks (N is an integer of two or more) that are disposed along a first direction when a direction from a first side that is a short side of the integrated circuit device toward a third side opposite to the first side is the first direction and a direction from a second side that is a long side of the integrated circuit device toward a fourth side opposite to the second side is a second direction;
    a first interface region that is provided along the fourth side on a side of the first to Nth circuit blocks in the second direction; and
    a second interface region that is provided along the second side on a side of the first to Nth circuit blocks in a fourth, direction opposite to the second direction,
    wherein the integrated circuit device includes:
        a first transistor and a second transistor that are push-pull connected to a first connection node between a first power supply line and a second power supply line, the first transistor and the second transistor being configured to output a voltage of one of the first power supply line and the second power supply line to the first connection node by a charge-pump operation using a flying capacitor coupled to a first pad via the first connection node, the flying capacitor being connected to the first pad and to a second pad;

a third transistor and a fourth transistor that are connected to a second connection node between the first power supply line and a third power supply line, the third transistor being configured to output a voltage to the second pad via the second connection node;

an electrostatic discharge protection element that is connected to the first connection node at a first end of the electrostatic discharge protection element, the electrostatic discharge protection element differing from the first transistor and the second transistor; and a boost clock generation section being configured to send a first boost clock to a gate of the first transistor, the boost clock generation section being configured to send a second boost clock to a gate of the second transistor, the boost clock generation section being configured to send a third boost clock to a gate of the third transistor, the boost clock generation section being configured to send a fourth boost clock to a gate of the fourth transistor, the first pad, the first transistor and the second transistor being disposed in the second interface region, the first pad being disposed in an upper layer of the electrostatic discharge protection element, the first transistor and the second transistor so that the first pad overlaps a part or an entirety of each of the electrostatic discharge protection element, the first transistor and the second transistor, at least one of the first transistor and the second transistor having a drain region, a contact being disposed between the drain region and the first pad, the drain region and the contact being disposed in a lower layer of the first pad so that the first pad overlaps as viewed in a plan view a part or an entirety of the drain region and the contact.

2. The integrated circuit device as defined in claim 1, the voltage of the second power supply line or a voltage generated based on the voltage of the second power supply line being supplied as a power supply voltage of at least one of the first to Nth circuit blocks.

3. The integrated circuit device as defined in claim 2, the first to Nth circuit blocks including at least one data driver block that drives a data line and a circuit block other than the at least one data driver block, and when widths of the first interface region, the first to Nth circuit blocks, and the second interface region in the second direction are respectively W1, WB, and W2, the integrated circuit device having a width W in the second direction of "W1+WB+W2<W<W1+2×WB+W2".

4. The integrated circuit device as defined in claim 3, the width W of the integrated circuit device in the second direction being "W<2×WB".

5. The integrated circuit device as defined in claim 3,
the first interface region being disposed on a side of the at least one data driver block in the second direction without another circuit block interposed therebetween, and the second interface region being disposed on a side of the data driver block in the fourth direction without another circuit block interposed therebetween.

6. The integrated circuit device as defined in claim 3,
a data driver included in the at least one data driver block including Q driver cells arranged along the second direction, each of the Q driver cells outputting a data signal corresponding to image data for one pixel, and when a width of each of the Q driver cells in the second direction is WD, the first to Nth circuit blocks having a width WB in the second direction of "Q×WD≦WB<(Q+1)×WD".

7. The integrated circuit device as defined in claim 6, when a number of pixels of a display panel in a horizontal scan direction is HPN, a number of data driver blocks is DBN, and a number of inputs of image data to each of the Q driver cells in one horizontal scan period is IN, a number of the Q driver cells arranged along the second direction being "Q=HPN/(DBN×IN)".

8. The integrated circuit device as defined in claim 3, the first to Nth circuit blocks including at least one memory block that stores image data.

9. The integrated circuit device as defined in claim 8,
a data driver included in the at least one data driver block including Q driver cells arranged along the second direction, each of the Q driver cells outputting a data signal corresponding to image data for one pixel, and when a width of a Q driver cell in the second direction is WD, and a width of a peripheral circuit section included in the at least one memory block in the second direction is WPC, "Q×WD≦WB<(Q+1)×WD+WPC" being satisfied.

10. The integrated circuit device as defined in claim 9, when a number of pixels of a display panel in a horizontal scan direction is HPN, a number of data driver blocks is DBN, and a number of inputs of image data to each of the Q driver cells in one horizontal scan period is IN, a number of the Q driver cells arranged along the second direction being "Q=HPN/(DBN×IN)".

11. The integrated circuit device as defined in claim 8, the at least one memory block and the at least one data driver block being adjacently disposed along the first direction.

12. The integrated circuit device as defined in claim 8 image data stored in the memory block being read from the at least one memory block into the at least one data driver block a plurality of times in one horizontal scan period.

13. An electronic instrument comprising:
the integrated circuit device as defined in claim 1; and
a display panel driven by the integrated circuit device.

14. The integrated circuit device as defined in claim 1, the contact electrically connecting the drain region of the at least one of the first transistor and the second transistor directly to the first pad.

15. The integrated circuit device as defined in claim 1, the boost clock signal generation section being disposed between the first interface region and the second interface region.

* * * * *

UNITED STATES PATENT AND TRADEMARK OFFICE
CERTIFICATE OF CORRECTION

PATENT NO. : 8,310,478 B2  
APPLICATION NO. : 11/477741  
DATED : November 13, 2012  
INVENTOR(S) : Kumagai et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 702 days.

Signed and Sealed this
Fourth Day of August, 2015

Michelle K. Lee
*Director of the United States Patent and Trademark Office*